(12) United States Patent
Snider et al.

(10) Patent No.: US 8,375,575 B2
(45) Date of Patent: *Feb. 19, 2013

(54) METHOD OF FABRICATING A LIGHTWEIGHT AUDIO SYSTEM HOUSING ASSEMBLY

(75) Inventors: Chris R. Snider, Noblesville, IN (US); Mark A. Jackson, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 242 days.

This patent is subject to a terminal disclaimer.

(21) Appl. No.: 12/708,911

(22) Filed: Feb. 19, 2010

(65) Prior Publication Data

US 2010/0188834 A1    Jul. 29, 2010

Related U.S. Application Data

(63) Continuation-in-part of application No. 11/893,357, filed on Aug. 15, 2007, now Pat. No. 7,733,659.

(60) Provisional application No. 60/838,698, filed on Aug. 18, 2006, provisional application No. 60/931,467, filed on May 23, 2007.

(51) Int. Cl.
*H05K 3/36* (2006.01)
(52) U.S. Cl. ............... 29/830; 29/831; 29/832; 361/753
(58) Field of Classification Search ................. 29/592.1, 29/830–832, 848, 850, 851; 174/54, 357, 174/363, 392, 394, 521; 264/271.1, 299; 361/724, 730, 752, 753, 818

See application file for complete search history.

(56) References Cited

U.S. PATENT DOCUMENTS

| 4,863,789 | A | * | 9/1989 | Arai | 174/394 |
|---|---|---|---|---|---|
| 5,175,926 | A | * | 1/1993 | Chapman | 29/830 |
| 6,398,899 | B1 | * | 6/2002 | Umezawa et al. | 264/271.1 |

* cited by examiner

*Primary Examiner* — Donghai D. Nguyen
(74) *Attorney, Agent, or Firm* — J. Gordon Lewis

(57) ABSTRACT

A lightweight radio/CD player for vehicular application is virtually "fastenerless" and includes a fold-up case formed of polymer based material that is molded to provide details to accept audio devices such as playback mechanisms (if desired) and radio receivers, as well as the circuit boards required for electrical control and display. The case is of composite structure, including an insert molded electrically conductive wire mesh screen that has been pre-formed to contour with the molding operation. The wire mesh provides EMC, RFI, BCI and ESD shielding and grounding of the circuit boards via exposed wire mesh pads and adjacent ground clips. Side wall closure members are extruded of aluminum defining self-engaging attachment features for affixing to the case, providing electrical self-grounding with the wire screen and thermal grounding with internal power devices. The major components and subassemblies are self-fixturing during the final assembly process, eliminating the need for dedicated tools, fixtures and assembly equipment. The major components and subassemblies self-interconnect by integral guide and connection features effecting "slide lock" and "snap lock" self-interconnection.

15 Claims, 38 Drawing Sheets

FIG. 5

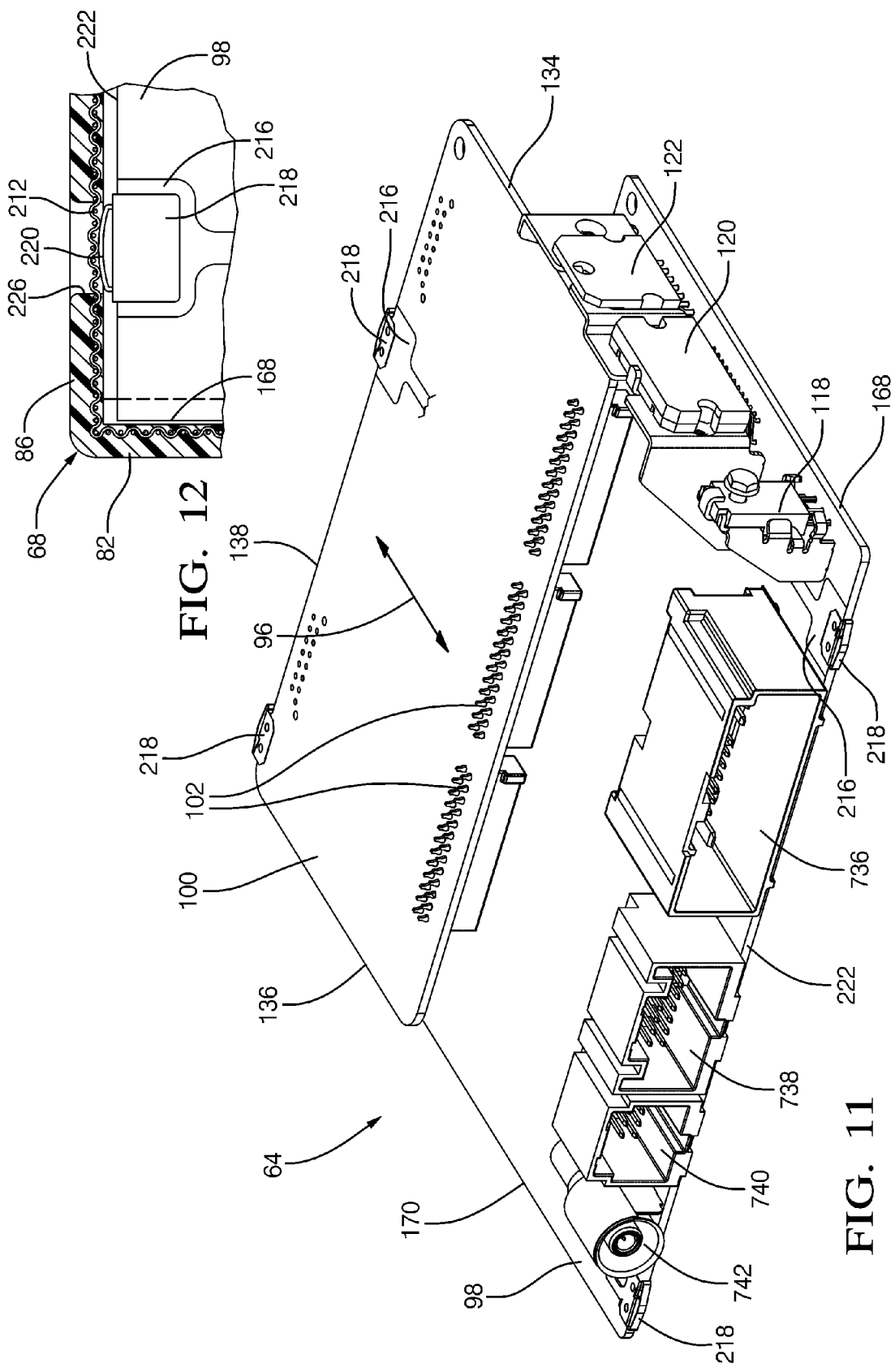

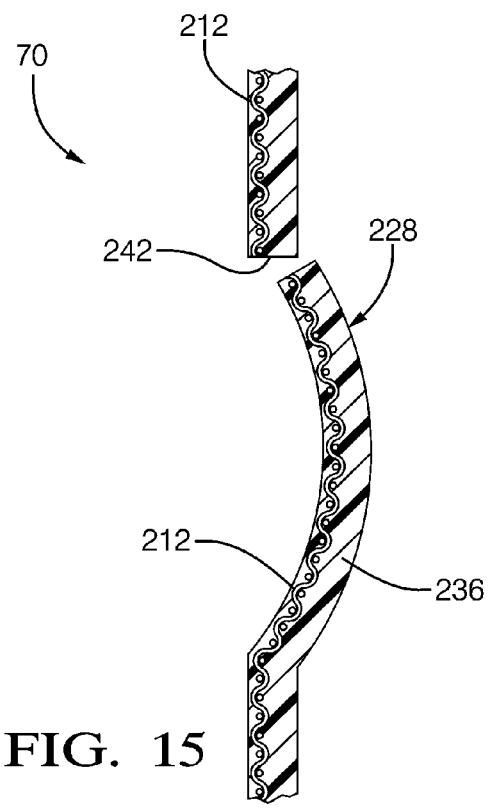
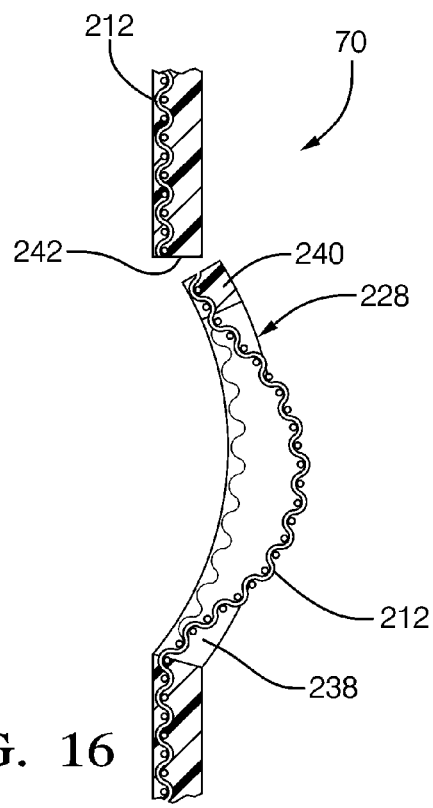
FIG. 15    FIG. 16
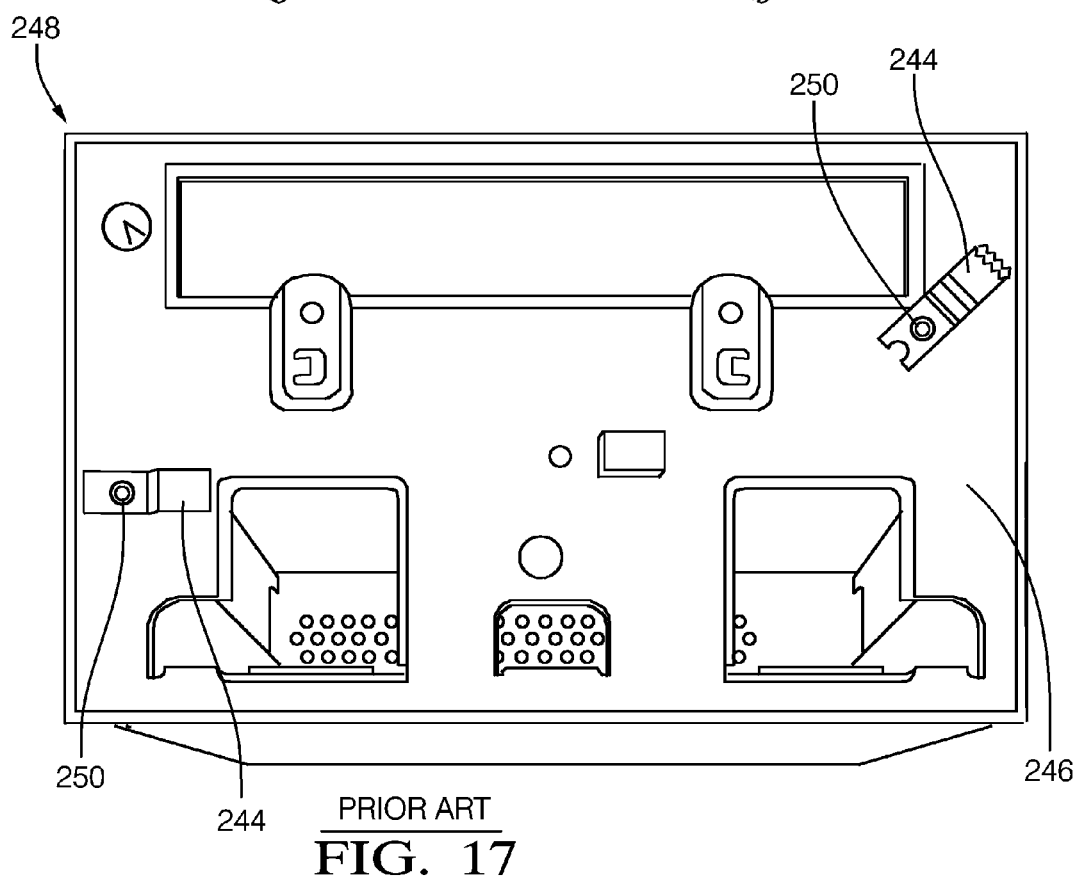
PRIOR ART
FIG. 17

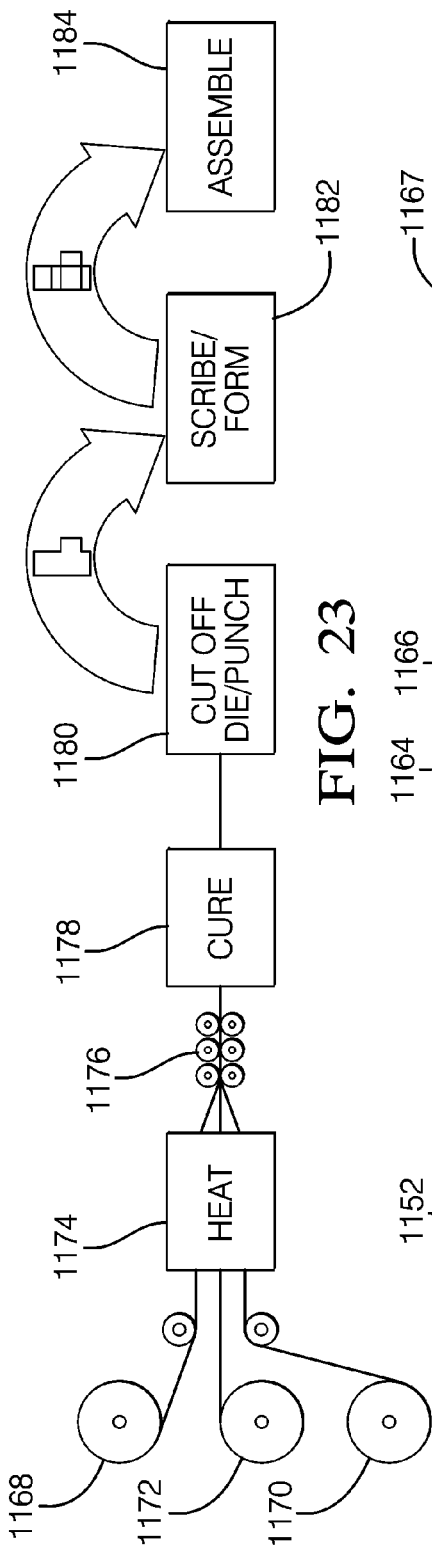
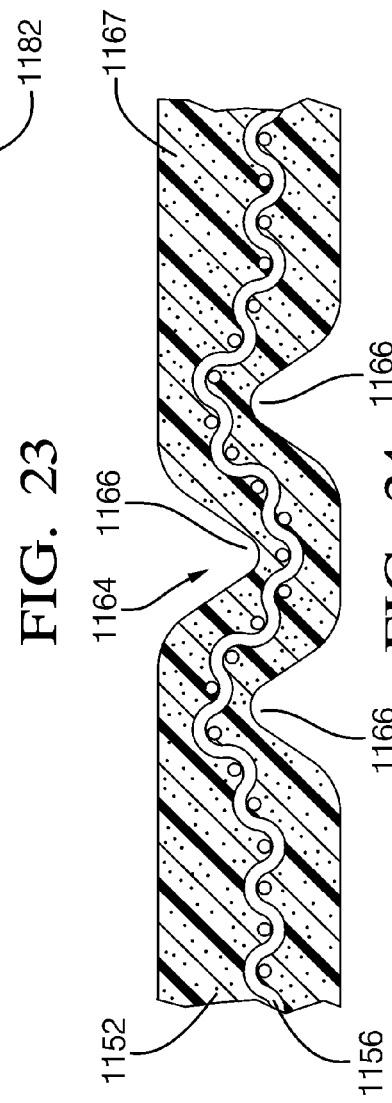
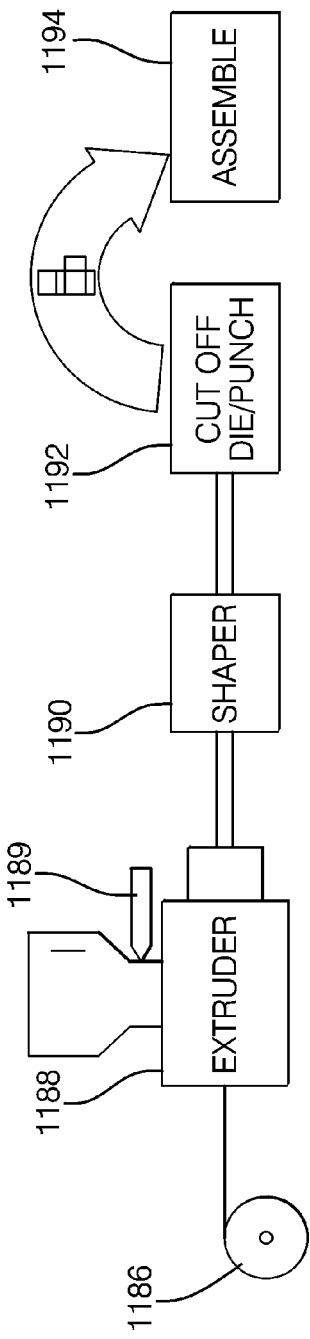
FIG. 23
FIG. 24
FIG. 25

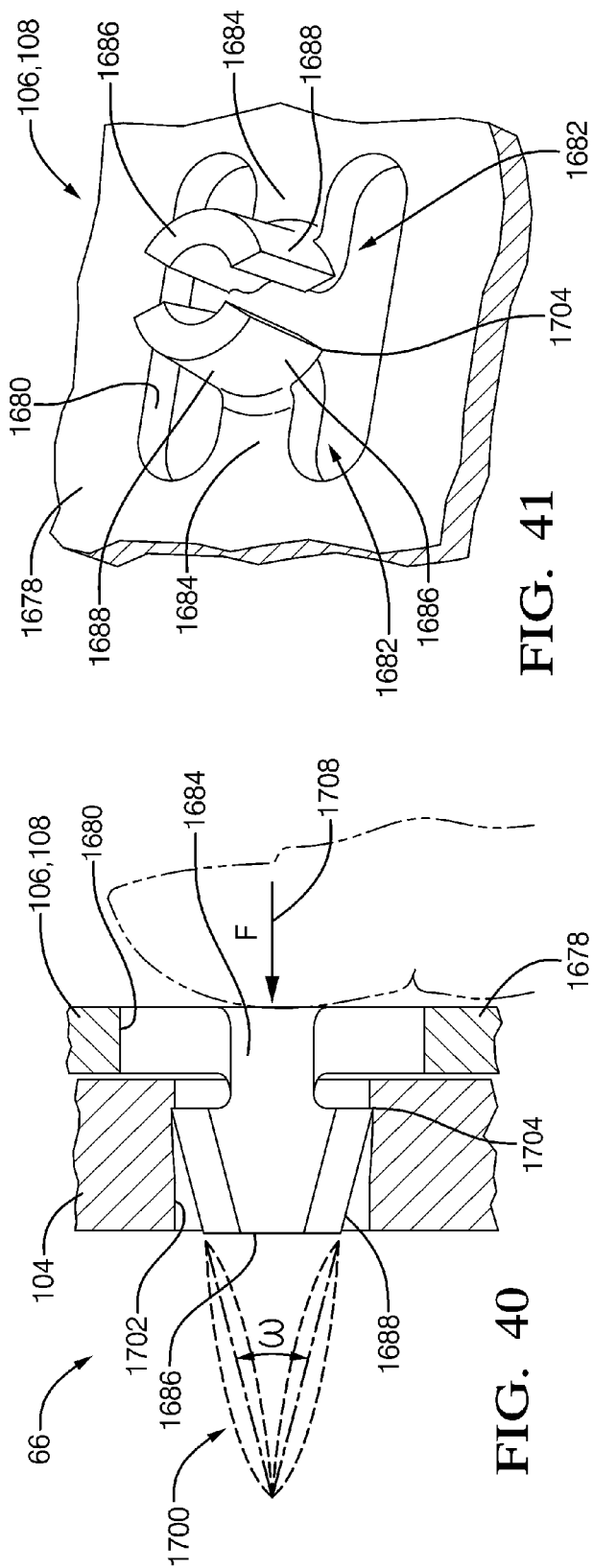
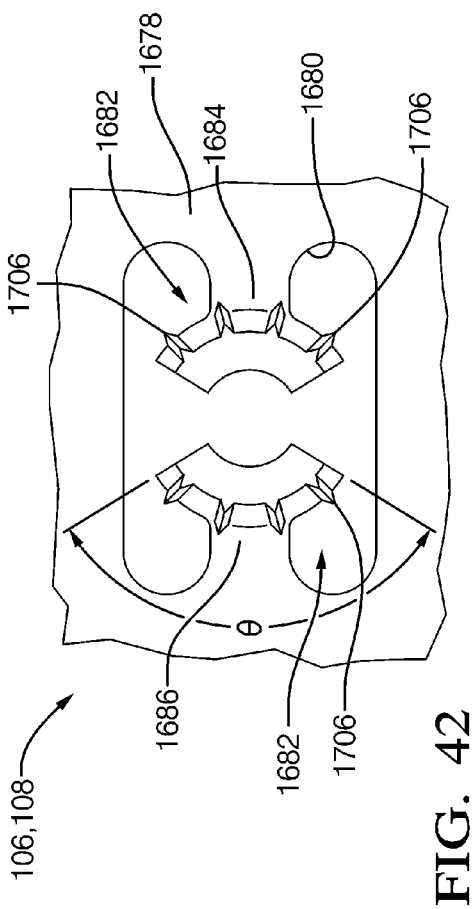
FIG. 40
FIG. 41
FIG. 42

METHOD OF FABRICATING A LIGHTWEIGHT AUDIO SYSTEM HOUSING ASSEMBLY

RELATED APPLICATIONS

The present application is a Continuation in Part application of U.S. Ser. No. 11/893,357 filed 15 Aug. 2007, now issued as U.S. Pat. No. 7,733,659 B2, claiming priority to Provisional applications U.S. Ser. No. 60/838,698 filed 18 Aug. 2006 to Chris R. Snider et al., entitled Lightweight Automotive Radio/CD Player and U.S. Ser. No. 60/931,467 filed 23 May 2007 to Chris R. Snider et al., entitled Lightweight Automotive Telematic Device, both assigned to a common assignee.

TECHNICAL FIELD

The present invention relates generally to apparatus for enclosing electrical subassemblies, and more specifically relates to apparatus for efficiently securing subassemblies to a chassis of an electrical assembly such as an automobile radio, compact disc playing mechanism, cassette tape playing mechanism, navigational aid, personal computer, personal and telematic communication devices or disk drive mechanism.

BACKGROUND OF THE INVENTION

Devices such as automobile radios or personal computers contain subassemblies such as cassette playing mechanisms or disk drives that are attached to the chassis using threaded fasteners. The chassis provides structural support for the subassemblies and also provides electromagnetic shielding to limit electromagnetic interference (EMI) experienced by, and/or created by the device. The fasteners ensure that each subassembly within the chassis is properly located and securely retained within the chassis.

The use of such fasteners can have numerous drawbacks, particularly in a high volume production setting. The process for applying or installing fasteners can vary, but there is usually some degree of automation required, ranging from manually loading a screw into a bit on a pneumatic driver to using self-feeding automated machines. Typically, the torque applied by the device used to drive the fasteners must be monitored regularly and adjusted in order to assure proper seating of the fasteners. When fasteners are used, sheet metal tolerances, as well as tolerances of the fasteners themselves, have to be maintained at tight levels to allow for the minimization of stress in the assembly when aligning multiple fasteners with corresponding holes in the chassis and in the subassembly.

When threaded fasteners are used to assemble an electrical device, the assembly cycle time can be very long especially in high volume production. An operator assembling the device must typically first obtain the threaded fastener, orient and position it in alignment with the driver bit, then manipulate or actuate the machine to drive the threaded fastener. Furthermore, using threaded fasteners presents a risk of any one of the following upstream failures occurring: stripping of fastener threads; insufficient torque resulting in an unseated fastener; excessive torque resulting in distension/deformation of the fastener or adjacent electrical components; installation of the wrong fastener type or size; foreign object damage due to fasteners and/or metal shavings dropping onto the assembly and/or subassembly; and stripping of the head of the threaded fastener. Also, a fastener installation tool such as a driver and bit can slip off the fastener and impact an electrical component resulting in a damaged assembly.

If self-tapping fasteners are used, the process of driving the self-tapping fasteners into sheet metal often causes shavings of sheet metal to disperse into the assembly. Such shavings have been known to cause electrical failures, such as shorts or corruption of magnetic components that can permanently damage the product. If self-tapping fasteners are not used, an extra production step is required to pre-form threads in the sheet metal of the chassis and/or the subassembly to be installed within the chassis.

Fasteners further require an additional inventory burden on the production line in that the production line must be continuously stocked with part numbers (fasteners) other than the integral components that add value to the assembly. Also special tools specifically required for assembly, using fasteners, such as drivers and bits, must be continuously monitored and maintained for proper performance, wear and torque specifications. Typically, the top and/or bottom surface of the chassis must be secured in place after the subassembly is attached to the chassis.

Special fixtures are often required on the production line to secure a subassembly in a proper location and orientation while it is mounted within the chassis with fasteners. Such fixtures can be very complex, and the use of such fixtures usually requires extra handling of both the subassembly and of the resulting assembly thereby adding to the production cycle time and potentially compromising quality of the final product.

FIG. 1 illustrates the construction of a typical prior art automotive radio/compact disc (CD) player 10. Radio/CD player 10 comprises a radio subassembly whose principle circuit components are carried on a circuit board 12 and a CD player subassembly 14. The circuit board 12 and the CD player 14 are encased within a common chassis 16 made up of sheet metal components. Chassis 16 includes a wraparound housing 18 defining a back and sidewalls, a top cover 20, a bottom cover 22 and a front plate 24 which are interconnected by numerous threaded fasteners to collectively enclose the subassemblies. The top and bottom covers 20 and 22, respectively, are provided with large arrays holes or openings for airflow and ventilation of heat generated within the radio/CD player 10. A convector or heat sink 26 is carried on an outer surface of one of the chassis sidewalls and is interconnected through a port/window 28 to a power device assembly 30. A trim plate assembly 32, along with a support pad 34 and CD dust cover 36 are affixed to the front plate 24, providing an operator control interface with the radio/CD player 10. Circuit board 12 is electrically in-circuit with the CD player subassembly 14 through an intermediate flex wire cable 38 and with the power device assembly 30 through a jumper cable 40. Information bearing labels 42 and 44 are provided for future reference by the operator and service technicians. The radio/CD player 10 is electrically interconnected with an antenna, power supply, speakers and other related systems of a host vehicle by rear-facing connectors 46 carried on the circuit board 12 which are registered with openings 48 in the rear wall of wraparound housing 18. The radio/CD player 10 is mounted within a host vehicle by threaded fasteners passing through openings in mounting features 50 extending from front plate 24 and a rearwardly directed mounting bushing 52 which is threadably affixed to a stud 54 carried on the outer surface of the rear wall 56 of wraparound housing 18. As best seen in FIGS. 11 and 12, the shank of the stud 54 extends outwardly through a hole 58 disposed concentrically with a localized recess 60 and the stud 54 is seated within the recess 60. FIG. 90 illustrates another known stud design including a threaded shank secured to the rear wall 53 of a radio set 51 by a set nut 55 and receiving a molded rubber, plastic or vinyl stud 57 thereover. Note the large number of threaded fasteners 59.

The radio/CD player 10 of FIG. 1 is of ordinary complexity and may require fifty or more threaded fasteners to complete the manufacturing process. Installation of that many fasteners may require that the in-process chassis be re-positioned/re-fixtured ten to fifteen times as it passes along an assembly line of eight to ten skilled workers/work stations.

Vehicle entertainment systems usually include an audio component such as a radio to enable receiving signals from antennas, contain various forms of playback mechanisms, and have the capacity to accept data from user devices like MP3 players. Typically, the radio has a decorative assembly that provides man-machine interface as well as displaying pertinent data relative to the selected media and audio settings. Also, the back-end or chassis is constructed of metal to provide various functions to ensure the performance of the radio in the vehicular environment. The structure to contain the mass from playbacks, the heat conductive properties, and the electrical shielding and grounding are just a few of the advantages to using the metal construction. Unfortunately, with the density of the metal, the disadvantage of added weight is a side effect of the typical construction. In a vehicle, added weight impacts fuel economy, as well as other hidden costs during assembly that can effect the cost of the product, like sharp edges of metal can be a potential hazard for assemblers in the manufacturing plant as well as added weight can limit the packaging of multiple parts in containers for inter and outer plant distribution.

Thermal Management System

Devices such as automobile stereos, audio amplifiers, home stereo systems, two-way radios, computers, signal conditioners/amplifiers, compact disc playing mechanisms, and cassette tape playing mechanisms are examples of products that typically require electrical components to amplify signals and regulate power. Accordingly, such devices typically contain numerous electrical components such as single in-line package (SIP) amplifiers and regulators that are typically soldered into printed circuit boards. Such electrical components generate heat in use. The heat must be dissipated away from the electrical components to avoid damage that can be caused by excessive temperatures in the electrical components. For example, excessive temperatures can cause delicate electrical leads to fail or insulating materials to melt, thereby causing a short circuit resulting in damage to, or even failure of, the entire electrical device.

A convector is often mounted to an outer surface of such a device to dissipate heat generated by components by transferring the heat away from the components and the device to the convector and then to the air through radiation. In order to accomplish this, it is preferable that the convector be physically in contact with the component. The components and the convector can be pressed together to allow even better heat conduction from the components to the convector. Sometimes an intermediary material such as a thermal pad or silicon grease is used between the component and the convector to assist in creating an adequate heat transfer junction.

Many convectors are made from aluminum due to the high heat conductivity of that material. Convectors often include a plurality of fins to increase the effective surface area of the convector and thereby increase the rate at which the convector can dissipate heat. Typically, aluminum, convectors are formed by an extruding process, during which the fins can also be formed integrally therewith.

Convectors are usually assembled to the component or components during final assembly of the overall device in which they are used. At final assembly, components such as SIP amplifiers are already soldered into a printed circuit board. The order of assembly can vary as to which component is assembled into the chassis first. The printed circuit board can be installed into the chassis before the convector is mounted to the printed circuit board and the chassis. Alternatively, the convector can be mounted to the chassis before the printed circuit board is mounted to the convector. Sometimes, the convector is assembled to the printed circuit board to form a subassembly before being assembled to the chassis.

Typically, components are attached to the convector using a clip and one or more threaded fasteners that extend through a hole in the clip and into a hole in the convector. The clip, component and convector must all be simultaneously held in a fixture and then be fastened together with a threaded fastener. If the component includes a hole to accept a threaded fastener, it can be mounted directly to the convector using a threaded fastener that extends through that hole, without using a clip.

The use of such fasteners can have numerous drawbacks, particularly in a high volume production setting. Often, each hole in the convector that receives a fastener must be separately drilled or punched. This is especially true for an extruded convector if the axis of the hole is not aligned with the direction in which the convector is extruded. The fastening process can vary, but there is usually some degree of automation required, ranging from manually loading a screw into a bit on a pneumatically or electrically powered driver to using self-feeding screw machines. Typically, the torque applied by the device must be monitored regularly and adjusted in order to assure proper seating of the fasteners.

The clamping force between the convector and the component should be at a proper level to ensure sufficient heat transfer to the convector. When fasteners are used to attach the convector to the component, clamping force is a function of the type of fastener and its condition and degree of assembly (e.g. the level of torque applied during installation of the fastener). Thus, a threaded fastener that is not seated all the way will give less clamping force than one that is seated all the way. Or, a stripped or improper type of fastener may provide an insufficient clamping force.

Special fixturing is often required to hold a component in the proper location while it is mounted to the convector using one or more fasteners. Such fixturing can be very complex and use of such fixturing usually requires extra handling of both the component and of the resulting assembly, thereby adding to the production cycle time and potentially compromising quality of the final product.

When threaded fasteners are used, the assembly cycle time can be very long, especially in high volume production. The operator must specifically obtain the threaded fastener, bring it in contact with the driver bit, then drive the threaded fastened. If self-tapping fasteners are used, the process of driving the self-tapping fasteners into metal often causes metal shavings to disperse into the assembly. Such shavings have been known to cause electrical failures that can permanently damage the product. If self-tapping fasteners are not used, an extra production step is necessary to form threads in the metal of the convector.

Accordingly, there is a need for electrical assemblies that do not require fasteners or tooling for securing a component to a convector.

Vehicular radio chassis assemblies may typically contain a circuit board assembly and a playback mechanism that may have ground points from the circuit board to the enclosure.

They also tend to have heat sinks added for conducting unwanted heat away from the radio circuit board power components to transfer the heat outside of the chassis. When the enclosure has been constructed of a non-metallic material such as plastic, the grounding and shielding has been provided by a variety of methods, including, but not limited to using a metal wire mesh that is insert molded with the structure of the plastic enclosure. Another method may include using localized shields that are assembled and soldered to the circuit board. However, this approach only provides a shield, not a ground. While plastic enclosures are desirable for manufacturing assembly simplification through the elimination of fasteners as well as weight reductions from the metal enclosures, the capitalization to provide a wire mesh insert to a plastic part has been a drawback, especially in low volume applications. Also, the manufacturing process flow has typically coupled the wire mesh insert fabrication cell directly with the plastic molding press, which may not be desired is the molding process utilization is not at a high enough percentage of the available molding press time.

Electrostatic Discharge Device

Static electricity (electrostatics) is created when two objects having unbalanced charges touch one another, causing the unbalanced charge to transfer between the two objects. This phenomenon commonly occurs in homes, vehicles and other environments when the air is dry (i.e. has a characteristic relatively low level of humidity). For instance, when a person slides onto a car seat, electrons may transfer between the two, causing the surface of the person's body to store a charge. When the person, then, touches a vehicle component, the charge may travel (discharge) from the body to the component, thus creating static electricity. If the object touched is an electronic device, such as a home stereo, home theatre system, computer, vehicle entertainment system or other electronic media system, this electrostatic discharge can be harmful to the sensitive electronic components of the device. For instance, when a person slides onto a vehicle seat and inserts a disc into the car stereo, a charge may travel from the body through the disc to the sensitive electronic components in the vehicle stereo. Similar problems may occur when using DVD and other magnetic media and disc players.

Accordingly, problems with the drainage of a static electric charge impacting sensitive electronic components continue to persist.

SUMMARY OF THE INVENTION

The present invention provides numerous product and process advantages which collectively result in substantial cost and labor savings. By way of example, the preferred design optimizes the assembly process. It minimizes the required handling of major components and subassemblies during the assembly cycle. Final assembly is optimized, wherein only seven major components and subassemblies are involved. This minimizes the number of work stations and fixtures, in-process transfers between work stations and total assembly cycle time. The inventive design permits selection of the optimal mechanical product configuration for a given receiver family. Furthermore, it permits idealized electrical and mechanical building block partitioning for common and unique elements.

The preferred embodiment of the invention contemplates screwless final assembly without the use of tools, fixtures and assembly machines. This greatly enhances in-process product flow in the factory, improves scheduling of final assembly, and allows labor intensive processes such as stick lead assembly to be largely moved off-line. This greatly reduces both direct and indirect labor requirements. Furthermore, inventory control is simplified inasmuch as position part proliferation is deferred to or near the end of process.

These and other features and advantages of this invention will become apparent upon reading the following specification, which, along with the drawings, describes preferred and alternative embodiments of the invention in detail.

BRIEF DESCRIPTION OF THE DRAWINGS

The present invention will now be described, by way of example, with reference to the accompanying drawings, in which:

FIG. 5, is an exploded, perspective view of the radio/CD player of FIG. 2, illustrating final assembly step II in the production thereof wherein the case is slid and snapped to the faceplate;

FIG. 11, is a perspective view of the circuit board assembly with ground clips installed thereon;

FIG. 12, is a fragmentary, cross-sectional view of a ground clip and an associated portion of the printed circuit board on an enlarged scale in assembly with an adjacent portion of the case to effect a grounding point with the integral wire mesh;

FIG. 15, is a cross-sectional view taken on lines 15-15 of FIG. 13;

FIG. 16, is a cross-sectional view taken on lines 16-16 of FIG. 13;

FIG. 17, is a front perspective view of a prior art faceplate illustrating rivet/staked spring clips for ESD protection to associated contact pads on a trim plate assembly;

FIG. 23, is a schematic representation of manufacturing process equipment for producing a continuous strip of composite/laminate (plastic-screen-plastic) material for subsequent formation of the case structure of the radio/CD player of FIG. 18;

FIG. 24, is a representative view, on a greatly enlarged scale, of laminate case material produced by the process equipment of FIG. 23, illustrating a localized deformation of the material to define a reduced thickness, undulating living hinge section;

FIG. 25, is a schematic representation of alternative manufacturing process equipment for producing a continuous strip of composite (plastic & screen) material for subsequent formation of a case structure suitable for the radio/CD player of FIG. 18;

FIG. 40, is a broken, cross-sectional view, on an enlarged scale, of one of the squirts taken on line 139-139 of FIG. 39, as it is manually applied (as illustrated in phantom) within an adjacent opening in the CD player subassembly;

FIG. 41, is a broken, perspective view, on an enlarged scale, of one of the squirts of FIG. 39;

FIG. 42, is a top plan view of an alternative embodiment of one of the squirts of FIG. 39;

Figure 1:
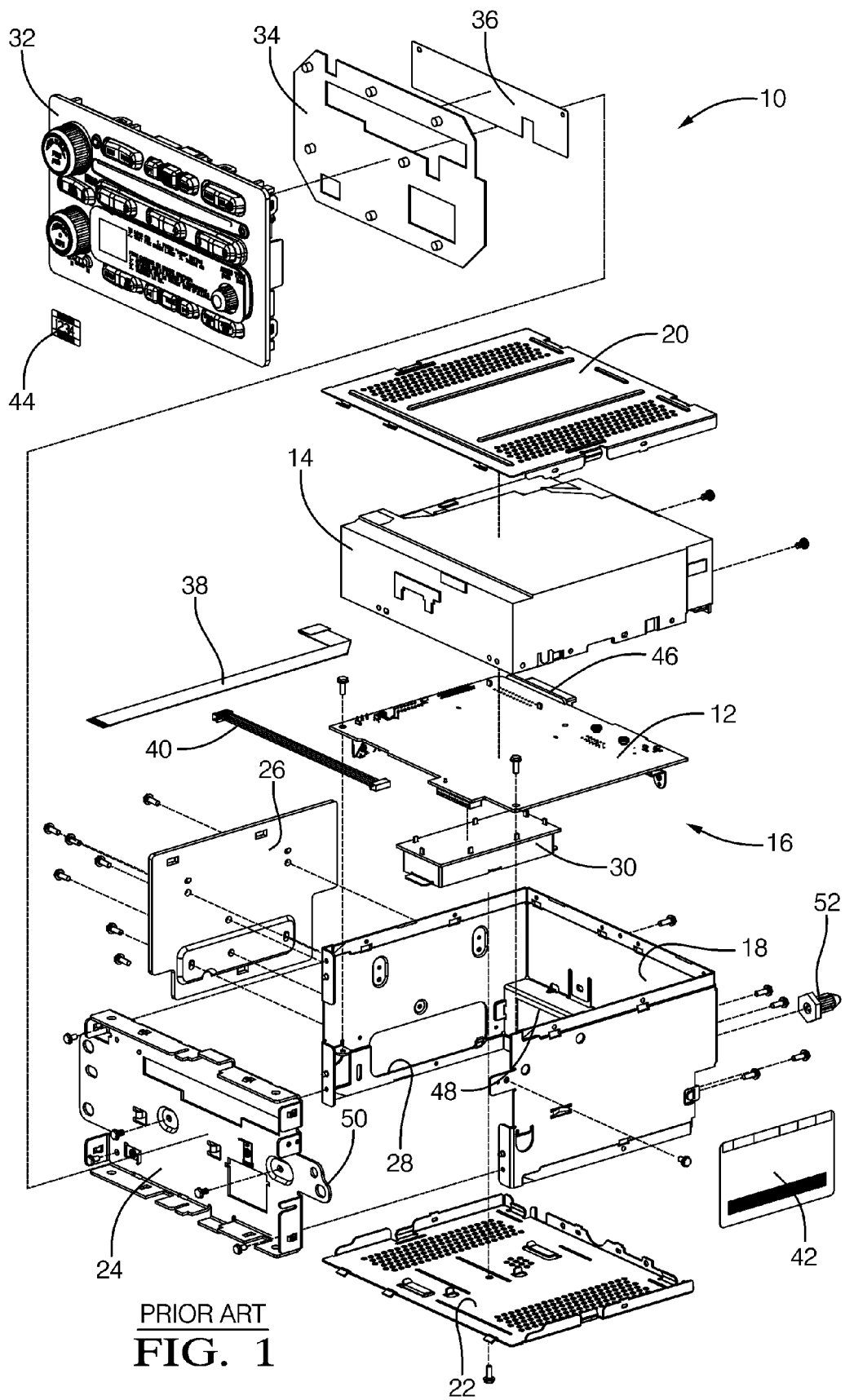
FIG. 1, is an exploded, perspective view of a prior art automotive radio/CD player combination in a common chassis constructed of sheet metal and a large number of threaded fasteners.

Although the drawings represent varied embodiments and features of the present invention, the drawings are not necessarily to scale and certain features may be exaggerated in order to illustrate and explain the present invention. The exemplification set forth herein illustrates several aspects of the invention, in one form, and such exemplification is not to be construed as limiting the scope of the invention in any manner.

DESCRIPTION OF THE ILLUSTRATIVE EMBODIMENTS

The present invention can be applied in its broadest sense to electronic devices and systems where shielding from radio frequency interference (RFI), electromagnetic interference (EMI), bulk current injection (BCI) and/or electrostatic discharge (ESD) is required. In addition to vehicle based radios and audio entertainment systems, the invention can be advantageously applied in "infotainment" and telematic systems. Furthermore, the present invention employs virtually "fastenerless" design architecture to facilitate low-cost, high volume production techniques.

A telematics product is a two-way communication/receiver system that enables access by a vehicle occupant to vehicle related information like geographic position/location through the use of a GPS module with antenna, vehicle diagnostics, crash sensors and air bag deployment. It also contains a phone module that is linked through a microphone in the vehicle and the radio speaker system for hands free calling via voice recognition and links to a call center for a variety of services, including but not limited to emergency help, concierge, vehicle theft recovery, turn-by-turn route guidance, vehicle diagnostics and vehicle unlock.

For convenience of understanding, the following description will be focused primarily upon an automotive radio/CD player system.

Lightweight Radio/Cd Player for Vehicular Application

The present invention reflects an improved design to reduce the overall weight of an automotive radio/CD player without compromising the strength of the unit. The present invention employs a polymer based material that can be molded to provide the necessary features for the chassis as well as the frontal interface to the decorative front-end assembly described for the man-machine interface. By molding a case with the necessary details to accept the playback mechanisms (if desired) as well as the circuit board(s) needed for the electrical control, the required functionality of the unit is maintained as compared to the typical metal box. The necessary shielding and grounding is accomplished by insert-molding a mesh screen wire that has been pre-formed to contour with the molding operation. The grounding of the circuit boards may be accomplished by using ground clips attached directly to the ground pads of the circuit board that would interface directly with exposed screen wire mesh of the molded part. While metal is also a good conductor for the thermal load inside the unit, openings must be incorporated to allow airflow for additional cooling. The same openings can compromise the shielding. With in-molded mesh screen wire, the mesh acts as a Faraday cage to shield the electronics, but the open weave allows airflow to promote the dissipation of the thermal load from inside the unit, to the exterior. Besides the reduction of mass offered by the molded polymer material for the unit chassis and front plate, the hidden benefits include ease of handling in the assembly process as well as less container and shipping weight.

To facilitate assembly, the molded polymer chassis and front plate can use integral or molded in guideways and snaps, thereby eliminating the typical screw fastener assembly method previously used for these components. To enhance the rigidity, the component parts that comprise the assembly are sandwiched at the common vehicle instrument panel attachment points such that when the mounting screws are driven, they firmly clamp the component pieces to the host vehicle. In the event a playback mechanism of substantial mass and volume is required, the sub-assembly structure for the mechanism would utilize formed attachment tabs that would be an intermediate layer in the aforementioned component part sandwich. Another benefit for the mounting at the back of the radio is often vehicles have a receptive hole or slot in the inner cavity of the instrument panel carrier that accepts a mounting bushing or "bullet" shaped extension that is screwed to a mounting stud that is typically swaged to the back of the metal enclosure of the radio. The mounting "bullet" can be molded directly in the polymer-based case eliminating the additional part and the assembly of that additional part.

To replace the metal structure of the vehicle radio, a galvanized (or appropriately coated) steel mesh wire screen will be cut, formed, and molded with a polymer resin to provide necessary details for assembly of components required for the functionality of the radio including, but not limited to, a circuit board assembly, a heat sink for audio power and switching components, a playback mechanism, and a man-machine interface or trim plate assembly, as well as vehicle mounting features. While the polymer or plastic provides the majority of the mechanical structure for the radio, the in-molded mesh screen wire provides the needed protection from various electrical anomalies including electromagnetic contamination, radio frequency interference, bulk current injection, and electrostatic discharge, to name a few. The screen mesh also allows openings necessary for air passage or venting of heat from the radio by molding the radio back end or case and front plate. The many details and features needed in a typical assembly can be incorporated directly into the parts, eliminating the need for fasteners and separate additional parts often required with parts fabricated in metal.

The specific materials selected for fabricating the radio case and front plate will vary depending upon the application, including the contained mass of the mechanisms employed as well as the severity of the contemplated environment (esp. temperature and vibration). Examples of materials that could be employed for typical automotive applications are:

Case: Glass-Filled Polyester, Glass-Filled Polypropylene, Polycarbonate, ABS.

Front Plate: Polycarbonate, ABS, PC/ABS and Noryl.

Major components which contact one another or are mechanically interconnected preferably are formed from material having substantially differing surface finish and hardness characteristics to minimize the possibility of resulting squeaks, rattles and the like.

Although presently viewed as cost prohibitive for automotive applications, it is contemplated that nano carbon tube filler can be employed within the plastic material forming the case and front plate to provide effective shielding and enhance the structural strength of the case assembly.

In addition to weight savings, which may amount to well over one pound (0.4536 Kg), the part handling is improved to reduce the amount of fasteners as well as separate component parts. Often a radio may be constructed from a wrap-around, a cover and the fasteners along with a mounting bushing or "bullet" screwed to a "swaged" threaded stud in the metal case. Also, the metal pieces require assembly personnel to wear gloves during handling to avoid any cuts or damage to their hands as well as protection from any metal fabrication fluid residue. Molded plastic does not require any special gloves, or the concerns of cuts to the skin. Aside to the benefit to the vehicle by reducing the radio weight by over one pound (0.4536 Kg), the savings for a manufacturer include reduced shipping cost through the weight reduction and potential container efficiency improvements. Product labeling can be improved through laser engraving the plastic with the desired number, customer logos, etc. Metal typically requires a stamping detail (not easily changed) and/or a printed label that is adhesively applied. This offers greater flexibility and eliminates additional parts (like labels) to use the plastic, as well as better durability than a label.

Referring to FIGS. 2-10, a consolidated radio/CD player apparatus 62 embodying many aspects of the present invention is illustrated. The radio/CD player 62 is an assemblage of six major components or subassemblies, a circuit board subassembly 64, a CD player subassembly 66, a box-like housing case 68, a front closure member or front plate 70, a convector or heat sink 72 and a trim plate subassembly 74.

It is envisioned that each of the major components/subassemblies would be produced "off-line" and the final assembly process would comprise the efficient, high volume joining of the major components/subassemblies and end-of-line testing of the completed units.

FIGS. 2 and 8-10 depict plan and perspective views of the fully assembled radio/CD player apparatus 62. FIG. 3 is an exploded view illustrating the juxtaposition of the respective major components during the assembly process. FIGS. 4-7 depict specific assembly steps of the major components as will be described hereinbelow.

The case 68 and front plate 70 are each preferably injection molded of polymer based material and collectively comprise a substantially closed housing assembly 76. The case 68 has a box-like structure, including upper and lower wall portions 78 and 80, respectively, left and right side wall portions 82 and 84, respectively, and a rear wall portion 86. The case 68 also has mounting features extending externally of the case walls, including left and right front mounting flanges 88 and 90, respectively, extending from the forward edges of the left and right side walls 82 and 84, respectively, and a mounting stud 92 extending rearwardly from the rear wall 86. All of the case wall portions and mounting features of the case 68 are integrally formed in a single injection molding process. The case defines a front opening 94 which, upon assembly, is closed by front plate 70. An assembly axis 96 extends symmetrically from front to rear of the case 68, exiting opening 94 along the nominal centerline of the case 96.

The circuit board subassembly 64 consists of a common or main printed circuit board (PCB) 98 and a unique, application specific PCB 100 which are electrically and mechanically interconnected by several pin connectors 102. It is envisioned that edge connectors, ribbon connectors or the like could be substituted for the pin connectors 102. The common PCB 98 contains all surface mount components. The circuit board subassembly 64 comprises an audio component.

The CD player subassembly 66 consists of a conventional multi-disc player unit 104 and substantially minor-image left and right side mounting brackets 106 and 108, respectively, affixed thereto by integral fastener devices such as "squirts" (refer FIGS. 40-42). Note that there are slight differences between the left and right mounting brackets 106 and 108, but they are deemed to be inconsequential for purposes of the present invention. The left and right mounting brackets 106 and 108 have outwardly directed mounting flanges 110 and 112, respectively, which, upon assembly, register with case mounting flanges 88 and 90, respectively. The CD player subassembly 66 comprises an audio component.

The heat sink 72 comprises a substantially flat, stamped aluminum plate adapted for mounting to the outer surface of the left case sidewall 82 and includes a recessed portion 114 which, upon installation, extends inwardly through a port 116 in left case sidewall 82 for thermal interconnection to heat generating and power circuit components 118, 120 and 122 carried on the main PCB 98.

The trim plate subassembly 74 is configured to organize audio system input/output and display devices, informational indicia and decorative display devices for an associated host vehicle operator.

Figure 4:
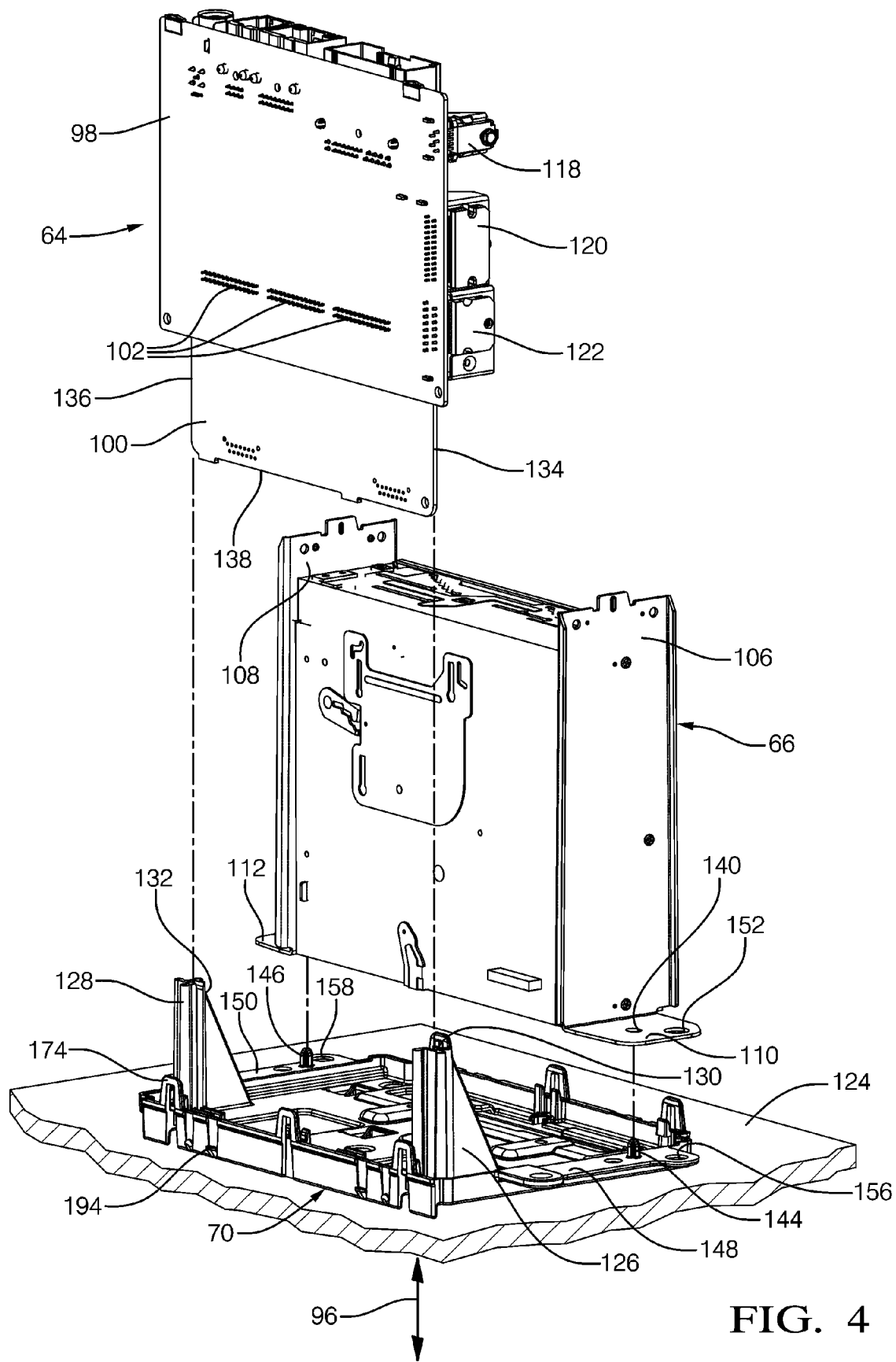
FIG. 4, is an exploded, perspective view of the radio/CD player of FIG. 2, illustrating final assembly step I in the production thereof wherein the playback mechanism and circuit board assembly are slid and snapped to the faceplate.

Referring particularly to FIGS. 4-7, a method of assembly of the lightweight audio system 62 of the present invention is illustrated. Audio system 62 can be assembled manually by an ordered process wherein a single (preferably, but not limited to) operator, who sequentially assembles the six major components or subassemblies on a designated work surface 124. No specialized tools or separate/dedicated fixtures are required. No threaded fasteners/screws are required. Each or the major components and subassemblies form integral features which cooperate to interact with features of the other components and subassemblies to register, align and guide the components and subassemblies during adjoining thereof as well as to removably affix the components and subassemblies to one another when in their final design position. This process is referred to herein as the Slide-lock Snap-lock™ Screwless Assembly Technology and Method or "SLAT". In effect, the components "self-fixture one another in combination the manipulation of the Assembly of the radio/CD player 62 is affected by the assembly technician or operator taking the following steps:

As illustrated in FIG. 4, place the front plate 70 on the work surface 124 in an inverted position with the outer surface of the front plate disposed upon the work surface 124. The centerline of the front plate 70 defines an assembly axis, as designated by arrow 96 extending normally to the work surface 124.

The front plate has two laterally spaced, rearwardly directed extensions 126 and 128 integrally formed therewith. Extensions 126 and 128 form guideways or opposed slots 130 and 132, respectively, which open towards one another and are directed parallel to the assembly axis 96. Lateral edge guide surfaces 134 and 136 of the application specific PCB 100 register within slots 130 and 132 and are guided thereby during the insertion process until the leading edge surface 138 of the PCB 100 contacts the inside (upward facing in FIGS. 4 and 5) surface of front plate 70. At this point, common PCB 98 is cantilever suspended from PCB 100 via pin connectors 102 and other supports (not illustrated). Referring FIG. 5, the circuit board subassembly 64 is retained in position by the interfit of the edge surfaces 134 and 136 within slots 130 and 132.

The CD player subassembly 66 is next installed by manipulating it along the assembly axis 96 until through holes 140 and 142, formed in bracket mounting flanges 110 and 112, register with locating pins or nibs 144 and 146 integrally formed in laterally extending mounting flanges 148 and 150, respectively, integrally formed in front plate 70. Thereafter, the CD player subassembly is displaced downwardly along the assembly axis 96 until the lower surfaces of bracket mounting flanges 110 and 112 abut the upper surfaces of front plate mounting flanges 148 and 150. The CD player subassembly 66 is retained in the position illustrated in FIG. 5 by an interference fit between the front plate nibs 144 and 146, and the mounting bracket flange through holes 140 and 142.

Mounting bracket flanges 110 and 112 have secondary, larger diameter through holes 152 and 154 formed therein which register with similarly dimensioned through holes 156 and 158, respectively, formed in front plate mounting flanges 148 and 150 for receiving attachment means such as bolts, for affixing the completely assembled radio/CD player 62 to a host vehicle.

The steps of installing the circuit board subassembly 64 and the CD player subassembly can be reversed from that describer hereinabove.

The housing case 68 is next installed by manipulating it along the assembly axis 96 whereby the case wall portions 78, 80, 82, 84 and 86 fully envelop the circuit board subassembly 64 and CD player subassembly 66 in combination with the front plate 70.

Figure 5:
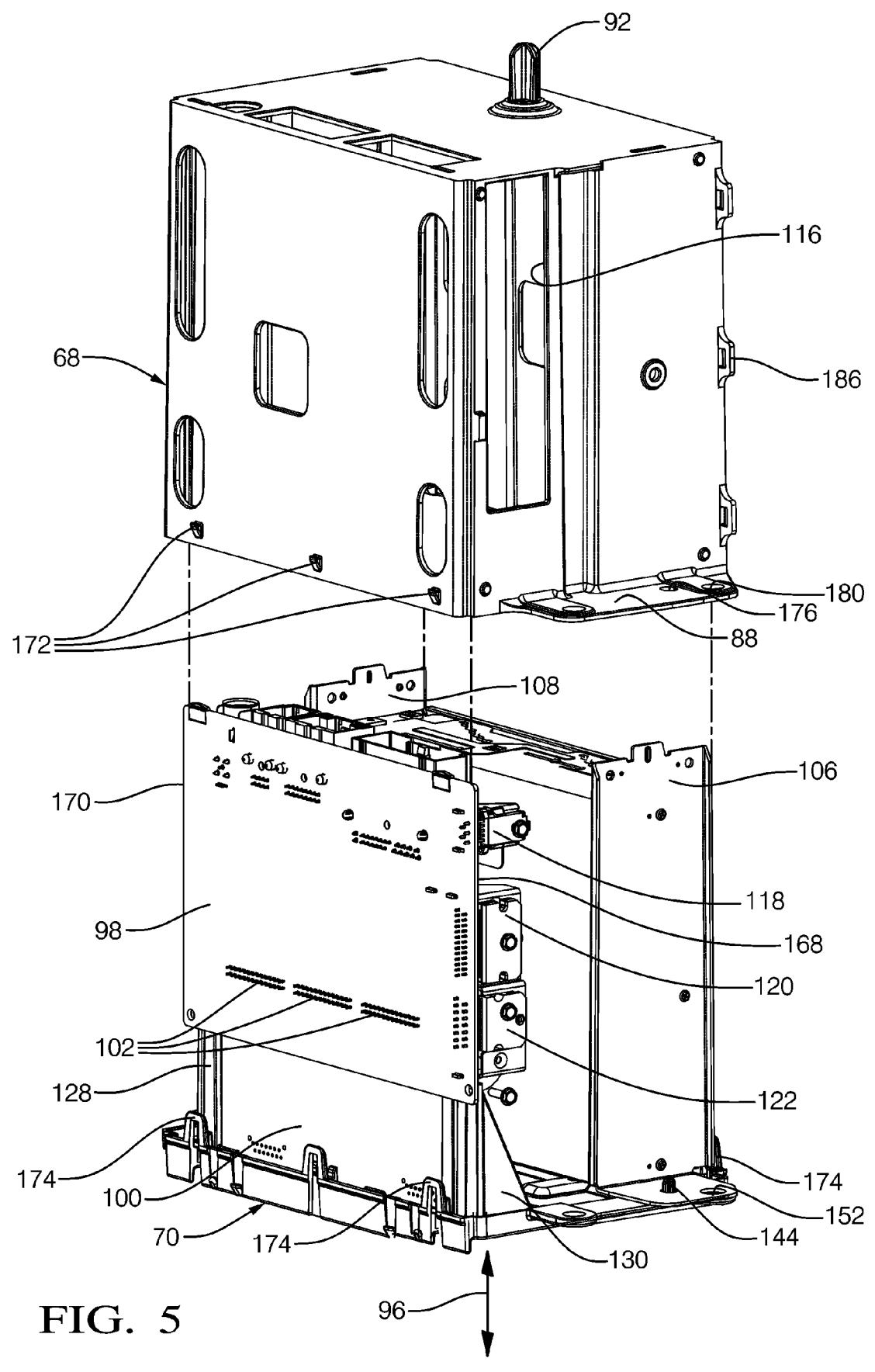
Figure 27:
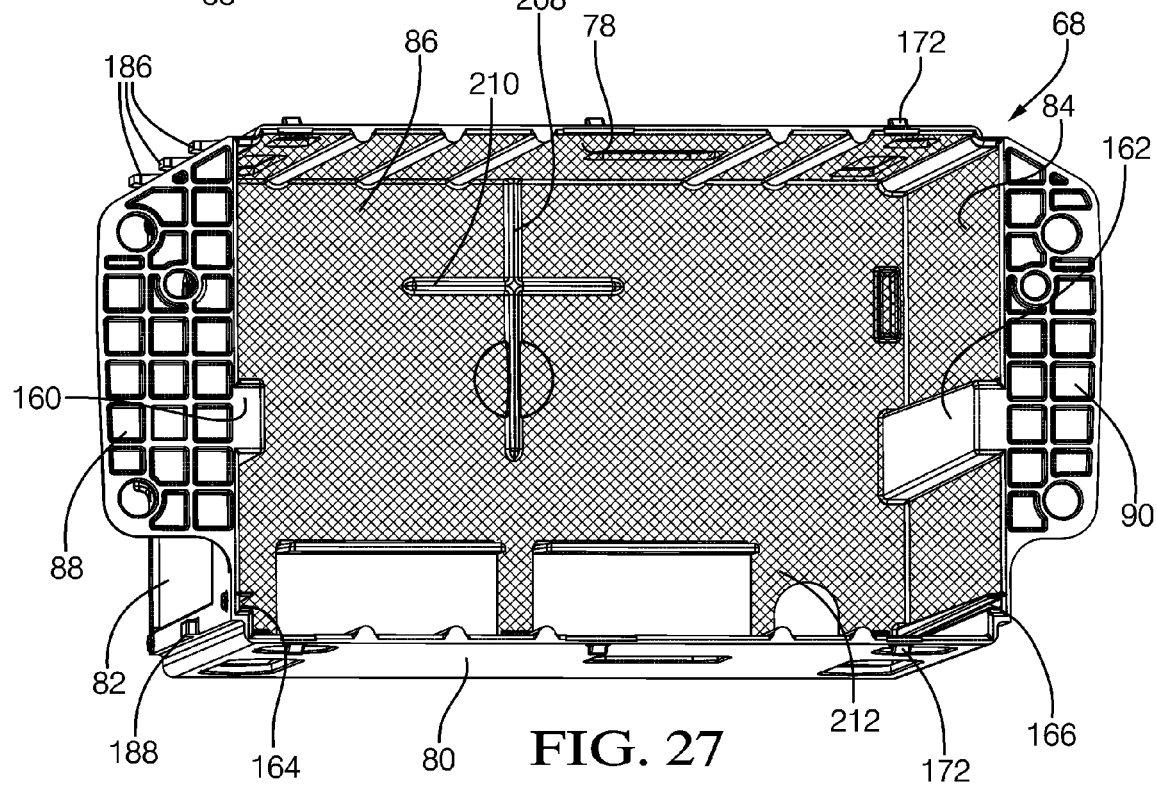
FIG. 27, is a front perspective view of the interior surface details of the case/back-end of FIG. 10 illustrating the wire mesh screen which has been insert molded within the case adjacent the inner surface portions thereof.

As best viewed in FIGS. 3, 5 and 27, the centerline of the case 68 is first manually aligned with the assembly axis 96 and rotationally positioned with the subassembly consisting of the circuit board subassembly 64, CD player subassembly 66 and the front plate 70, whereby a first cooperating pair of guideways 160 and 162 integrally formed in case sidewall portions 82 and 84 register with the CD player mounting brackets 106 and 108 and, simultaneously, a second cooperating pair of guideways 164 and 166 integrally formed in case sidewall portions 82 and 84 register with lateral edge guide surfaces 168 and 170 of common PCB 98. The case 68 is then manually displaced along the assembly axis 96 until the leading edge thereof defining front opening 94 contacts the rear surface of the front plate 70. Thereafter, cooperating ramped snap-engagement features 172 and 174 integrally formed with upper and lower wall portions 78 and 80 of the case 68 and the front plate 70, respectively, momentarily self-displace one another and snap back to self-engage to establish a positive interlock therebetween.

The case mounting flanges 88 and 90 form through holes 176 and 178 which register and self-engage with nibs 144 and 146, respectively, to provide a redundant engagement feature. Furthermore, the case mounting flanges 88 and 90 form a second set of through holes 180 and 182, respectively, which register with through holes 152 and 154 of mounting brackets 106 and 108, and through holes 152 and 154 of front plate mounting flanges 148 and 150, respectively.

Figure 2:
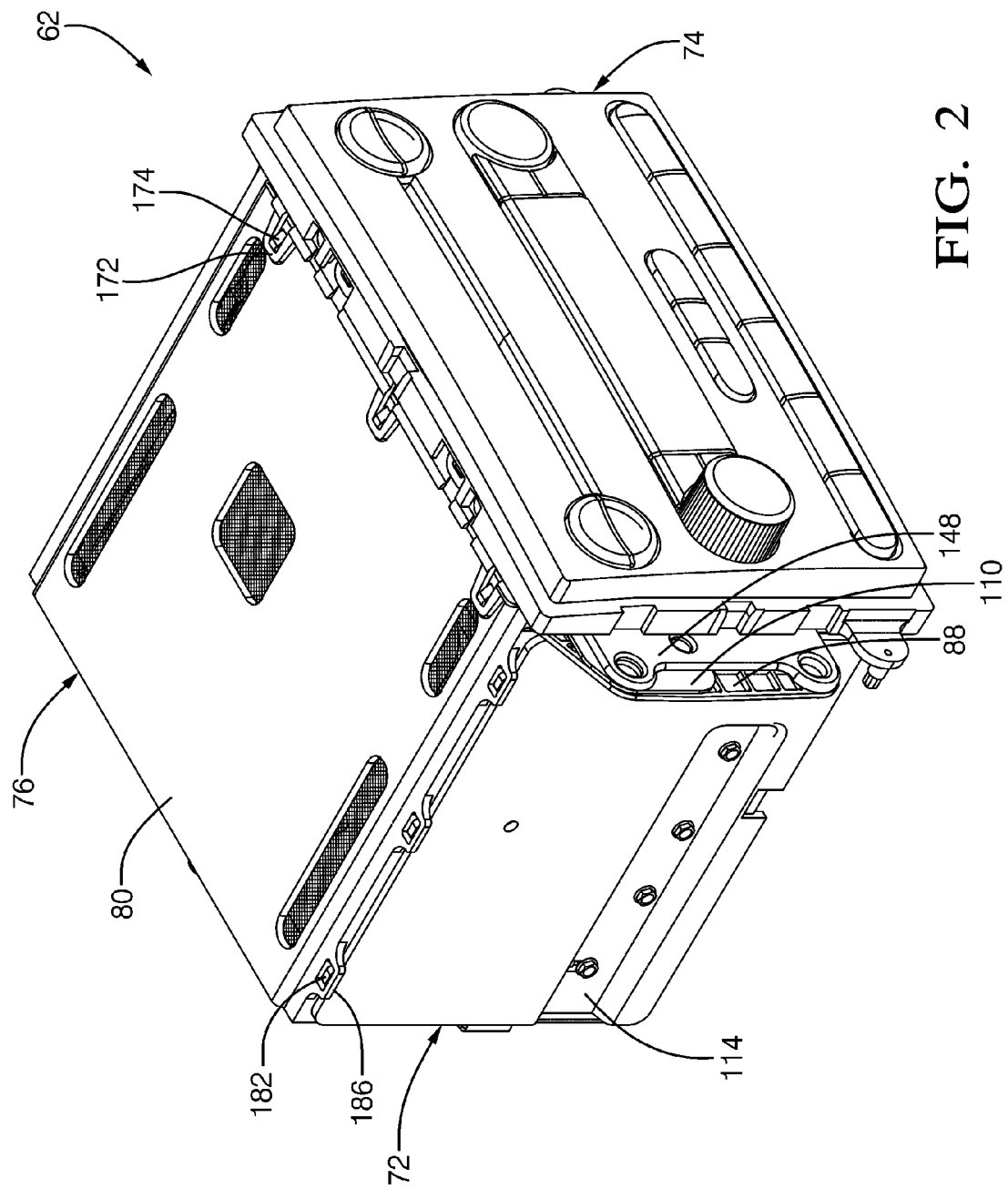
FIG. 2, is a front-left perspective view of an alternative embodiment of the present invention embodied in an automotive radio/CD player.
Figure 3:
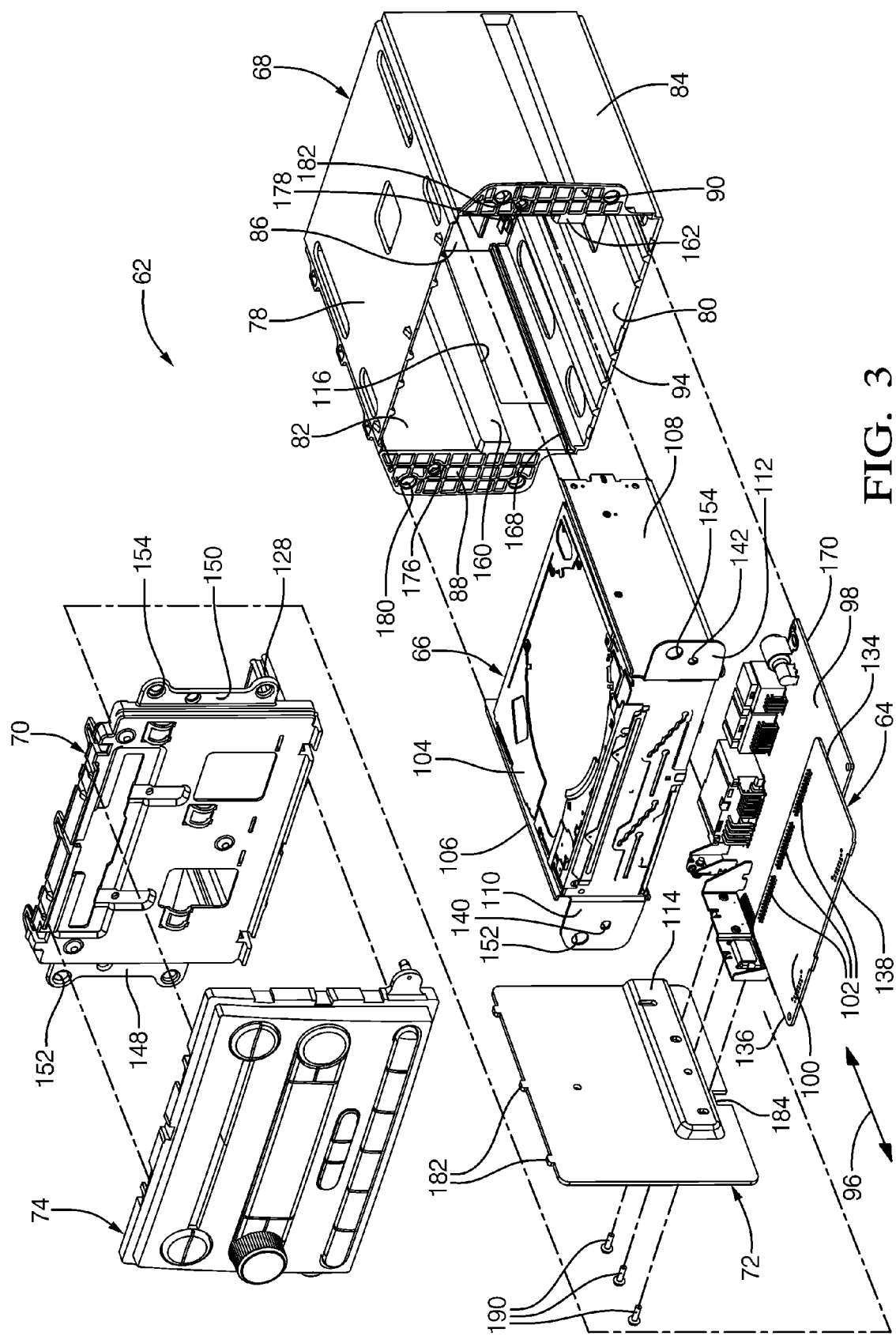
FIG. 3, is an exploded, perspective view of the radio/CD player of FIG. 2, illustrating the major subcomponents and subassemblies thereof.
Figure 6:
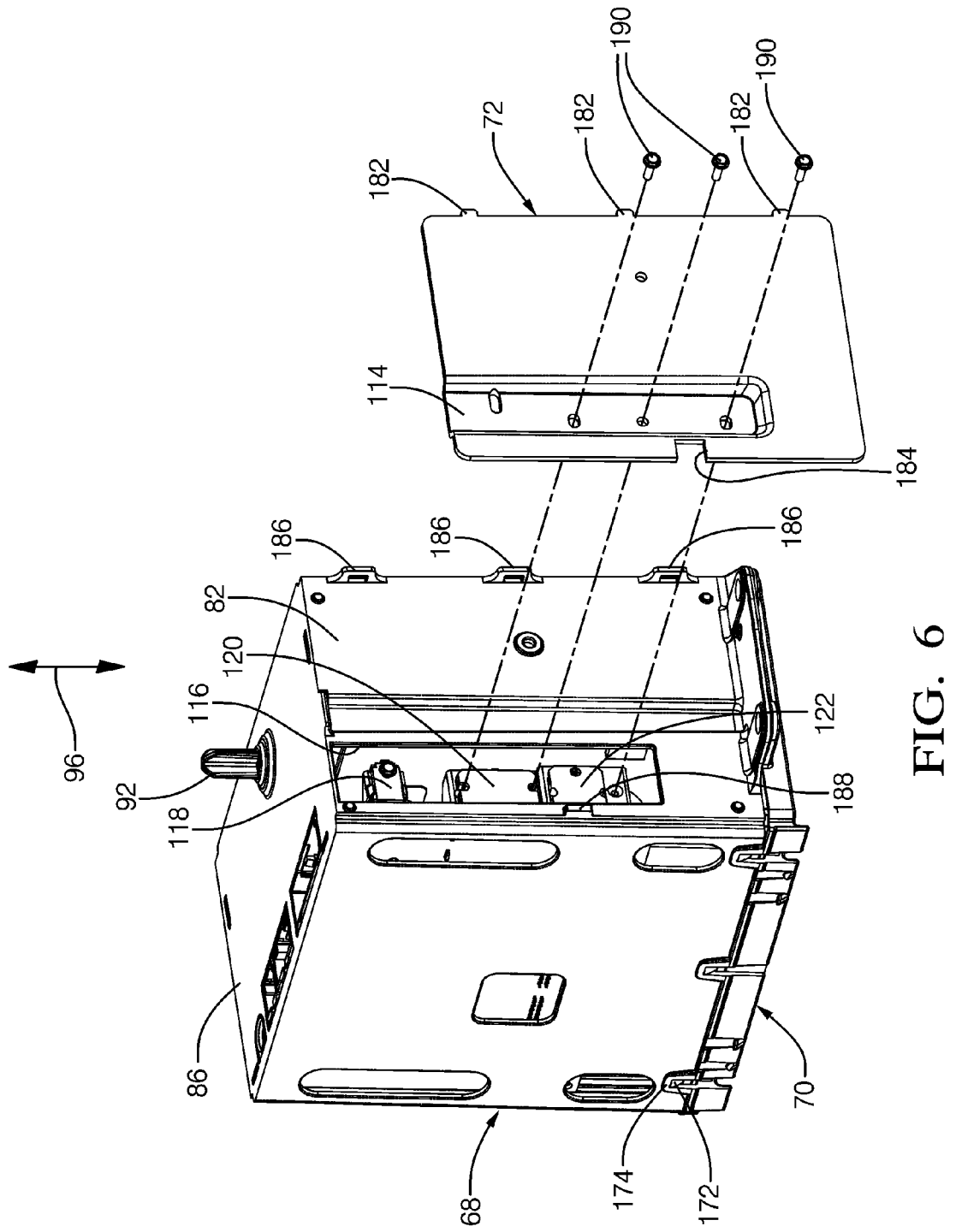
FIG. 6, is an exploded, perspective view of the radio/CD player of FIG. 2, illustrating final assembly step III in the production thereof wherein the power device retainer clip and heat sink are consecutively anchored, pivoted and snapped to the side of the case.
Figure 7:
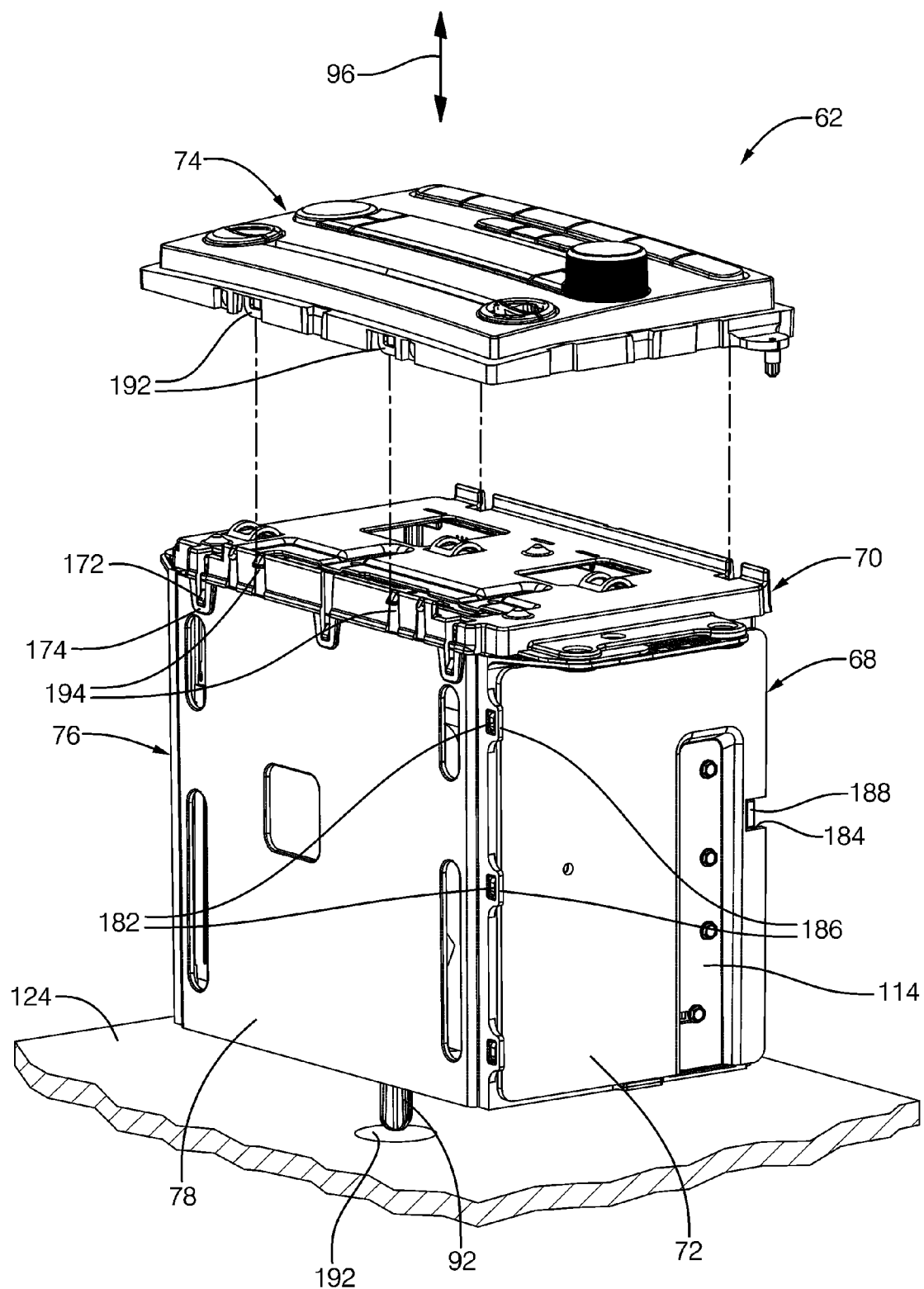
FIG. 7, is an exploded, perspective view of the radio/CD player of FIG. 2, illustrating final assembly step IV in the production thereof wherein the trim plate assembly is snapped to the faceplate/back-end assembly.
Figure 8:
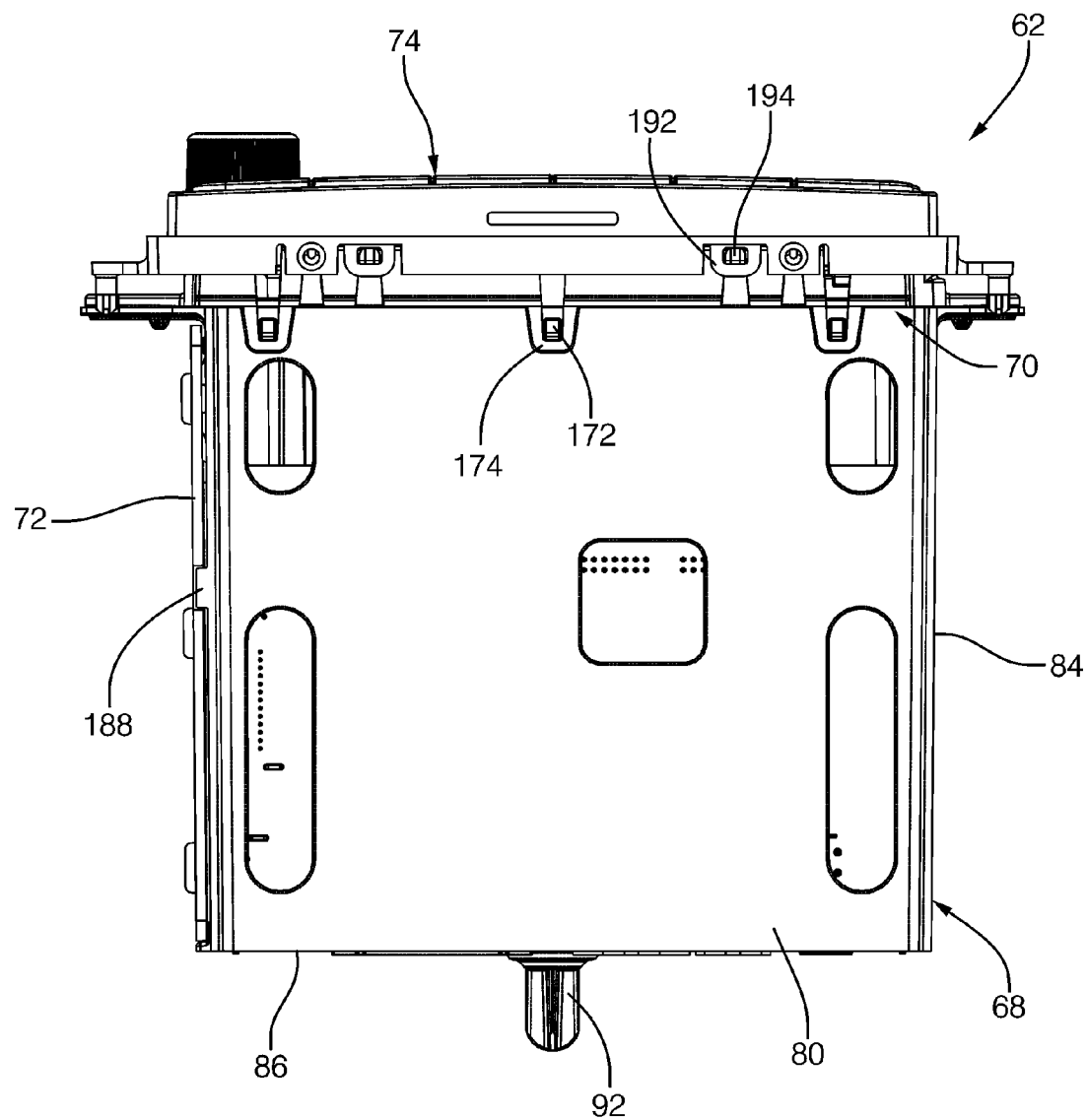
FIG. 8, is a bottom plan view of the radio/CD player of FIG. 2.
Figure 9:
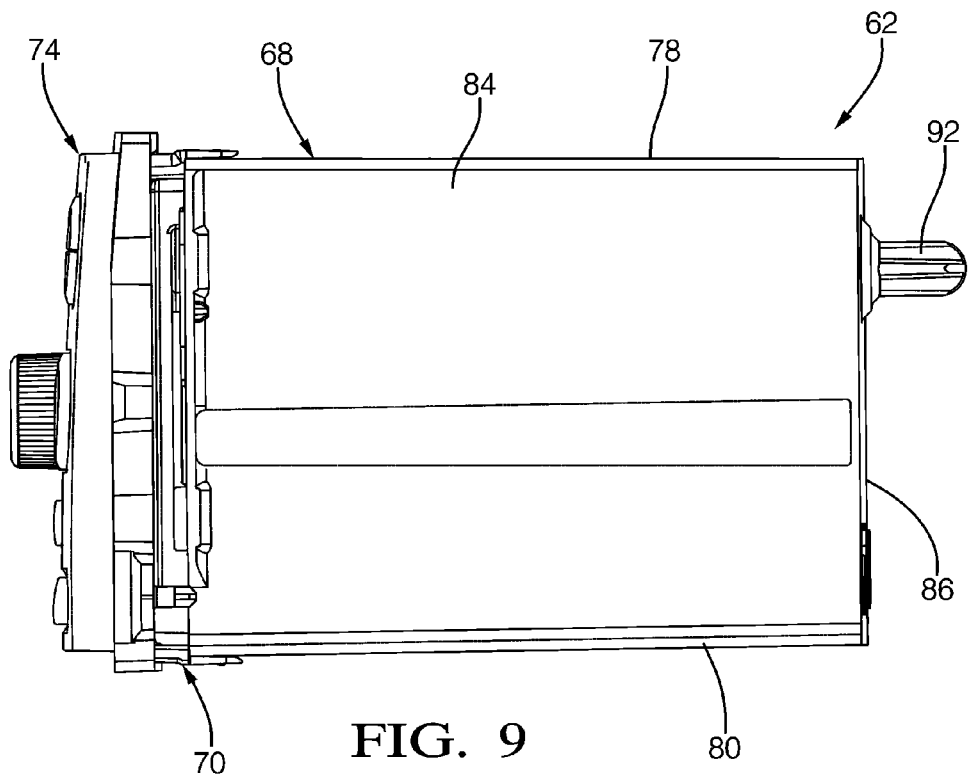
FIG. 9, is a left side plan view of the radio/CD player of FIG. 2.
Figure 10:
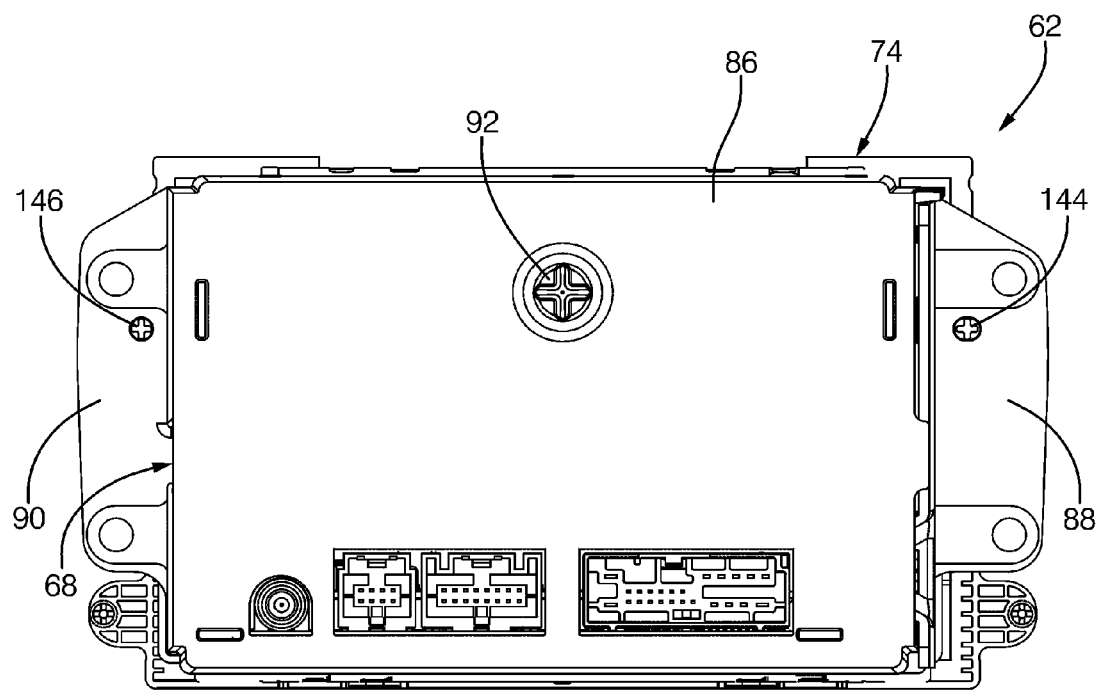
FIG. 10, is a rear plan view of the radio/CD player of FIG. 2.
Figure 13:
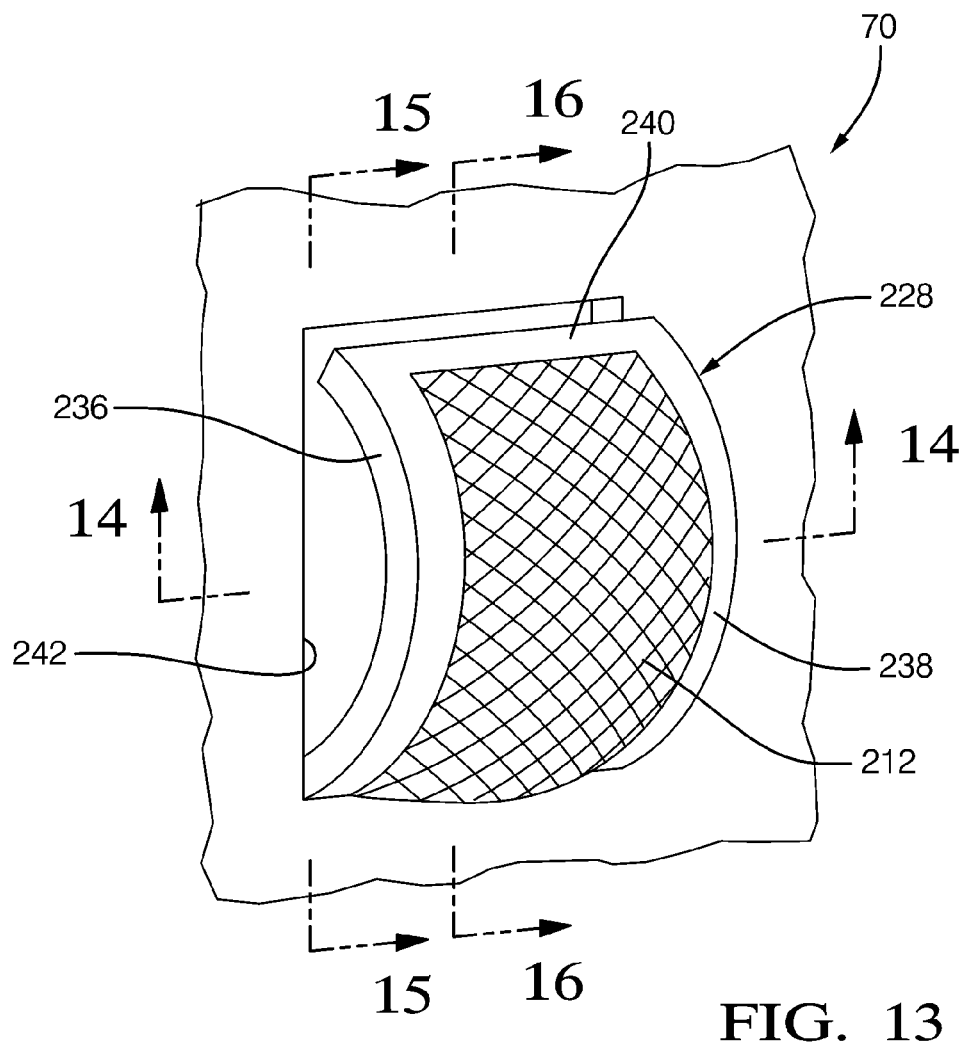
FIG. 13, is a fragmentary, perspective view of a keypad grounding clip integrally formed on the front side of the faceplate.
Figure 14:
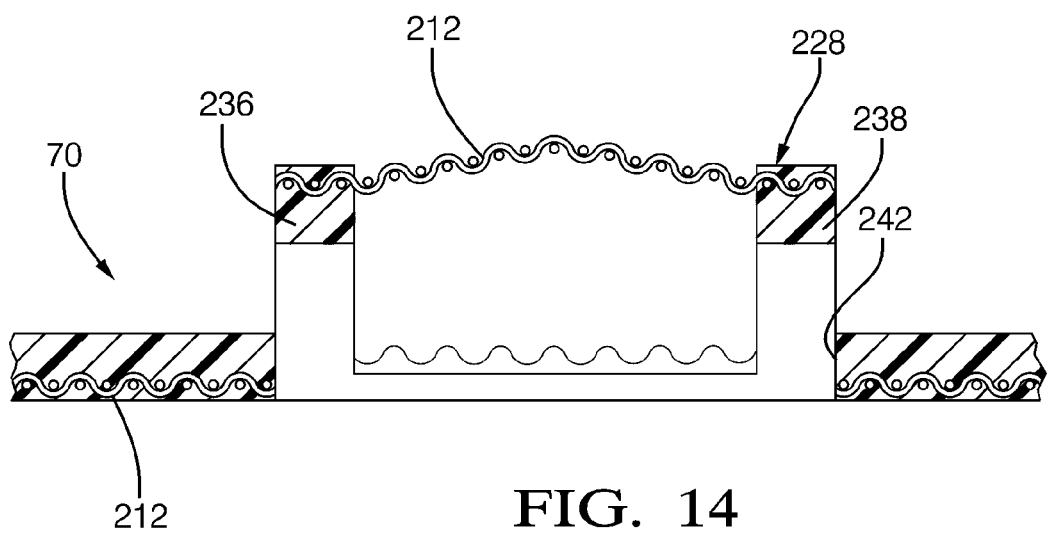
FIG. 14, is a cross-sectional view taken on lines 14-14 of FIG. 13.

As best viewed in FIGS. 2, 6 and 7, the heat sink 72 is next installed. The heat sink 72 includes several locating tabs 182 integrally formed along one edge thereof and a locator recess 184 formed in an opposed edge. The heat sink 72 is manually affixed to the outer surface of the case left side wall portion 82 which defines integral tab receiving extensions 186 along the upper edge thereof. Once the heat sink locating tabs 182 are inserted within their respective case wall portion extensions 186, the heat sink 72 is rotated into its design position illustrated in FIG. 7 wherein a resilient ramped catch member 188 integrally formed along the bottom edge of the left side wall portion 82 snap engages the recess 184 to fixedly interlock the heat sink 72 to the case 68.

When the heat sink 72 is in its installed position, the recessed portion 114 extends inwardly into the case 68 through the port 116. The inner surface of the recessed portion 114 establishing an abutting relationship against the power circuit components 118, 120 and 122 to provide a cooling thermal convector to the exterior of the case 68. Means are provided to ensure that components 118, 120 and 122 remain in intimate contact with the heat sink 72 such as screws 190, or, preferably to continuously resiliently urge the components into engagement with the recessed portion 114 of the heat sink 72.

It is contemplated that the heat sink 72 could be alternatively mounted to the case rear wall portion 86, whereby it would be installed along the assembly axis 96.

Referring to FIG. 7, the final step of assembling the major components and subassemblies is illustrated. First, the subassembly of the components illustrated in FIG. 6 is manually inverted, with the case rear wall portion 86 disposed on the designated work surface 124. Due to the localized outward projection of the stud 92, a stability enhancing spacer (not illustrated) or, alternatively, a recess 192 in the work surface 124 ensures a stable platform to complete assembly.

The trim plate subassembly 74 is then manipulated to become in register with the case 68 and manually displaced along the assembly axis 96 until the lower surface of the trim plate assembly 74 contacts the upper surface of the front plate 70 (as depicted in FIG. 7). Thereafter, cooperating ramped snap-action engagement features 192 and 194 integrally formed with upper and lower edge skirt surfaces of the case trim plate assembly 74 and the front plate 70, respectively, momentarily self-displace one another and snap back to self-engage to establish a positive interlock therebetween.

The completed assembly of the major components and subassemblies is depicted in FIGS. 2, 8-10 and 26. Following the assembly process, the completed radio/CD player 62 is placed in a queue for testing and quality checks.

As is best illustrated in FIG. 27, vertical and horizontal bosses 208 and 210, respectively, are located directly interiorly of the stud 92 to reinforce the rear wall portion 86 of the case 68 to prevent "oil-canning" and allows use of relatively thin wall section for enhanced weight saving.

Figure 28:
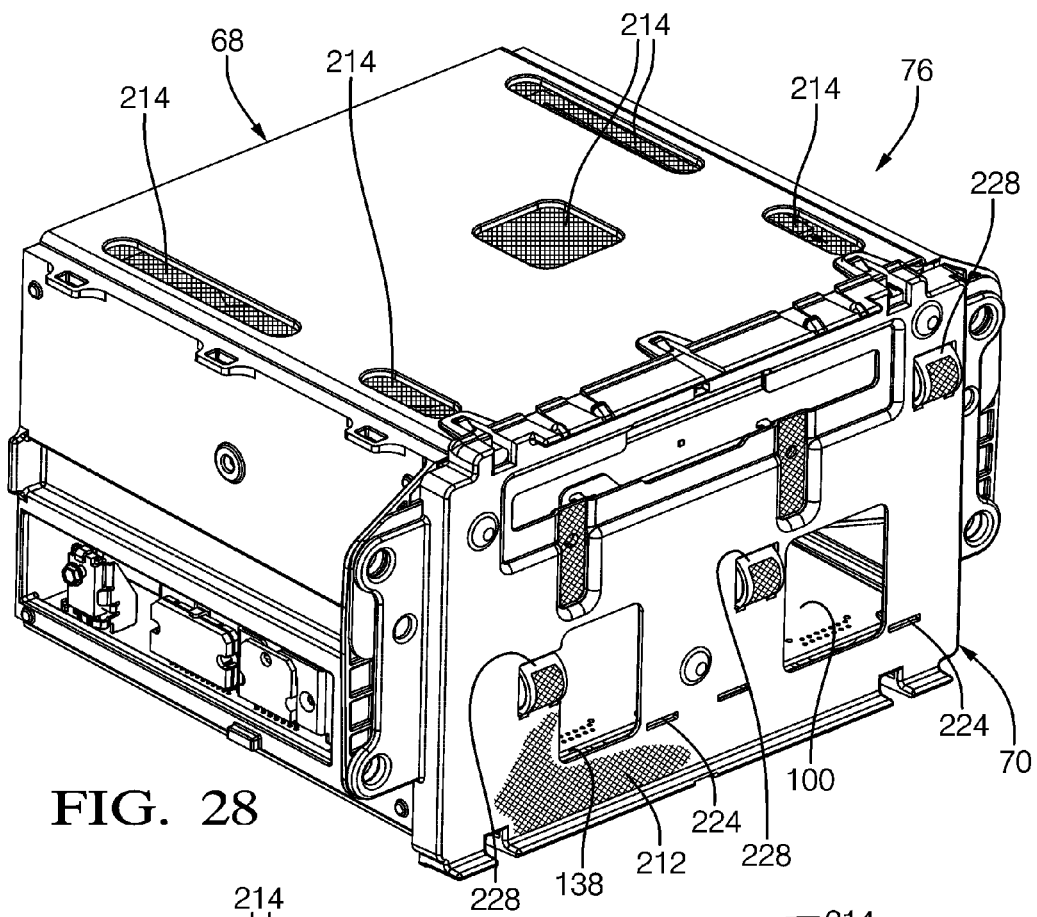
FIG. 28, is a front-above perspective view of a partially assembled radio/CD player, substantially similar to that illustrated in FIG. 7 (prior to installation of the trim plate assembly), illustrating, inter alia, (1) three outwardly directed spring contacts carried by resilient members integrally formed with the faceplate and (2) the juxtaposition of the wire mesh within the faceplate adjacent the outer surface thereof.
Figure 29:
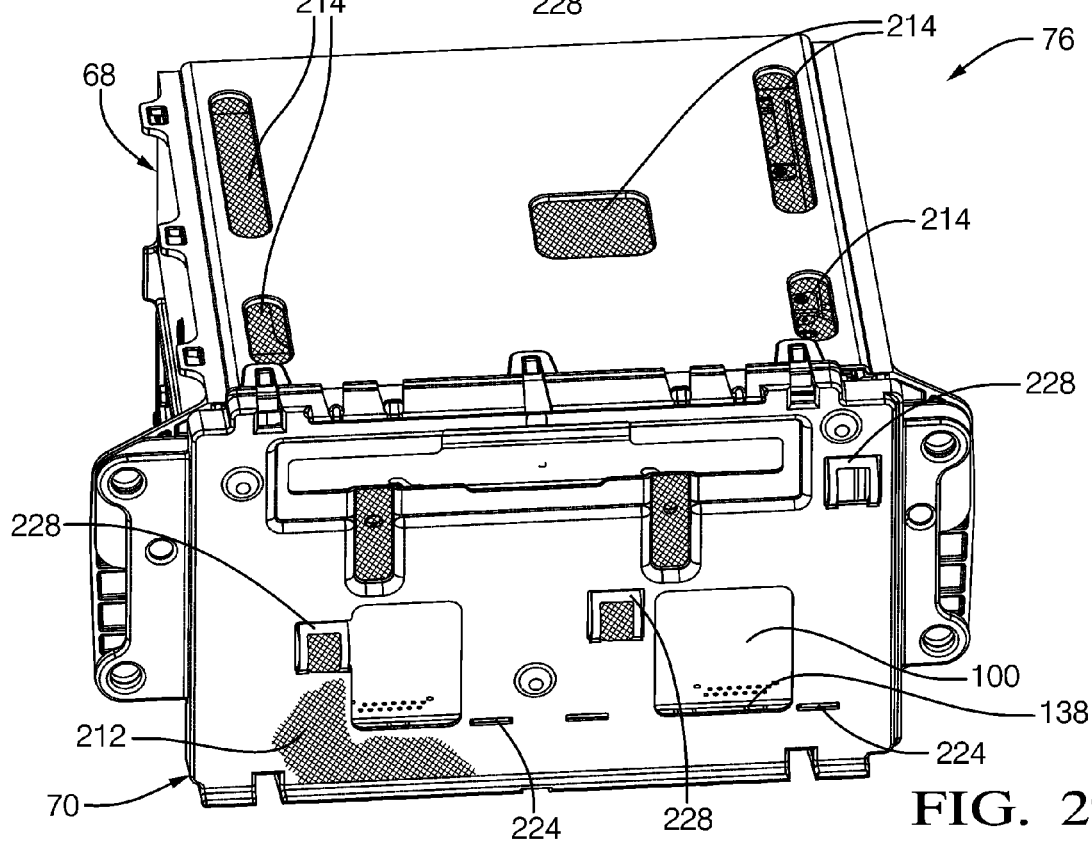
FIG. 29, is a front-left perspective view of the partially assembled radio/CD player of FIG. 28, illustrating the same features from a different perspective.
Figure 30:
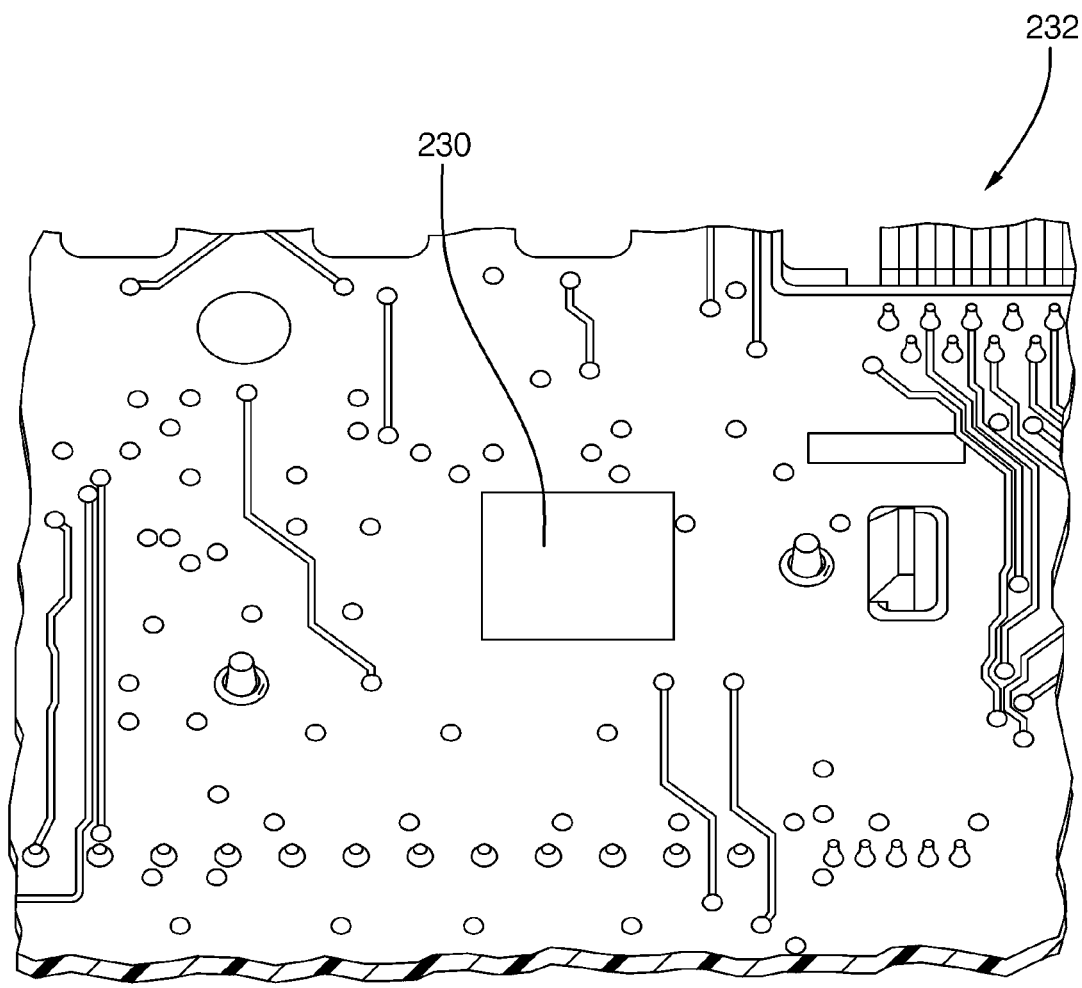
FIG. 30, is a fragmentary, perspective view of a keyboard assembly printed circuit board carried on the inside surface of the trim plate assembly illustrating one of three contact pads which, after assembly, register with and establish electrical interconnection with spring contacts illustrated in FIGS. 28 and 29.

FIGS. 27-29 illustrate an alternative construction of the case 68 and front plate 70 of the housing assembly 76 wherein both elements of the case assembly 76 are formed of a composite of relatively rigid polymer material and electrically conductive material operable to shield the audio components (such as the circuit board subassembly 64 and the CD player subassembly 66) from electrical anomalies including radio frequency interference (RFI), electromagnetic interference (EMI), bulk current injection (BCI) and electrostatic discharge (ESD). The electrically conductive material comprises substantially continuous planer sheet portions applied to surfaces of or within polymer housing assembly wall portions as discrete elements, electrically conductive paint, foil or electrostatic or vacuum deposition applied material. Alternatively, the electrically conductive material comprises a wire mesh screen 212 which has been cut and folded to net shape and inserted within a mold cavity whereby it is effectively insert molded within the polymer based material. Preferably, the wire screen 212 is centered within the wall portions of the case and front plate whereby electrically insulating polymer material effectively covers the wire screen 212, both inside and out, to prevent inadvertent grounding of the housing assembly to interior or exterior structures.

Through empirical testing and development, the inventors have found that it is preferable to locate the wire screen 212 near the inside surface of the case 68 and the outside surface of the front plate 70. Openings 214 are provided in the case 68 by locally eliminating the polymer material but leaving the wire screen intact, whereby judiciously positioned openings 214 provide natural convection cooling to the ambient without having a break or gap in the electrical anomaly protection provided by the wire screen 212.

Circuit Board Grounding to Wire Mesh System

The common circuit board and the unique circuit board are grounded to the molded in wire mesh by using a grounding clip that contacts the ground plane on the circuit board to the metal mesh by pressing the circuit board with the clip installed into a hole or recess in the plastic box that exposes the mesh. A point/ridge/protuberance is used on the clip to press into the mesh and increase the pressure for intimate contact. An alternative of this clip is one that gets surface mounted and soldered to the board and does not require manual assembly.

Referring to FIGS. 15 and 16, one form of grounding the ground plane 216 of the circuit board subassembly 64 to the wire screen 212 is illustrated. The leading edge surface 138 of the unique PCB 100 carries two beryllium copper grounding clips 218, which are electrically and mechanically connected to the PCB ground plane 216. Similarly, a trailing edge surface 222 of the common PCB 98 carries two grounding clips 218. Each grounding clip 218 includes a resilient contact arm 220 extending outwardly along the assembly axis 96. Upon assembly, the grounding clips 218 carried on the leading edge surface 138 of PCB 100 register with exposed wire screen 212 within windows 224 in front plate 70 (refer FIGS. 94 and 95), and the grounding clips 218 carried on the trailing edge surface 222 of PCB 98 register with exposed wire screen 212 within windows 226 in the rear wall portion 86 of the case 68. The contact are 220 of each grounding clip 218 is configured to continuously bear against the adjacent exposed wire screen 212 to maintain electrical contact therewith.

Referring to FIGS. 32-38, alternative forms of grounding the ground plane 216 of the circuit board subassembly 64 to the wire screen are illustrated. FIG. 133 illustrates a radio/CD player 622 similar in all material respects to the radio/CD player 62 described hereinabove in connection with FIGS. 2-10 and 15-20 inter alia, with the exceptions described immediately hereinbelow. In essence, in this embodiment, the four ground clips 218 contained on the circuit board subassembly 64 are deleted and replaced by connectors integrally formed with the housing assembly 76.

Figure 32:
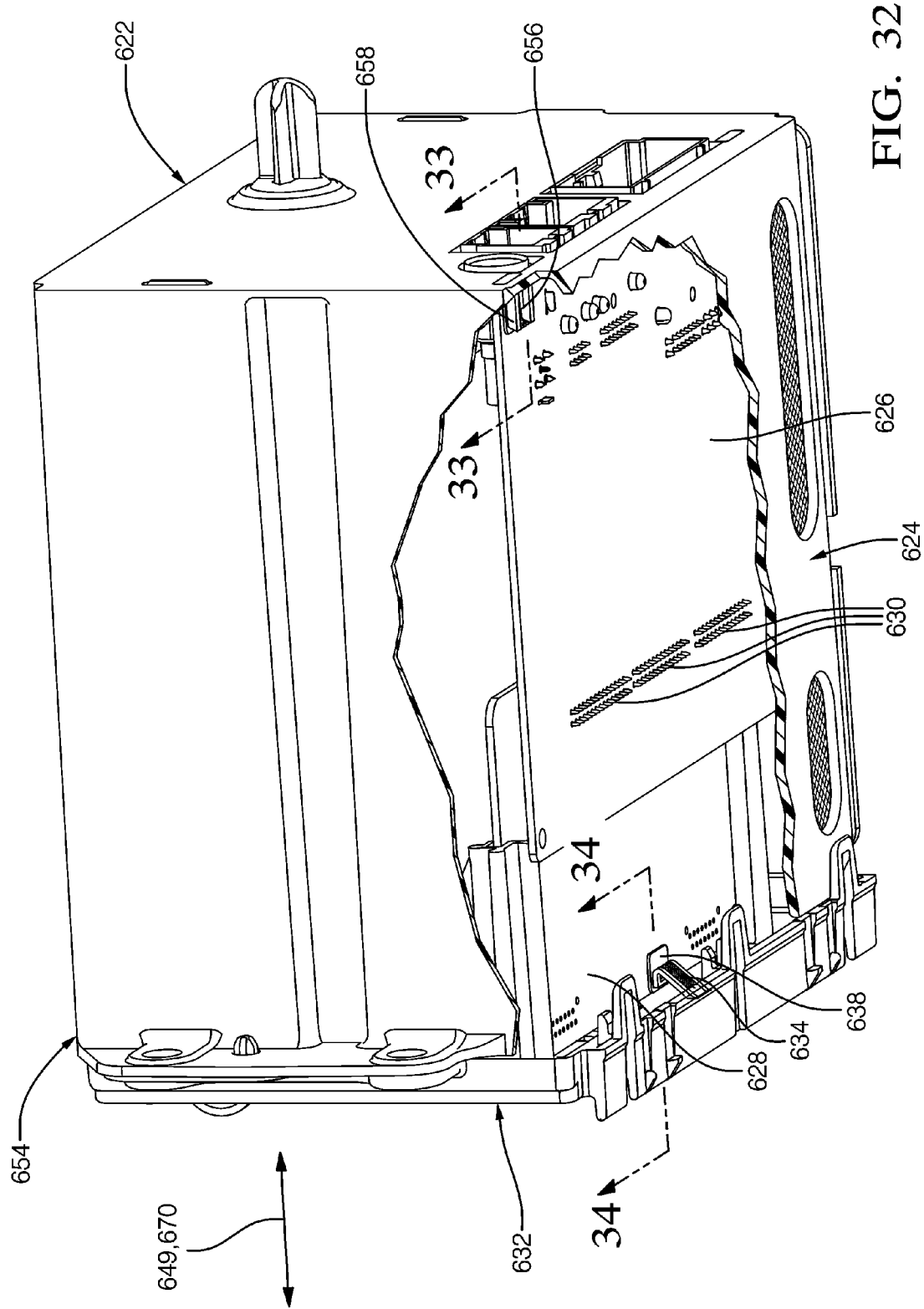
FIG. 32, is a broken, bottom-rear perspective view of an audio system assembly embodying an alternative embodiment of the present invention illustrating internal PCB front and rear edge self-grounding with integral features of the audio system housing assembly.
Figure 34:
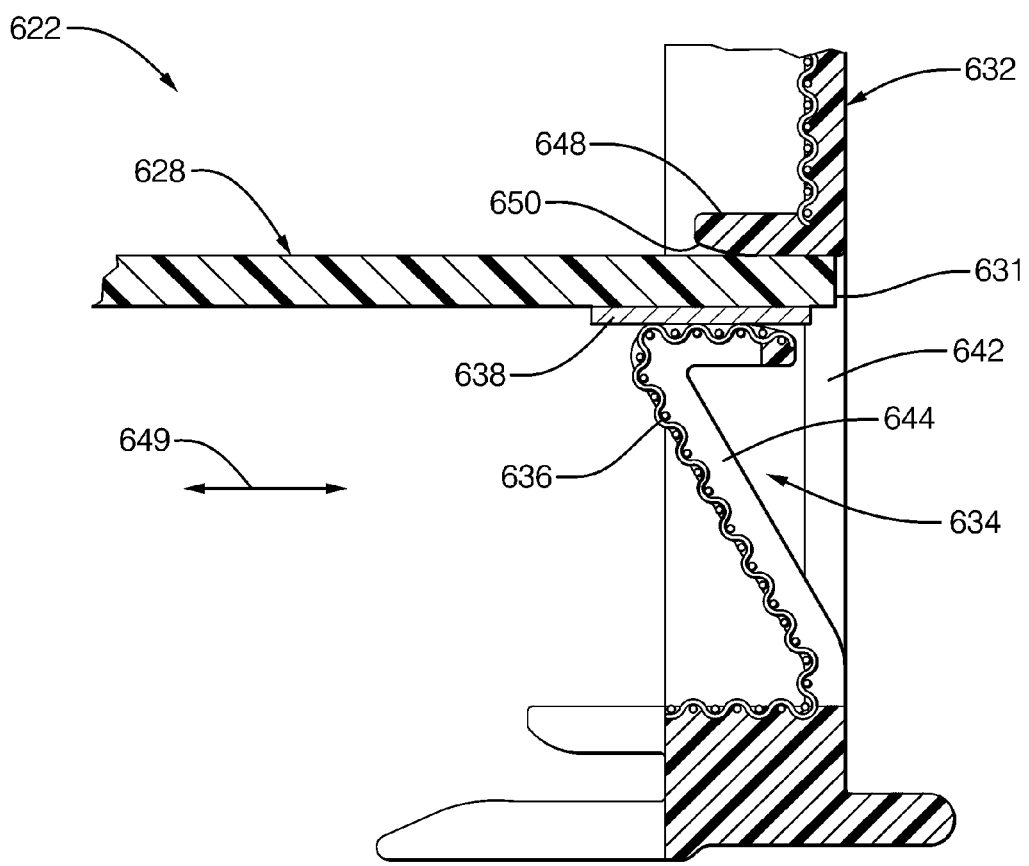
FIG. 34, is a broken, cross-sectional view, on an enlarged scale, of the front edge of the PCB of FIG. 32 self-engaging and self grounding with exposed electrically conductive shield and guide tangs integrally formed with the audio system housing assembly.
Figure 36:
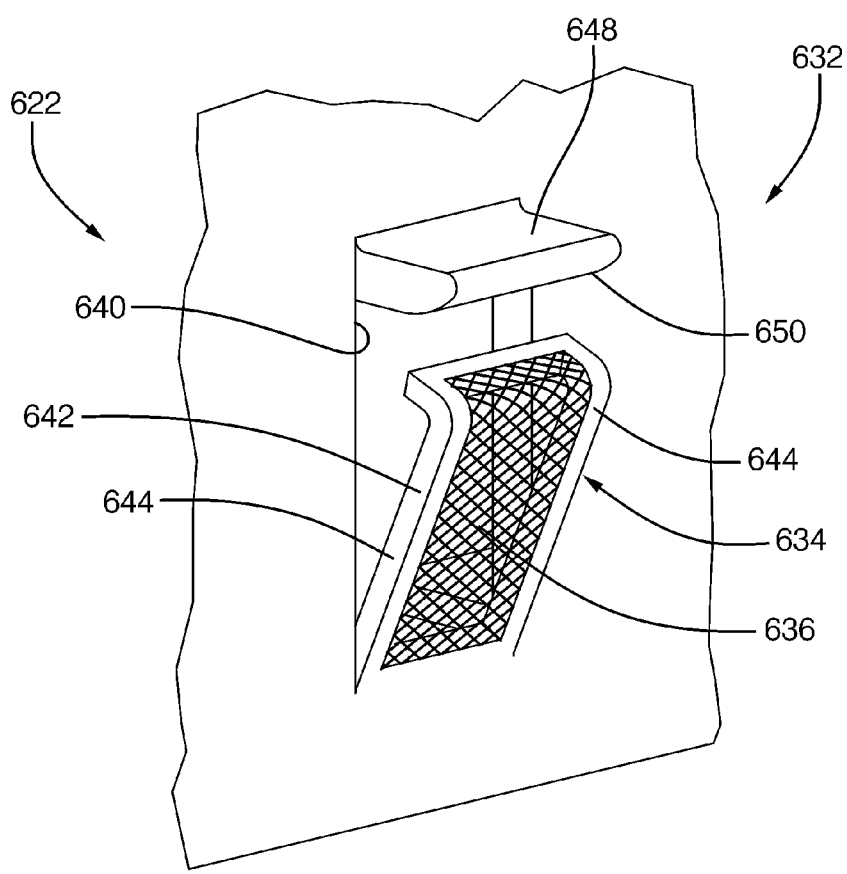
FIG. 36, is a broken, forward facing perspective view of the exposed electrically conductive shield and guide tangs of FIG. 34, with the PCB removed.

Referring to FIGS. 32, 34 and 36, a circuit board subassembly 624 includes a common PCB 626 interconnected with a unique PCB 628 by pin connectors 630. A leading edge 631 of the unique PCB 628, when installed within a front plate 632, engages two Z-clips 634 integrally formed within the front plate 632, whereby wire screen 636 exposed in the Z-clip 634 engages a contact pad/plane 638 carried on the unique PCB 628 adjacent its leading edge 631. A trailing edge 652 of the common PCB 626, when installed in a housing case 654, engages two grounding clips 658 integrally formed within the case 654, whereby wire screen 636 exposed in the grounding clip 656 engages a contact pad/plane 658 carried on the common PCB 626 adjacent its trailing edge 652.

As best viewed in FIGS. 34 and 36, the Z-clip 634 includes a frame 640 integrally formed adjacent one side of an associated opening 642 and extending inwardly (within an associated housing case 643) therefrom as a resilient cantilever. The frame 640 includes two parallel "L" or "J" shaped leg portions 644 interconnected by a cross support portion 646. A flap of wire screen 636 is die-cut prior to being injection molded within the front plate 632. During the injection molding process, the edges of the wire screen flap are insert molded within the leg portions 644, the cross-support portion 646 and the adjacent front panel of the front plate 632, thereby exposing the wire screen flap 636 for electrical connection with the unique PCB contact pad 638. An inwardly directed boss 648 is integrally formed on the front plate 632 adjacent an edge of the opening 642 opposite from the leg portions 644, and extends substantially parallel to an assembly axis 649. The boss 648 forms a guide/abutment surface 650 which is spaced from the exposed wire screen flap 636 by a dimension slightly less than the thickness of the unique PCB 628 to ensure a tight compressive fit when the leading edge 631 of the unique PCB 628 is inserted therebetween. The natural resiliency of the polymer material forming the Z-clip frame 640 ensures continued continuity of the electrical connection between the exposed wire screen 636 of the Z-clip and the unique PCB contact pad 638.

Figure 33:
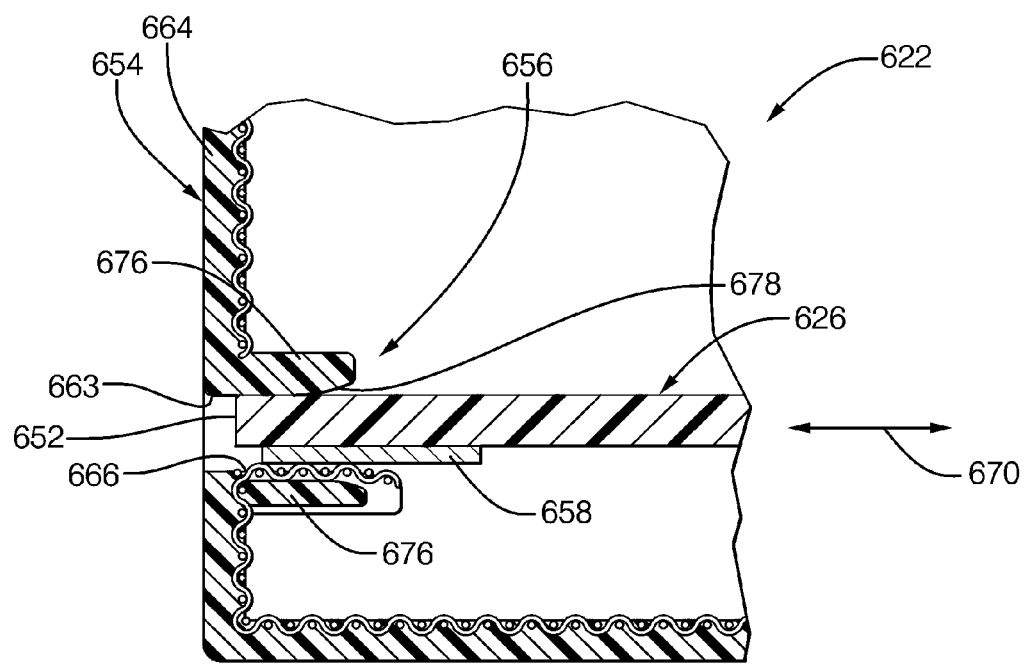
FIG. 33, is a broken, cross-sectional view, on an enlarged scale, of the rear edge of the PCB of FIG. 32 self-engaging and self-grounding with exposed electrically conductive shield and guide tangs integrally formed with the audio system housing assembly.
Figure 35:
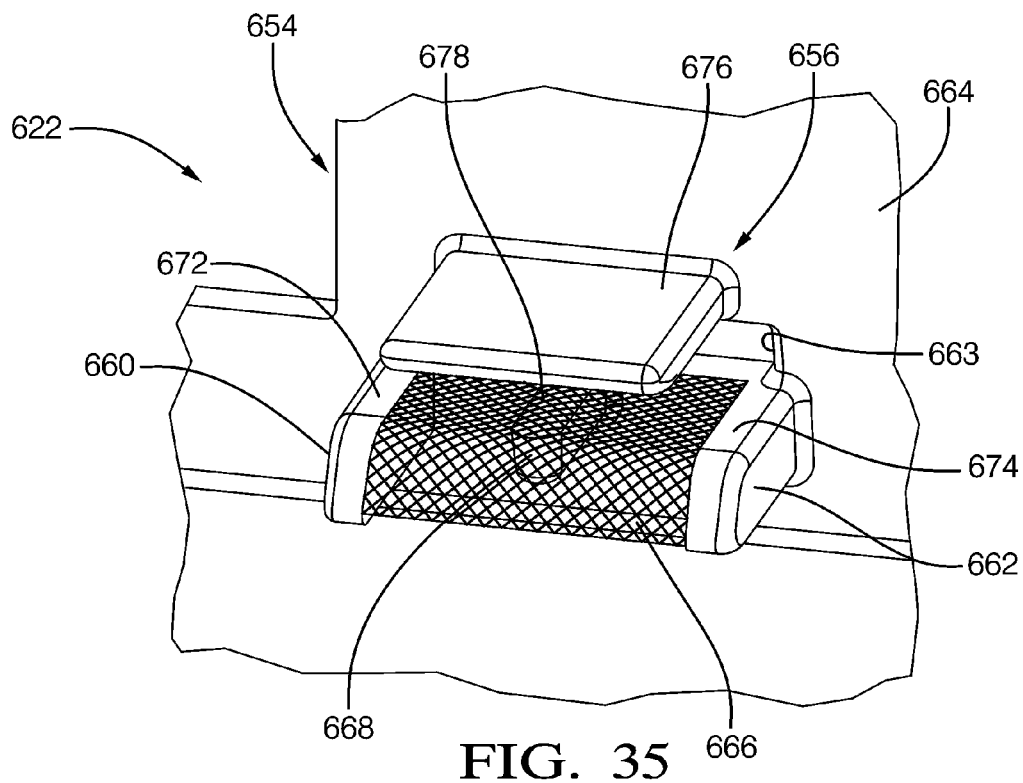
FIG. 35, is a broken, rear facing perspective view of the exposed electrically conductive shield and guide tangs of FIG. 33, with the PCB removed.

As best viewed in FIGS. 33 and 35, the grounding clip 656 includes a cooperating pair of laterally spaced support members 660 and 662 integrally formed in a rear wall portion 664 of the case 654 adjacent the bottom edge of an associated opening 663 and extending inwardly therefrom. A flap of wire screen 666 is die-cut prior to being injection molded within the case 654. During the injection molding process, the lateral edges of the wire screen flap 666 are insert molded within the support members 660 and 662 and the adjacent portion of the case rear wall portion 664, thereby exposing the wire screen flap 666 for electrical connection to the common PCB 626 contact pad 658. A wire screen positioning finger 668 is integrally formed in the rear wall portion 664 of the case 654 laterally intermediate the support members 660 and 662, and extends inwardly from the rear wall portion 664 substantially parallel to an insertion axis 670 as a resilient cantilever. The positioning finger 668 is vertically positioned with respect to the support members 660 and 662 to continuously contact the lower surface of the wire screen flap 666 to ensure that the lateral center portion of the wire screen flap 666 is bowed slightly upwardly and resiliently maintained at least slightly above the upper surface portions 672 and 674 of the support members 660 and 662, respectively. An inwardly directed boss 676 is integrally formed on the rear wall portion 664 of the case 654 adjacent the top edge of the opening 663 opposite from and laterally centered with the support members 660 and 662. The boss 676 forms a guide/abutment surface 678 which is spaced from the exposed wire screen flap 666 by a dimension slightly less than the thickness of the common PCB 636 to ensure a tight compressive fit then the trailing edge 652 of the common PCB 636 is inserted therebetween. The natural resiliency of the polymer material forming the ground clip 656 structural elements ensures continued continuity of the electrical connection between the exposed wire screen 666 of the ground clip 656 and the common PCB contact pad 658.

Figure 37:
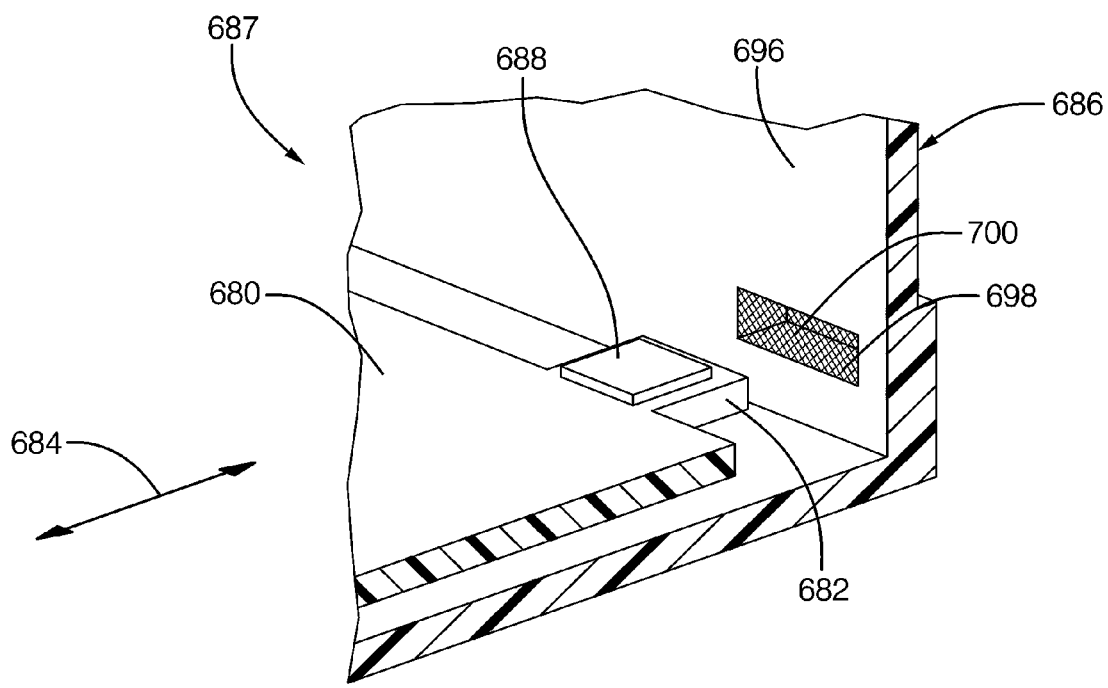
FIG. 37, is a broken, perspective, cross-sectional view of an alternative approach to self-grounding a PCB, wherein a rearwardly directed extension of the PCB containing grounding pads on the top or bottom (or both) surfaces thereof registers with an opening formed in the rear wall of the case exposing electrically conductive screen.
Figure 38:
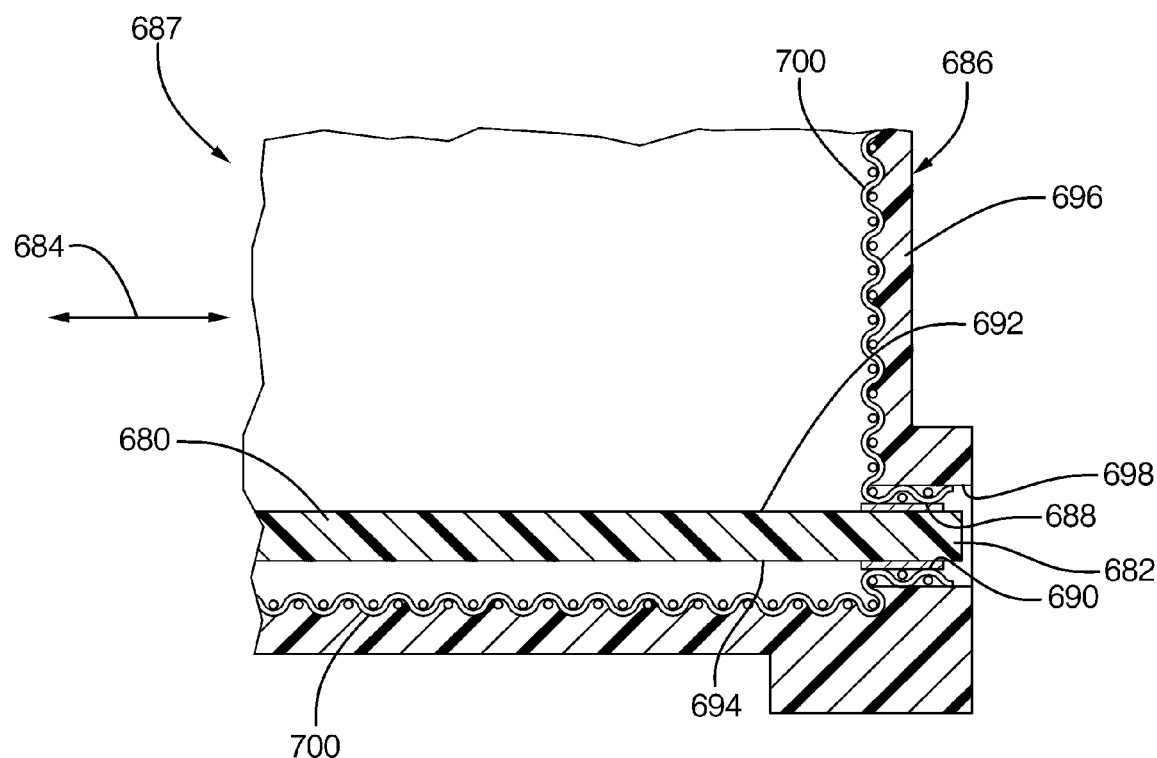
FIG. 38, is a broken, cross-sectional view of the alternative embodiment of FIG. 37, with the PCB is in its installed design position wherein the extension has pierced the exposed screen and established electrical connection between the grounding pads and the screen.
Figure 39:
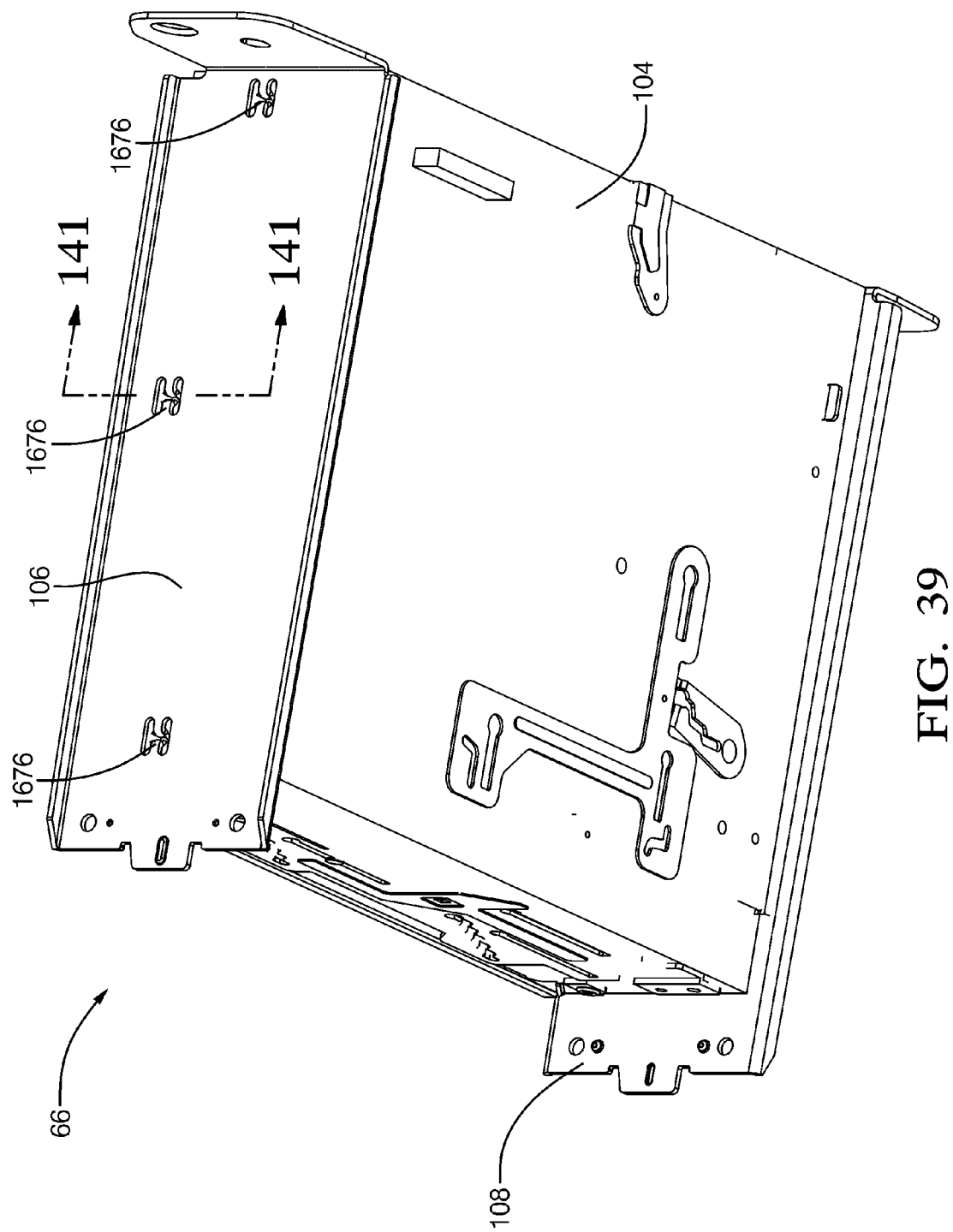
FIG. 39, is a bottom-rear perspective view of a CD player subassembly affixed to opposed left and right mounting brackets via integral squirts.
Figure 43:
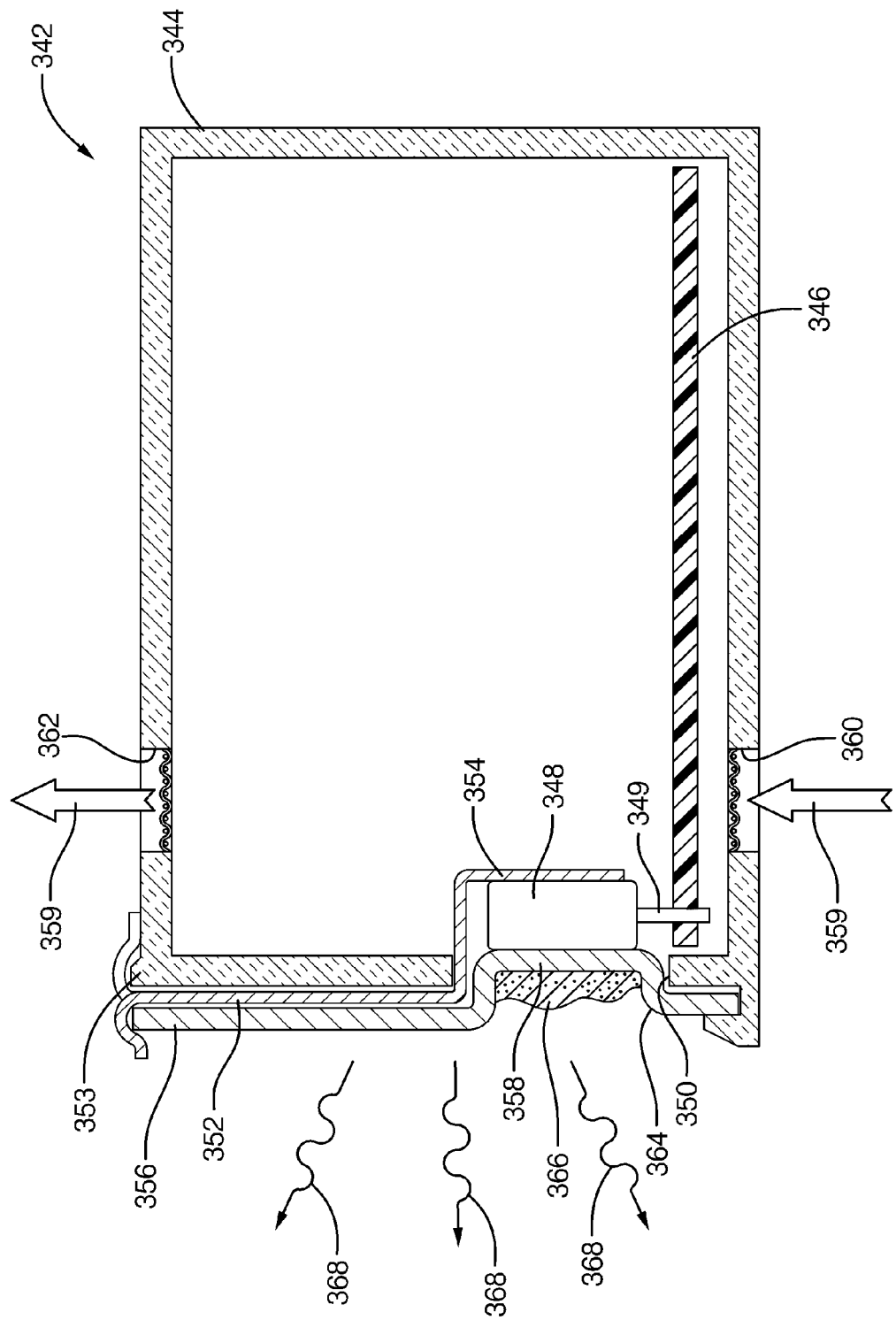
FIG. 43, is a cross-sectional schematic view of a simplified inventive thermal control apparatus.

Referring to FIGS. 37 and 38, another example of self-grounding is illustrated wherein a PCB 680 includes an extension 682 projecting forwardly therefrom in line with an assembly axis 684 of a housing case 686 for an audio system 687. Contact pads 688 and 690 are carried on upper and lower surfaces 692 and 694 of the PCB extension 682. A rear wall portion 696 of the case 686 forms a window 698 exposing a portion of wire screen 700 which is aligned with the PCB extension 682. When the wire screen 700 is insert molded within the polymeric material forming the case 686, the portion thereof coinciding with the window 698 is left intact. During the assembly process of the audio system 687, wherein the PCB is installed by insertion along guideways (not illustrated) within the case 686, the PCB is inserted with sufficient force to locally rupture and penetrate the exposed wire screen 700 within the window 688. Following the rupture of the wire screen 700, the residual separation edges thereof are drawn into the window 698 by friction caused by motion of the upper and lower PCB surfaces 692 and 694, respectively. When the PCB 680 assumes its installed position, as illustrated in FIG. 139, the rended portions of the wire screen 700 are compressively fit between the contact pads 688 and 690 and the adjacent edges of the window 698, ensuring continued continuity of the electrical connection between the exposed wire screen 700 and the PCB contact pads 688 and 690. It is contemplated that a single (one side of the PCB) contact pad can also be employed. However, the redundancy afforded by the dual contact pads 688 and 690 is preferable.

A modification of the self-grounding system described in connection with FIGS. 138 and 139 can enhance assembly of an audio system 702 for simplified and improved unit-to-unit repeatability. A housing case 704 includes a wall portion 706 forming a window 708 exposing a wire screen 710 to establish a point of electrical connection to an audio component within the case 704. After the wire screen 710 is insert molded within the polymer material forming the case 704, but before the assembly if the audio system 702, a tool, such as a cooperating punch 712 and die 714 is pressed simultaneously against the inner and outer surfaces of the exposed screen 710 within the window 708 to form perforations or weakenings, indicated by dotted lines 716. This process step is indicated by arrows 718. The perforations 716 make the exposed wire screen 710 more predictably frangible for improved unit-to-unit quality. Thereafter, during final assembly of the audio system 702, the wire screen 710 separates along the perforations 716 when contacted by the leading edge of a PCB extension 682 (refer FIGS. 37 and 38).

An alternative self grounding approach involves modifying a leading surface 720 of an extension 722 of a PCB 724 to form a sharpened, laterally extending leading edge 726. The leading edge 726 can be formed by the PCB material itself or, preferably, by hardened material, such as a metal appliqué or band formed in a "U" or a "V" configuration engaging the PCB 724 by upper and lower members 728 and 730 affixed to the upper and lower surfaces 732 and 734 of the PCB extension 722 such as by soldering. The upper and lower members 730 and 732 can serve as electrical ground pads. Upon installation of the PCB 724, the sharp leading edge 726 first contacts and cleaves the exposed wire screen 710 into the form illustrated in FIG. 139.

In addition to the forgoing, punch dies 712/714 such as those depicted in FIG. 156 can be employed in modified form to actually sever and/or remove a portion (or all) of the wire screen 710 after the molding of the housing case 704, but before the final assembly of the audio system 702. Furthermore, one or more service access windows can be provided elsewhere in the walls of the housing case 704. The service windows are closed at the time of manufacture by exposed screen including perforations, as depicted in FIG. 155. The exposed screen could be severed by a tool or process later in the service life of the audio system 702 to service or modify the system.

Front Plate Esd Grounding to Keyboard Through Wire Mesh

The method of grounding the plastic front plate (with molded in metal mesh) to the keyboard is by using plastic spring clip that contains an open window to expose the mesh where the spring clip comes into contact with a tinned pad on the keyboard. This provides an ESD path to ground when inserting a static charged CD into the CD changer.

Referring to FIGS. 13-17 and 28-30, several spring clip structures 228 are integrally formed in the front plate 70 which, in assembly, continuously resiliently bear locally exposed segments of the wire screen 212 against a tinned grounding pad 230 (only one is illustrated) on a keypad PCB 232 to establish a ground path therebetween.

Each spring clip structure 228 has a frame 234 including two parallel arc shaped portions 236 and 238 and a cross-support portion 240 integrally formed with front plate 70 and extending therefrom as a resilient cantilever. An opening 242 in the front plate registers with each spring clip 228 to permit flexure thereof.

Prior to molding of the wire screen 212 within the front plate 70 the screen preform is die-cut to form an integral flap which is captured within the mold and the edges thereof encased within arc-shaped portions 236 and 238 and cross-support portion 240. The central portion of the exposed wire screen is expanded or stretched to form an outward bow shape (refer FIGS. 18 and 20) to ensure that the resulting exposed screen protuberance firmly contacts the PCB grounding pad 230.

Referring to FIG. 17, a prior approach is illustrated wherein separate spring grounding clips 244 are each mechanically affixed to the front plate 246 of a radio/CD player assembly 248 by a rivet 250 or other suitable fastener. The rivets are required to establish an electrical ground path as well as to mechanically secure the spring clips 244 to the front plate 246, adding labor, cost and complexity to the manufacturing process.

Front Plate with Integral Assembly Fixturing

Using a plastic front plate enables assembly fixturing for the CD mechanism and circuit boards for slide lock and snap lock assembly instead of the screws used in a traditional receiver.

Referring to FIGS. 4 and 5, guideways in the form of slotted extensions 126 and 128, as well as locator/retention features 144 and 146 integrally formed on the reverse (inside) surface of the front plate 70 provides a number of significant advantages in the manufacture and final assembly of the radio/CD player 62 by reducing product part count, assembly time, and substantially eliminates dedicated hard fixturing and tools to affect assembly.

Thermal Management System for Vehicular Radio Application

The thermal devices are placed in a window in the plastic box_and are attached to the heat sink, which is attached to the inside of the box. This puts a plastic wall (a good insulator) between the heat sink and the CD mechanism to minimize the temperature that a CD reaches inside the box metal case. The thermal efficiency of this system eliminates the need for a cooling/ventilation fan.

Referring to FIG. 159, another simplified alternative embodiment of a fastenerless thermal control system for an audio device 342 is illustrated. The audio device 342 comprises a case 344 formed of thermally insulating material. A PCB 346 is disposed within the case 344 which has a power circuit component 348 cantilever affixed thereto via its lead frame 349 positioned adjacent a thermal port 350. A retainer/backing clip 352 is snap-engaged with a feature 353 on the exterior of the case 344 and includes a resilient integral support member 354 extending through the port 350 and continuously resiliently urging the power circuit component 350 toward the port 350. A heat sink 356 snap-engages with features on the case 344 and backing clip 352 to retain it in its illustrated position wherein the power circuit component 348 is maintained in intimate contact with the inner surface of a recessed portion 358 of the heat sink 356 extending through the port 350.

Convection air flow (arrows 359) can be provided by providing inlet and outlet windows 360 and 262 in the case 344. A pocket 364 formed on the outer surface of the heat sink 356 as part of the recessed portion 358 can be filled with a thermally conductive material 366 to increase the effective thermal mass of the heat sink 356 and to improve radiant thermal rejection as indicated by arrows 368.

Low Cost Structural Support for Cd Changer For Vehicular Radio Application

Using a plastic box for the receiver enables low cost location and support for the CD mechanism and enables for slide lock assembly instead of the screws used in a traditional receiver. The brackets on the CD mechanism have a 1° taper that matches a 1° taper on the support shelf in the plastic box. This makes it easy for an operator to start the slide, but all of the clearances go to zero as the box snaps into place providing a strong rattle free assembly without the use of the traditional screws.

Wire Mesh for Structural Component

Molding in metal mesh into the plastic receiver case and front_plate increases the strength of the material (much like putting re-bar into_concrete) while still weighing less than a steel case. The gauge of the wire forming the mesh can be increased and the amount of plastic material can be substantially reduced, resulting in a very thin wall, robust structure.

As an alternative, the plastic can be eliminated from the center portions of some or all of the individual side, front, back, top and/or bottom panel portions of the case and front plate. This configuration would have the appearance of a screen box, with a molded plastic peripheral frame circumscribing each panel portion.

A lightweight automotive audio system 471 can include a housing case 472 constructed of a composite of polymer based material with a wire screen 474 insert molded therein to isolate audio components therein from various electrical anomalies. To further reduce overall weight, the gauge of the wire screen can be increased whereby the screen contributes a significant component of the resulting overall structural strength of the case, while the nominal section or thickness of the polymer material can be substantially reduced. By way of example, the case 472 top and bottom wall portions 476 and 478, respectively, and left and right side wall portions 480 and 482, respectively, injection molded into a single unified structure, with the enlarged gauge wire screen 474 insert molded adjacent the inner surfaces thereof. Edges and corners of the case 472 formed at the intersection of two or three adjacent wall portions can be locally thickened to increase structural rigidity of the case 472 as well as to provide internal and external mounting and interface ports. The intersecting edges of the top wall portion 476 and the left and right side wall portions 480 and 482, respectively, form thickened left and right upper edge frames 484 and 486, respectively. Likewise, the intersecting edges of the bottom wall portion 478 and the left and right side wall portions 480 and 482, respectively, form thickened left and right lower edge frames. Lower edge frames 488 and 490 are locally vertically extended openings 492 and 494 for exposing the wire screen 474 to establish electrical contact with contact clips 496 and 498 carried by PCBs 500 and 502, respectively, interconnected by pin connectors 504 within the case 472.

Slide-Lock Snap-Lock Screwless Assembly Method

Using plastic for a receiver case enables low cost assembly of the components. The circuit boards and the CD mechanism can slide into place and then be locked or they can be snapped into place without screws. This reduces the number of parts required in the assembly and reduces the amount of direct and indirect labor to put a receiver together. The plastic case can be easily molded into a net shape forming the slides and snaps needed for assembly.

Referring to FIGS. 2-10, the apparatus and assembly method described substantially reduces the labor and component cost of the radio/CD player 62, as well as the required capital costs. Furthermore, it substantially enhances product quality by substantially eliminating the possibility of extraneous or missing (small) parts and/or improper assembly.

EMC, RFI, BCI, ESD Wire Mesh Protection System

Using the molded in metal mesh in the receiver plastic box that is grounded to the circuit boards creates a Faraday cage that provides shielding protection for RFI (Radio Frequency Interference), EMI (Electro Magnetic Interference), BCI (Bulk Current Injection), and ESD (Electrostatic Discharge).

Refer to FIG. 12 and their associated descriptions

Partitioned Main Board into Common and Unique

Using the principle of communization and modularity, the receiver main board has been divided into a common board and a unique board. This is counterintuitive because a single board is less expensive than two boards performing the same function. However, the common board contains all surface mount components (no stick lead or wave solder) and very large volumes can be produced without reconfiguring the assembly/production line. This will substantially reduce the manufacturing cost of this portion of the main board.

Referring to FIG. 11, automotive audio systems are unique in that they are typically designed in modular form and, in response to the requirements of individual customers, are produced by assembling individual units from varied combinations and permutations of modularized subcomponents. This, however, can be contrary to the manufacturing doctrine of large enterprises wherein large volume production of common designs is preferred for its inherent efficiencies. In the practice of the present invention, the individual electrical components to be assembled on the circuit board subassembly 64 are segregated into those which will be employed in each specie and sub-specie in a given product family. The commonly employed circuit elements (typically surface mount devices) are assembled on the "common" PCB 98. The application specific circuit elements (typically "stick" mount devices) are assembled on the "unique" PCB 100. The common PCB 98 is assembled employing highly automated manufacturing techniques for maximum efficiency, while the unique PCB 100 are assembled employing a different mix of labor and automation to maximize overall efficiency. Standard connector assemblies 736, 738 and 740 are provided on the common PCB 98 for interfacing the radio/CD player 62 with speakers, ground, power and associated control/readout systems via wire harnesses. A standard coaxial cable connector 742 is also provided on the common PCB 98 for interfacing with a vehicle antenna system.

An audio product manual entitled "2004 Model Year Ford Freestar Radios" (Document Number 04-RDPD-12-MA-F), dated 7 Oct. 2005, describes in detail the circuit architecture of a family of modern automotive audio systems developed and produced by the assignee of this application. In addition, the manual enumerates the individual electrical components employed and their arrangement in various audio subsystems. In the practice of the present invention, the listed individual electrical components would be segregated into the common PCB 98 and unique PCB 100 in keeping with the teachings herein. Accordingly, the above referenced audio product manual is incorporated herein by reference for the sake of completeness and to serve as a resource in understanding and practicing the present invention.

Guillotine Heat Sink

The guillotine heat sink uses a flat aluminum plate as a heat sink. It slides down a slot on each side of the plastic box until it comes to rest on the quad bridge amplifier (QBA) IC and the power supply IC. Each IC will have a silpad on top to provide compliance and facilitate heat transfer. A downward force will be applied to the heat sink through a molded leaf spring in the lid of the plastic bob when it is snapped into place. An additional feature of the plastic box is to provide pillars under the FR-4 board in the location of the power ICs to provide a backstop for the leaf spring force.

Screwless Power Clip

The screwless power clip is an extension of a clip that Grundig uses in automotive radios produced in Europe today. The Grundig clip uses a long lever arm that must be snapped after the PCB is assembled into the metal wrap around. This requires an operator to reach in with a tool and snap (distend and release) the clip.

In the present invention, the long lever arm is eliminated. The present invention uses the assembly action of hooking the bottom of the heat sink into plastic stirrups and rotating the top of the heat sink until it snaps at the top of the plastic box to provide the lever action. This assembly technique can be accomplished by an operator without the use of expensive or specialized tools.

An additional approach to this idea is to eliminate the clip altogether and to employ a spring material as part of the lead frame.

Fold-Up Case

In this mechanical configuration, the case starts out as a flat set of plastic sides with molded in metal mesh to act as the hinges for folding the case into a three-dimensional structure. This approach allows for bottom-up assembly that starts by snapping the board to molded features in the bottom plate. The heat sink is snapped to features in the back plate and the CD mechanism is attached to the front plate with two screws. The box is then folded up and snapped together.

Figure 22:
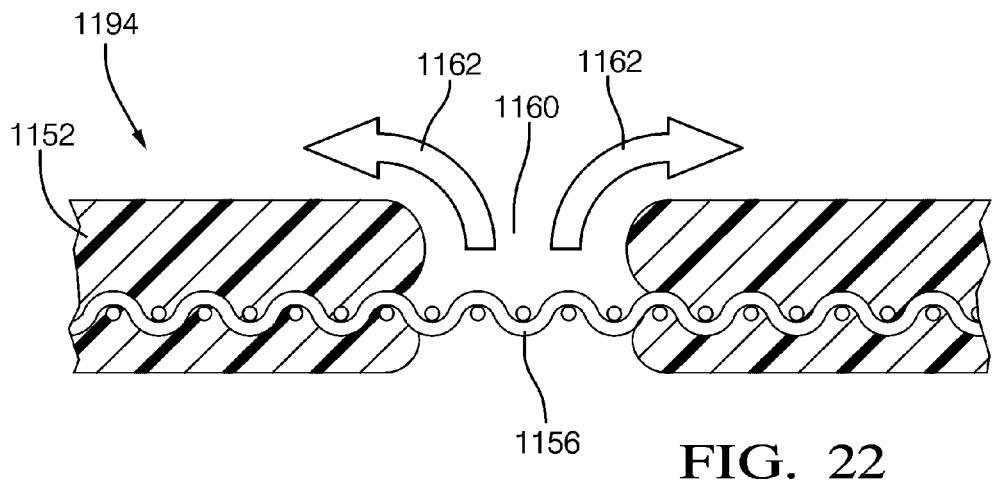
FIG. 22, is a representative cross-sectional detail of a variant of the case wall structure of the radio/CD player of FIG. 18, on a greatly enlarged scale, illustrating a screen only section forming a living hinge.
Figure 26:
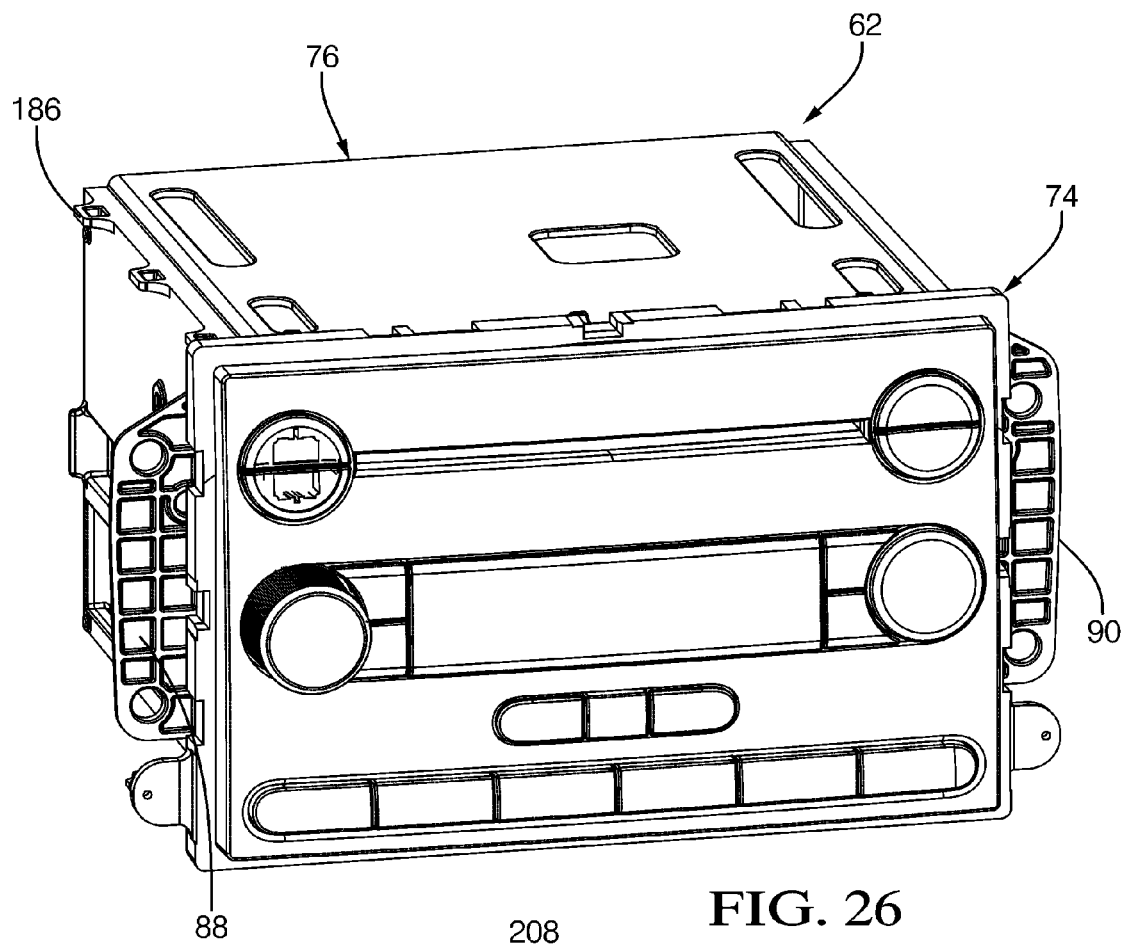
FIG. 26, is a front perspective view of an alternative embodiment of the invention, substantially similar to that of FIG. 2, but with I/O control device function graphical detail highlighted.

The common edges of adjacent case panels define living hinges extending partially or entirely along the length thereof. The living hinge can consist of wire mesh only, where there is a gap in the plastic material, as illustrated in FIG. 22. Alternatively, the living hinge can comprise a thin web of plastic only, wherein the wire mesh has been interrupted. In another embodiment, the plastic-wire mesh composite can be molded to define a thin web as the living hinge, as illustrated in FIG. 17. In another embodiment, the plastic-wire mesh composite can be crushed or deformed to define the living hinge, as illustrated in FIG. 24. Finally, a portion of the plastic and/or wire mesh can be scribed or machined away to expose the wire mesh to define the living hinge. If the case material is thin enough at the hinge point, the hinge can be segmented, rather than continuous.

Referring to FIGS. 18-25, several variants of a housing assembly 1086 for an automotive audio system 1088 are illustrated. This version of the audio system 1088 is configured to be hand assembled and is nearly fastener-less. The fasteners which are employed are extremely elemental and require only the most rudimentary of hand tools to affect assembly. In essence, the audio system housing assembly 1086 comprises a case portion 1090 and a closure member or front plate 1092. The case 1090 is presented to the assembler in an unfolded, two-dimensional arrangement whereby he/she can easily complete the final assembly process on a table top, eliminating complex and expensive tooling fixtures and multiple work stations.

The case portion 1090 is initially created as a sheet-like preform 1094 consisting of a number of flat panels interconnected along their adjacent edges. As best viewed in FIG. 18, the preform 1094 defines five distinct panels, which will constitute a bottom or lower wall portion 1096, a right side wall portion 1098, a left side wall portion 1100, a top or upper wall portion 1102 and a rear wall portion 1104. The adjacent panels are commonly joined or integrally interconnected by living hinges 1106, enabling the panels to be repositioned normally to one another to form a three-dimensional box-like case 1090.

Figure 18:
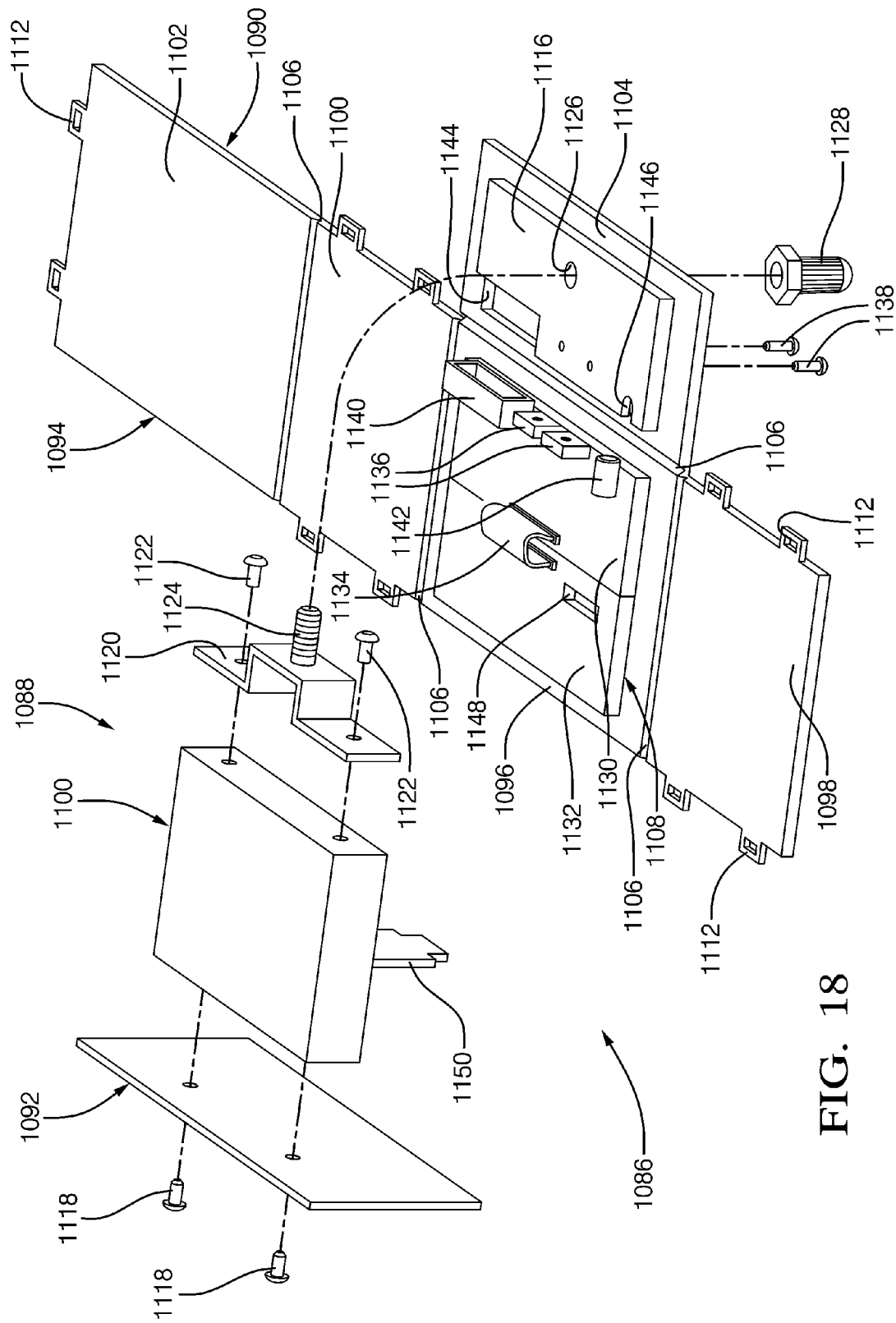
FIG. 18, is an exploded, perspective view of a second alternative embodiment of a radio/CD player featuring an unfolded case which provides a single plane bottom up assembly configuration.

The preform 1094 can be die cut from a continuous sheet of source material or, alternatively, injection molded in a net shape as illustrated in FIG. 18. In either case, the material employed to make the preform is a composite of at least one layer of relatively rigid polymer based material and at least one layer of electrically conductive material capable of shielding audio components, such as a radio receiver circuit 1108 or a CD player subassembly 1110 from electrical anomalies such as radio frequency interference (RFI), electromagnetic interference (EMI), bulk current injection (BCI), and electrostatic discharge (ESD). Cooperating engagement features such as tabs 1112 and catches 1114 are affixed to or integrally formed with the preform 1094. Refer FIGS. 20 and 21. By way of example, after installation of the internal subcomponents, the case preform is folded to assume its ultimate box-like configuration. This places cooperating associated pairs of tabs 1112 and catches 1114 in an assembly orientation with the tab 1112 carried on the edge of one panel (the right side wall portion 1098, for example) and the catch 1114 carried adjacent the edge of a now adjoining panel (the rear wall portion 1104, for example). Final structural fixation of the preform 1094 in the form of the housing case 1086 is completed by simply snap-engaging the tab 1112 with the catch 1114 from the configuration of FIG. 20 to the configuration of FIG. 21. After all of the tab 1112/catch 1114 pairs are interconnected, the formation of the case 1090 is complete.

Prior to folding up the case 1090, the radio receiver circuit 1108 is positioned and affixed to the exposed surface of the lower wall portion 1096. A heat sink 1116 is similarly positioned and affixed to the exposed surface of the rear wall portion 1104. The positioning and attachment of the internal components can be accomplished by features integrally formed in the formation of the preform 1094 (such as snaps, locating guides and the like), adhesives, discrete attachment and guide elements or inter-engagement with the various wall portions and other assembly elements within the case 1090.

After formation of the case 1090, the CD player subassembly 1110 can be pre-assembled with the closure member 1092 via screws 1118 or other interconnecting features described herein. A rear bracket 1124 secured to the back side of the CD player subassembly 1110 by screws 1122 includes a rearwardly extending threaded post 1124 which, upon final assembly extends through registering passageways 1126 in the heat sink 1116 and rear wall portion 1104 and engages a mounting bushing 1128. This arrangement provides an extremely robust overall structure to the overall audio system.

The electrical components comprising the radio receiver circuit 1108 are arranged on a "common" component PCB 1130 and a "unique" PCB 1132. The common and unique PCBs 1130 and 1132 are electrically interconnected by a ribbon connector 1134. The heat generating electrical components 1136 are arranged on the common PCB 1130 and are affixed to the heat sink 1116 by screws 1138 or other suitable means, to enhance thermal coupling therebetween. Electrical connectors 1140 and 1142 are also arranged on the common PCB 1132 in register with port openings 1144 and 1146 in the rear wall portion 1104 of the case 1090. A vertically opening electrical socket 1148 is centrally disposed in the unique PCB 1132 to receive a rigid connector 1150 extending downwardly from the CD player subassembly 1110. This arrangement electrically interconnects the two audio components as well as provides structural support thereof.

Figure 19:
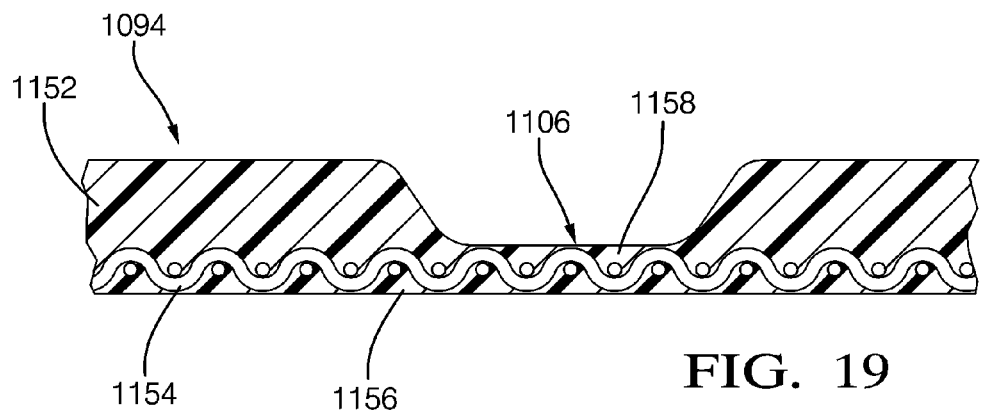
FIG. 19, is a representative cross-section of the case wall structure of the radio/CD player of FIG. 18, on a greatly enlarged scale, illustrating a thin wall section forming a living hinge.
Figures 20, 21:
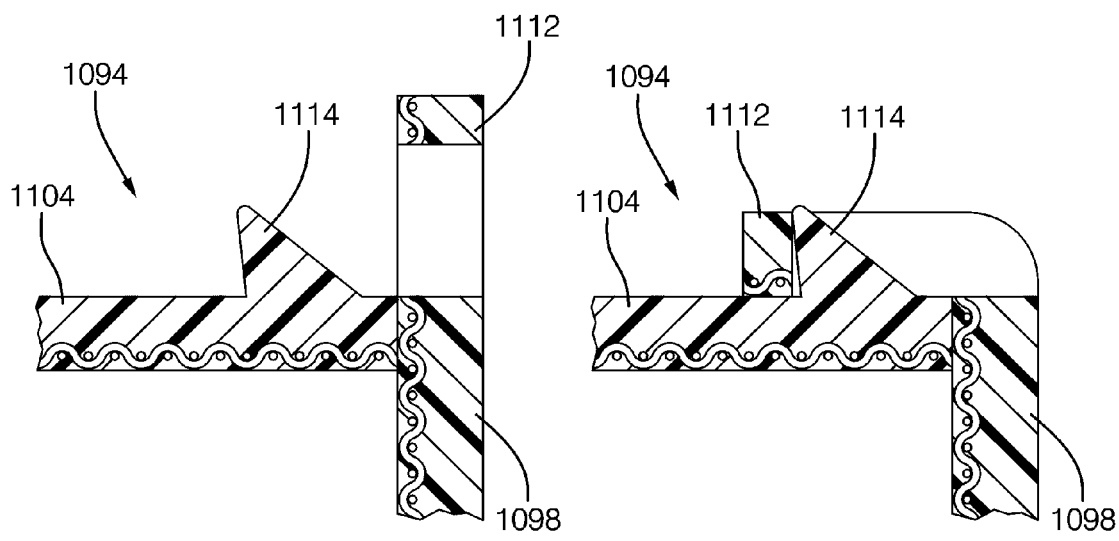
FIG. 20, is a fragmentary, cross-sectional detail of adjacent case panel edge portions of the radio/CD player of FIG. 18, on an enlarged scale, in a post assembly orientation prior to engagement of cooperating integral latch features.
FIG. 21, is a fragmentary, cross-sectional detail of adjacent case panel edge portions of the radio/CD player of FIG. 18, similar to that of FIG. 20, in a post assembly orientation after engagement of cooperating integral latch features.

One embodiment of the composite material employed for the housing assembly 1086 consists of a layer of elastomeric material 1152 with a continuous wire screen 1154 insert molder therein adjacent an interior wall surface 1156 of the composite structure. Referring to FIG. 19, the living hinges can be formed by an extremely locally thin (or non-existant) layer 1158 of polymeric material and the wire screen 1156.

Referring to FIG. 22, air vents 1160 can be provided in the case 1090 by locally eliminating the polymeric material layer 1152 while maintaining the continuity of the wire screen 1156 to permit airflow, as indicated by arrows 1162, therethrough.

Referring to FIG. 24, an alternative living hinge 1164 can be formed post-production of the composite material by pressing alternating undulations 1166 therein along the axis of the intended living hinge 1164.

Referring to FIG. 23, a first process for producing composite material is illustrated, including drawing polymeric sheet material off upper and lower continuous rolls 1168 and 1180 to enclose an intermediate layer of wire screen from a third roll 1172. The three discrete sheets are heated at station 1174, rolled together at station 1176, cured at station 1178, cut-off or die cut to form performs at station 1180, scribed, punched treated and/or formed at a station 1182, and, finally, assembled at a workstation 1184.

Referring to FIG. 23, a second, alternative process for producing composite material is illustrated drawing a continuous sheet of wire screen off a roll 1186 and drawing it through a continuous extruder/molder 1188 to form the composite structure. Thereafter, the composite sheet is shaped at station 1190, cut off and/or punched at a station 1192, and, finally, assembled at a work station 1194.

Assembly of the audio system 1088 is completed by affixation of a trim plate subassembly (not illustrated) such as the device described in connection with FIGS. 2-10 hereinabove.

Figure 31:
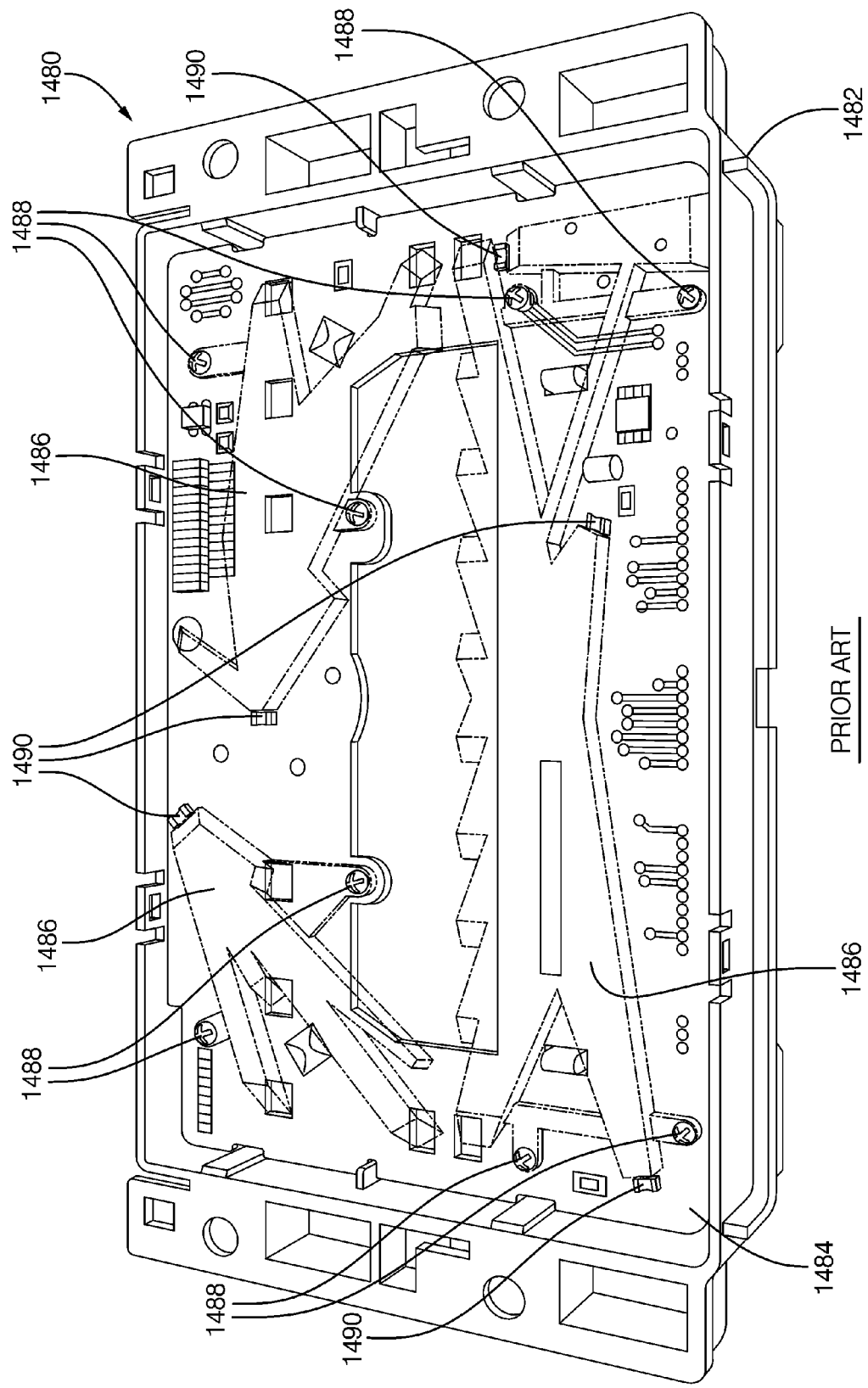
FIG. 31, is a perspective view of the back side of the trim plate assembly of the prior art radio/CD player illustrated in FIG. 1, illustrating the surface details thereof.

Referring to FIG. 31, a known trim plate assembly 1480 is illustrated to highlight the substantial complexity, high part count, and design shortcomings resulting from providing back-illumination using traditional design and assembly techniques. The trim plate assembly 1480 includes a black plastic front panel 1482 (with operator controls and displays affixed on the opposed side), a printed circuit board (PCB) 1484 mounted on the exposed face of the front panel 1482, three separate and discrete lightpipes 1486 mounted on the exposed face of the PCB 1484 by eight fastening screws 1488 and five light emitting diodes (LEDs) 1490 carried on the PCB 1484.

Squirts

To further the innovative construction of the present invention, "squirts" or screwless retention features are employed. Restated, squirts are a drawn feature from a structural element, or a styled protrusion at the interface of two structural elements. Although applicable broadly, squirts are principally applied in the preferred embodiment of the invention to secure the CD player subassembly to the left and right CD player guide brackets. This allows the elimination of six additional screws.

A squirt is a retention feature which is integrally formed in a typically planer region of a structural member, such as a CD player guide bracket, which extends above one surface thereof and, during assembly, self-engages within an opening formed in an adjacent structural element, such as a hole in the outer case of the CD player subassembly. Squirts permit assembly of the guide brackets to the CD player assembly by hand without the need for special fixtures and power tools.

The squirts are formed from stock material during formation of the brackets themselves and do not add significant cost to the finalized bracket component. Similarly, mating holes can be easily punch formed in the adjacent case panels of the CD player subassembly.

In addition to reduced cost and ease of assembly, the squirt self-aligns the respective components during the attachment process, thereby ensuring their precise juxtaposition. Furthermore, the squirt is permissive of lower tolerances in the forming and assembly of its associated elements. In fact, the presence of slightly misshapen features or metal flash resulting from low tolerance punching operations can actually result in enhanced retention performance.

Referring to FIGS. 39-42, the application of "squirts" 1676 to affix the left and right side mounting brackets, 106 and 108, respectively to the multi-disc CD player unit 104 to form the CD player subassembly 66, is illustrated. The squirts are preferable die-punch formed simultaneously with the formation of the mounting brackets 106/108 themselves. It is noted that the brackets 106/108 can be configured symmetrically, whereby one design can be used for both sides of the CD player unit 104, thereby further reducing the overall part count. The squirts 1676 are preferably formed on relatively regions 1678 of their associated bracket 106/108. A single through passage 1680 if formed in the planer region 1678. Two or more substantially symmetrical forms 1682 extend radially inwardly from the edge of the through passage 1680. Each form 1682 has a neck region 1684 and a tapered region or sector 1686. The tapered region 1686 is supported as a cantilever by the neck region 1684. The tapered regions 1686 collectively co-act to define (in the case of two forms) a bisected frustoconical form, wherein each tapered region 1686 defines an outside peripheral surface 1688 which are acutely converging upon an axis normal to the planer region 1678. The taper of an imaginary cone 1700 extended from surfaces 1688 is designated by the angle w. As illustrated by alternative phantom depictions, the overall shape of the imaginary cone 1700 can be parabolic or hyperbolic. The outer peripheral surface 1688 of each tapered region or sector 1686 has a circumferential range designated by the angle $\theta$, which with two forms is preferably in the range of 90°-120°.

In application, the collective outer peripheral surface of the sectors 1686 engage a surface forming the outer diameter of a recess or through hole 1702 in an adjacent structure 104 to which the bracket 106/108 is to be attached. As illustrated in FIG. 40, the maximum diameter edge surface 1704 sectors 1686 effect line contact to maximize pull-out performance.

Referring to FIG. 42, localized radially outwardly projecting knurls, ridges or extensions 1706 to provide point contacts with the adjacent structures.

Attachment of the squirt 1676 to an adjacent structures is affected simply by aligning the sector 1686 with the through hole 1702 and pressing inwardly, as indicated by the phantom finger tip and resultant force arrow 1708.

In essence, the present invention uses a multi-sided fold-up polymer based case or "preform blank", for the chassis of the radio assembly that is molded in a relatively flat state. During the assembly of the radio, the preform blank is folded into the resultant three dimensional case shape. The sections or wall portions (top, back, bottom and front) of the case are interconnected by a hinge style detail that allows the folding to occur with a snap feature to help secure the sections after folding into the three-dimensional assembly. The shielding and/or grounding may be achieved through using an insert molded wire mesh or a post molding plating process like vacuum metal deposition, as an example. The hinge portion may consist of only wire mesh, or a combination of polymer and wire mesh depending on the polymer capability. If a vacuum metal deposition process is used instead of mesh, the hinge will require special design features outside of the hinge to enable an EMC shield to overcome any potential microcracking that may occur in the deposited metal from the fold-up assembly at the hinge point when the walls of the fold-up are in the final assembled position. The shield will be enabled after the detail is in the resultant folded-up shape.

The case has the capability for molded-in details to enhance the assembly with mounting features and snap retention details. Also, this allows for pliable ground details that can interface with the circuit board ground pad areas. The structure of the chassis is provided using two aluminum extrusions on the opposing sides of the radio case. One or both of the extrusions may be used for heat dissipation of the power devices on the circuit board assembly. In the event of a playback mechanism like a CD player is used, the front bracket typically used to secure the mechanism in the audio assembly will also provide the vehicle mounting of the audio assembly. Unlike metal chassis radio assemblies that may use a bottom-up assembly, this approach allows the back wall to be folded up and into place to provide the back of the mechanism stability by driving screws through the wall section into the mechanism. This eliminates an extra metal bracket for securing the CD player often used with other approaches.

The extrusions are assembled to the multi-sided fold-up by loading the extrusions into a molded detail at the back of the case and pivoting the extrusion along molded rails at the top and bottom of the sides to enable an interference fit to the molded rails with the front of the extrusions deflecting molded-in snaps on the front section to reach the final seated position. In this manner, the extrusions act both as a component (side wall) and as their own assembly tool.

The molded multi-sided fold-up polymer based case allows for assembly details as described but offers the advantage of being processed through a less expensive tooling option than a molded box-like case with a frontplate as described in connection with FIG. 3. The fold-up approach tooling does not require side coring and after molding the relatively flat nature of the part enables easier shipping and storage if needed. In the event an insert molded wire mesh is used, the mesh also does not require forming and can simply be cut and loaded, reducing the expenditure for the wire mesh form processing equipment.

The grounding details in the fold-up approach are better suited for interface to the circuit board than the box-style case in that they can be designed to compress against the ground pads and the folding sections can also be enabled with details locally to secure the ground points from the prior section part during the assembly as opposed to trying to provide a slide clearance and not hinder the assembly.

The design detail that enables both flexibility and minimized cost over the box-like case and front plate assembly is that the molding for the fold-up portion is one tool and the extrusions can be the same part reused on each side of the radio case. A part molded in a relatively flat state is both economical for part transportation and storage. The structure for the chassis uses a process based on the incremental strength leveraged from assembling each component part to finalize the structure as a container for the playback mechanism and circuit boards. The interface between the extruded aluminum sides and the molded fold-up offers an interference fit on molded details to help stabilize the structure of the final assembly. This is unique in that typically the extrusion may only be a heat sink for the power devices from the circuit board. This invention enables the extrusion to provide a structural and shielding component in addition to the heat flow function.

Referring to FIG. 44-54, a consolidated radio/CD player apparatus 2010 embodying many aspects of the present invention is illustrated. The radio/CD player 2010 is an assemblage of six major components or subassemblies, a generally planer, composite preform blank 2012, a circuit board subassembly 2014, a CD player subassembly 2016, a left side closure member 2018, a right side closure member 2020 and a trim plate subassembly 2022. Additionally, an adaptor or mounting bracket 2024 is pre-attached to the CD player assembly 2016 by screws 2026. As will be described in greater detail hereinbelow, rear wall mounting screws 2028 are affixed to the CD player 2016, rear panel reinforcement screws 2030 are affixed to the rear edges of the left and right side closure members 2018 and 2020, respectively, and screws 2032 affix the right side closure member 2030 to three power devices 2032 mounted on the circuit board subassembly 2014.

It is envisioned that each of the major components/subassemblies would be produced "off-line" and the final assembly process would comprise the efficient, high volume joining of the major components/subassemblies and end-of-line testing of the completed units.

Figure 44:
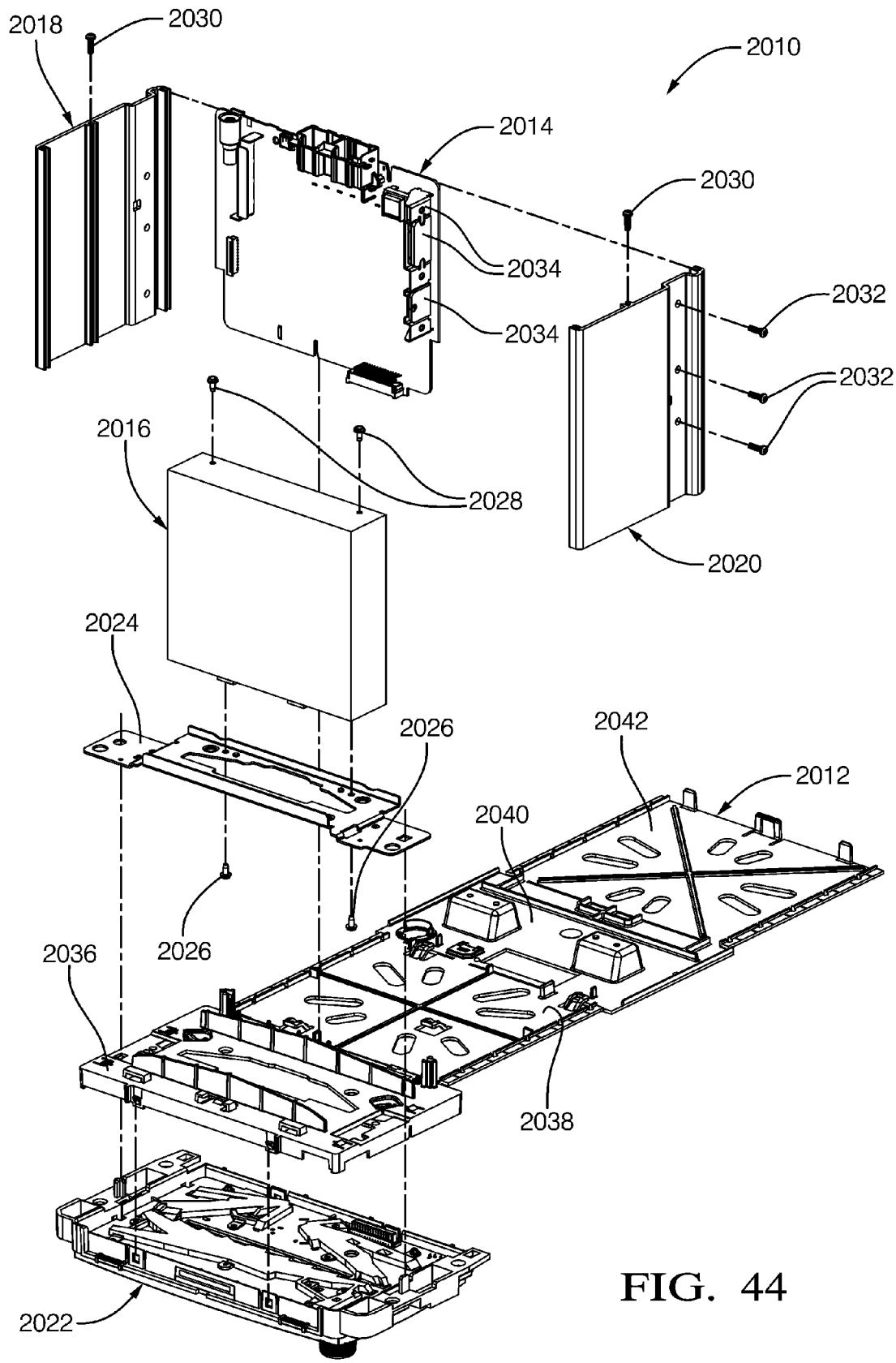
FIG. 44, is an exploded, perspective view of a preferred embodiment of a radio/CD player, illustrating the major subcomponents and subassemblies thereof.
Figure 52:
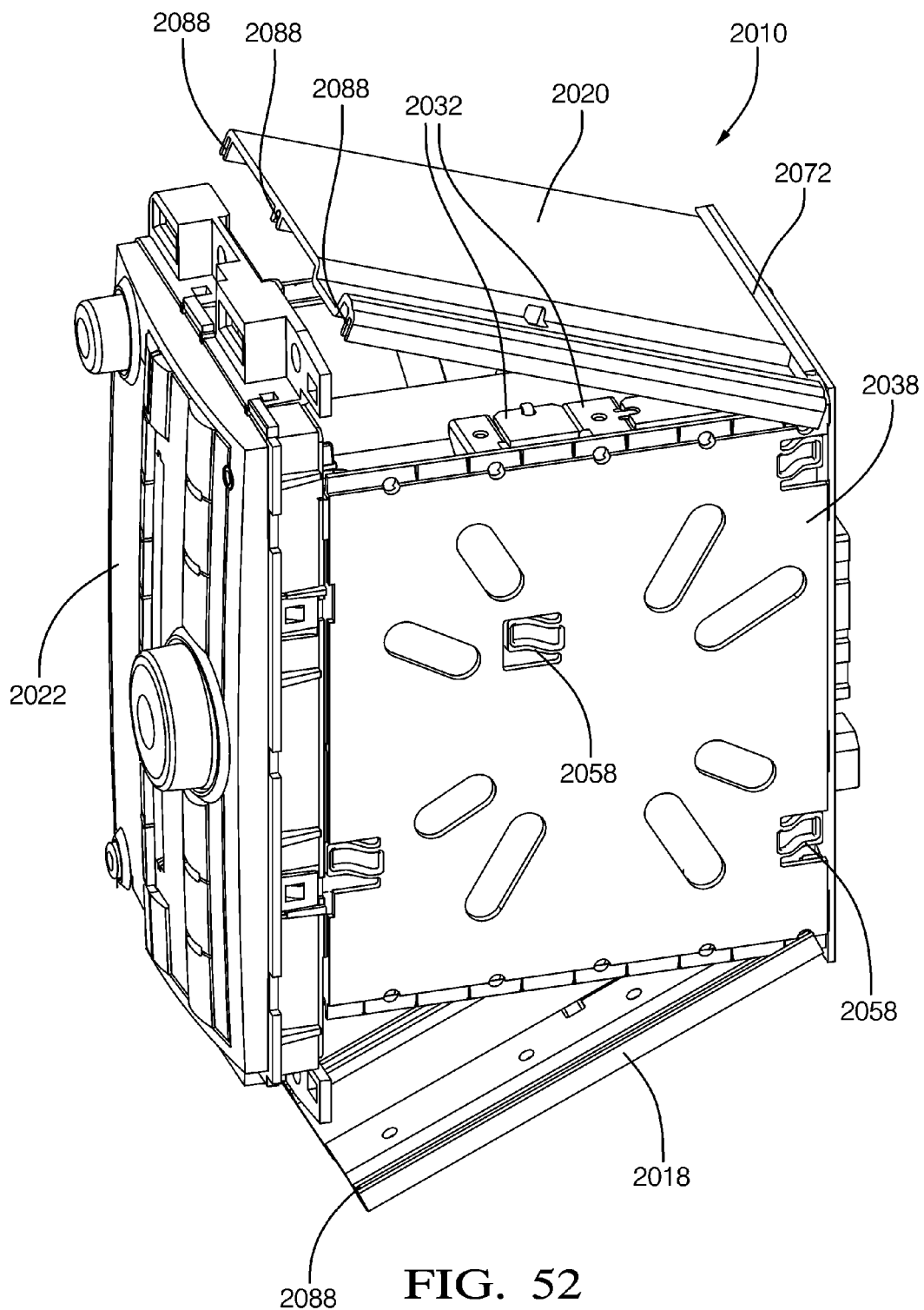
FIGS. 52 and 53, are perspective views of the radio/CD player of FIG. 44, illustrating final assembly step VII in the production thereof wherein the discrete right side wall closure member is installed via snap-fit engagement features and thermally coupled with power devices carried with the circuit board assembly.
Figure 53:
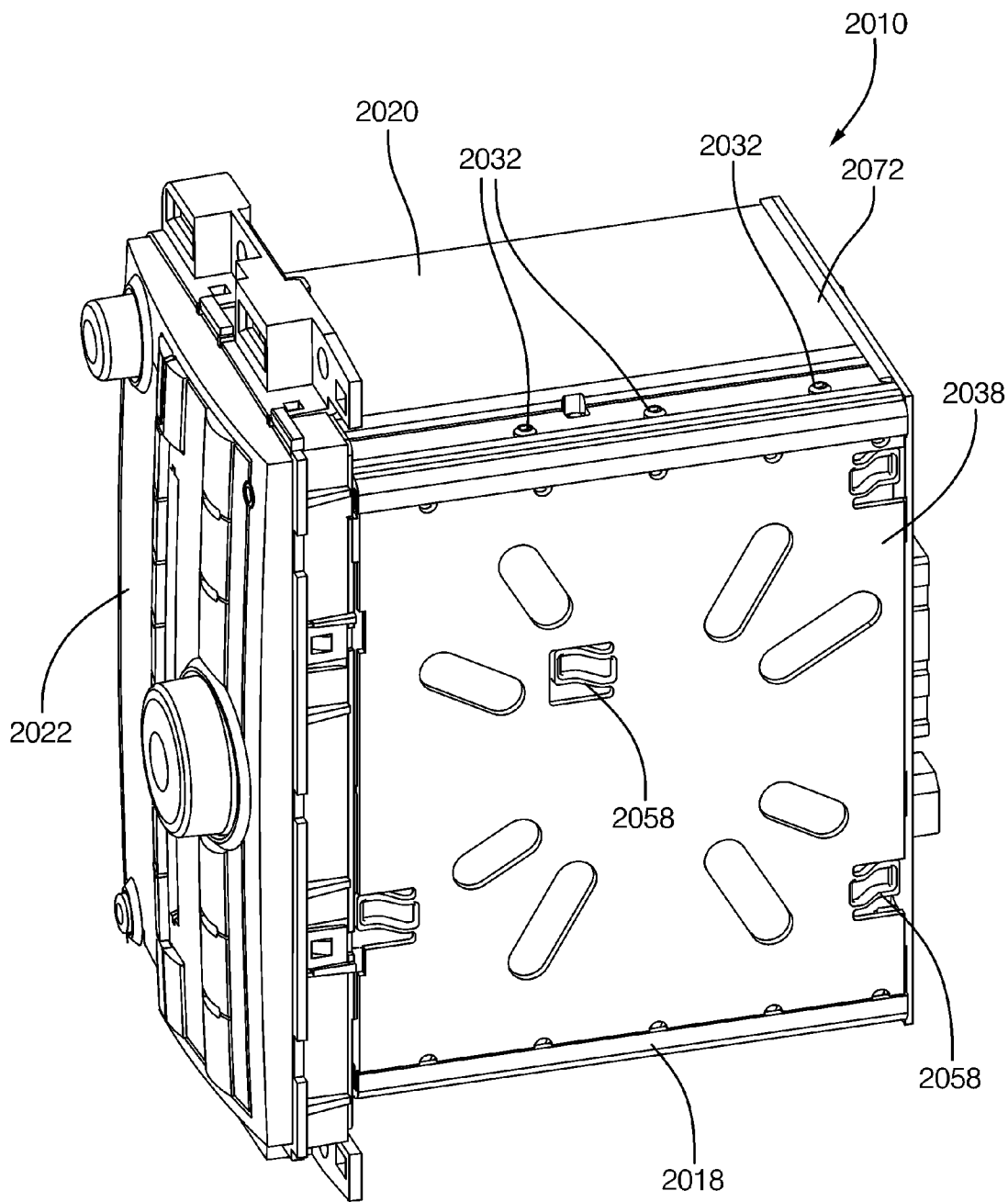
Figure 54:
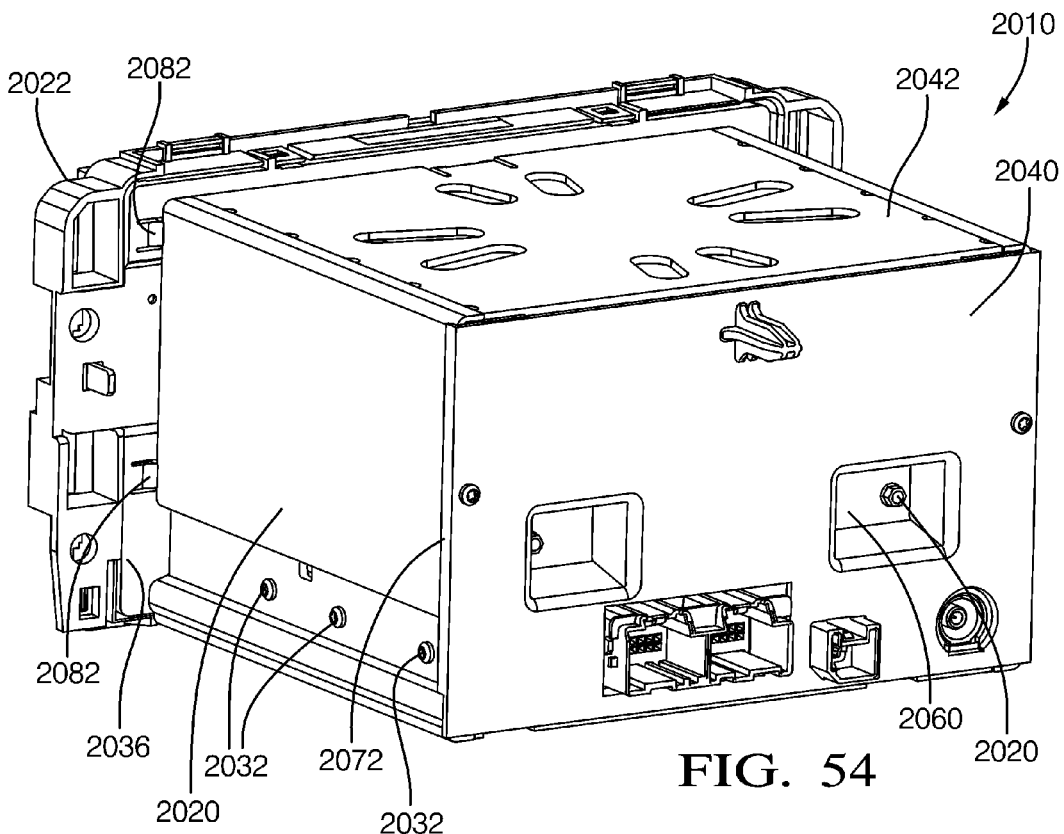
FIG. 54, is a rear side perspective view of the completed radio/CD player.

FIGS. 53 and 54 depict perspective views of the fully assembled radio/CD player apparatus 2010. FIG. 44 is an exploded view illustrating the juxtaposition of the respective major components during the assembly process. FIGS. 45-53 depict specific assembly steps of the major components as will be described hereinbelow.

Figure 45:
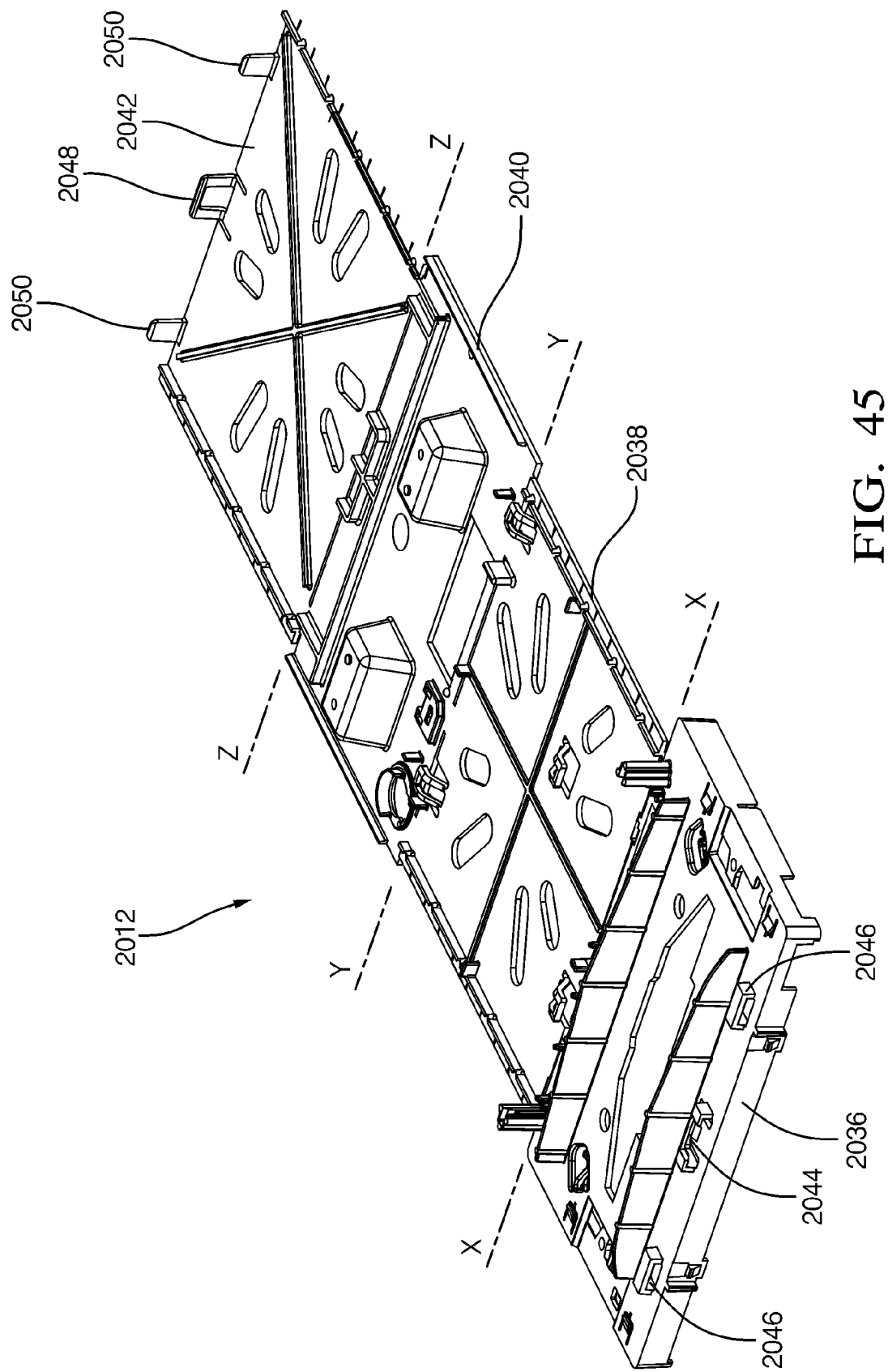
FIG. 45, is a perspective view of a generally planer preform blank as formed, such as be injection molding, prior to beginning the final assembly process.

As best seen in FIG. 45, the preform blank 2012 is preferably injection molded of polymer based material in a generally planer configuration and, when finally assembled, forms a box-like, three dimensional case. The blank 2012 defines a front wall portion 2036, a bottom wall portion 2038, a rear wall portion 2040 and a top wall portion 2042 respectively integrally interconnected by "living hinges" extending along axes designated as X-X, Y-Y and Z-Z, respectively. All of the blank wall portions are integrally formed in a single injection molding process and comprises a composite of a pre-shaped planer piece of wire screen wire insert molded within a layer of relatively rigid polymer material such as glass filled polypropylene. Each of the wall portions is deemed to have a leading edge, a trailing edge and an opposed pair of side edges.

The front wall portion 2036 has a female engagement feature 2044 and a pair of female guide features 2046 integrally formed adjacent the leading edge thereof. Similarly, the top wall portion 2042 has a male engagement feature 2048 and a pair of male guide features 2050 integrally formed adjacent the trailing edge thereof. The trailing edge of the front wall portion 2036 is interconnected with the leading edge of the bottom wall portion 2038 along hinge line X-X. The trailing edge of the bottom wall portion 2038 is interconnected with the leading edge of the rear wall portion 2040 along hinge line Y-Y. The trailing edge of the rear wall portion 2040 is interconnected with the leading edge of the top wall portion 2042 along hinge line Z-Z.

The circuit board subassembly 2014, CD player subassembly 2016 and trim plate subassembly 2024 are substantially similar to the corresponding major components described hereinabove in connection with the embodiment of FIG. 3. For the sake of brevity, the details thereof will not be repeated here.

Figure 46:
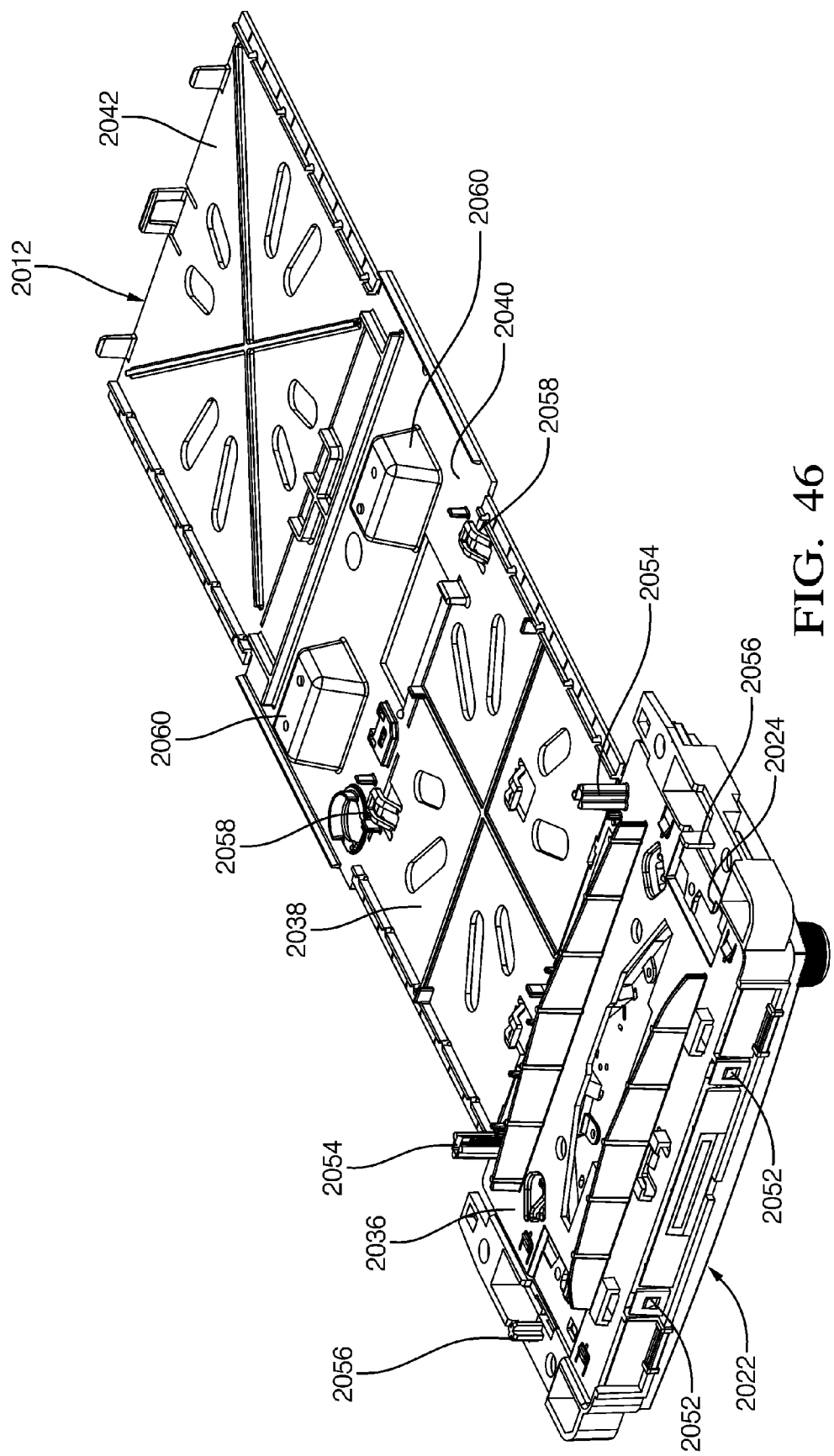
FIG. 46, is a perspective view of the radio/CD player of FIG. 44, illustrating final assembly step I in the production thereof wherein the trim plate assembly is snapped to the outer surface of one of the four wall portions, specifically the front wall portion, defined by the perform blank of FIG. 45.

Referring particularly to FIGS. 46-53, a method of assembly of the lightweight audio system 2010 of the present invention is illustrated. Audio system 2010 can be assembled manually by an ordered process wherein a single (preferably, but not limited to) operator, who sequentially assembles the six major components or subassemblies on a designated work surface. No specialized tools or separate/dedicated fixtures are required. No threaded fasteners/screws are required. Each or the major components and subassemblies form integral features which cooperate to interact with features of the other components and subassemblies to register, align and guide the components and subassemblies during adjoining thereof as well as to removably affix the components and subassemblies to one another when in their final design position. This process is referred to herein as the Slide-lock Snap-lock™ Screwless Assembly Technology and Method or "SLAT". In effect, the components "self-fixture" one another in combination. The assembly of the radio/CD player 2010 is effected by the assembly technician or operator taking the following steps:

Referring to FIG. 46, the trim plate subassembly 2022 can be affixed to the outer (bottom as depicted) surface of the front wall portion 2036 by self-aligning, self-engaging engagement features 2052. Thus configured, the illustrated subassembly defines rearwardly (upwardly) directed extension pairs 2054 and 2056 integrally formed on the inner surface of the front wall portion 2036 and trim plate subassembly 2022, respectively. The inner surface of the bottom wall portion 2038 defines four integrally formed grounding clips 2058 and two pedestals 2060 extending upwardly.

Figure 47:
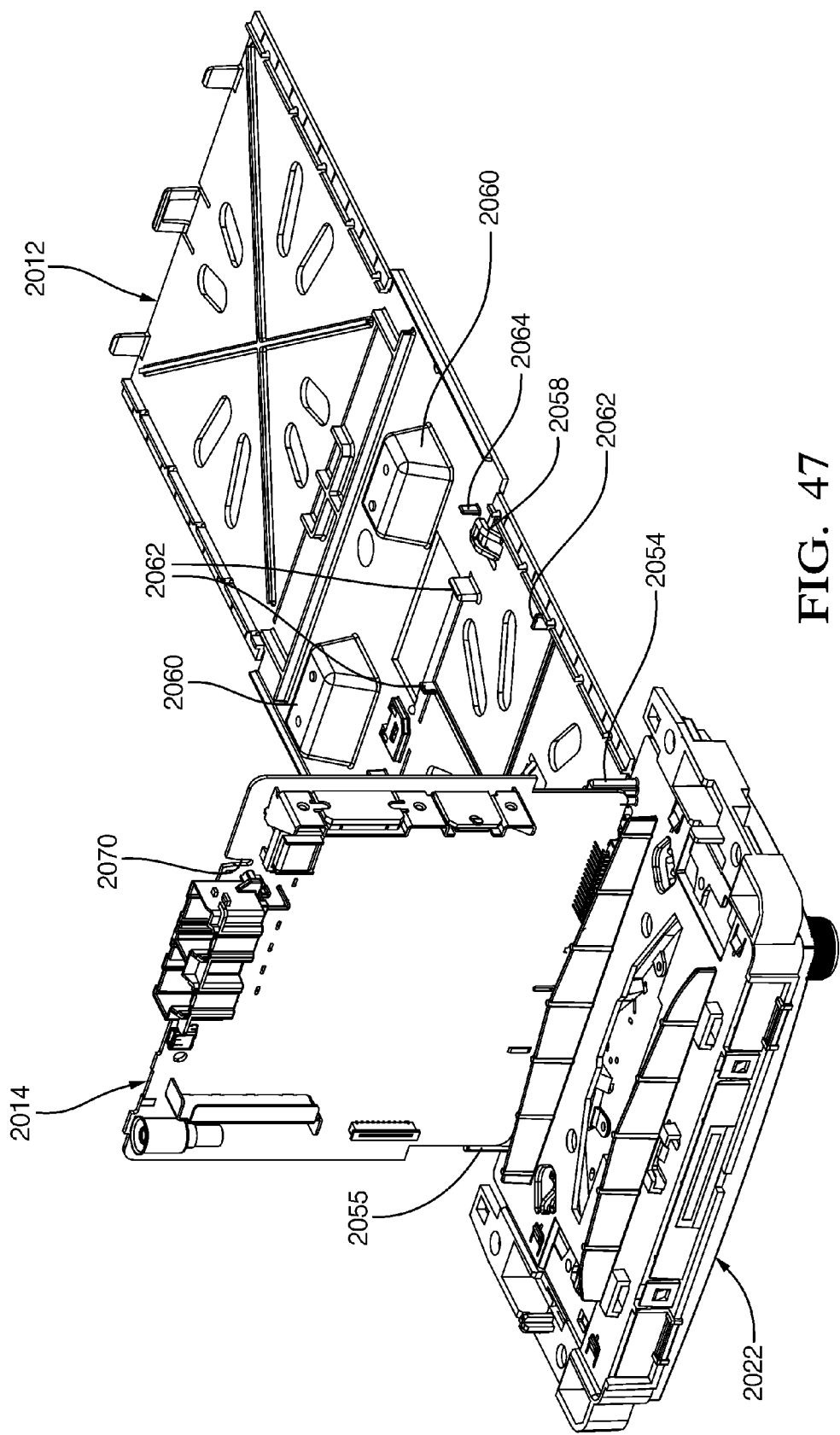
FIG. 47, is a perspective view of the radio/CD player of FIG. 44, illustrating final assembly step II in the production thereof wherein the circuit board assembly is slid and snapped to the inner surface of the front wall portion defined by the perform blank of FIG. 45.

Referring to FIG. 47, the circuit board subassembly 2014 is inserted downwardly to self-align, self-position and self-engage with guideways formed by the extensions 2054. Insodoing, the electrical circuitry contained on the circuit board subassembly 2014 is electrically interconnected with the circuitry on the trimplate subassembly 2022, as well as the other components via registering interconnects and plugs (not illustrated).

Figure 48:
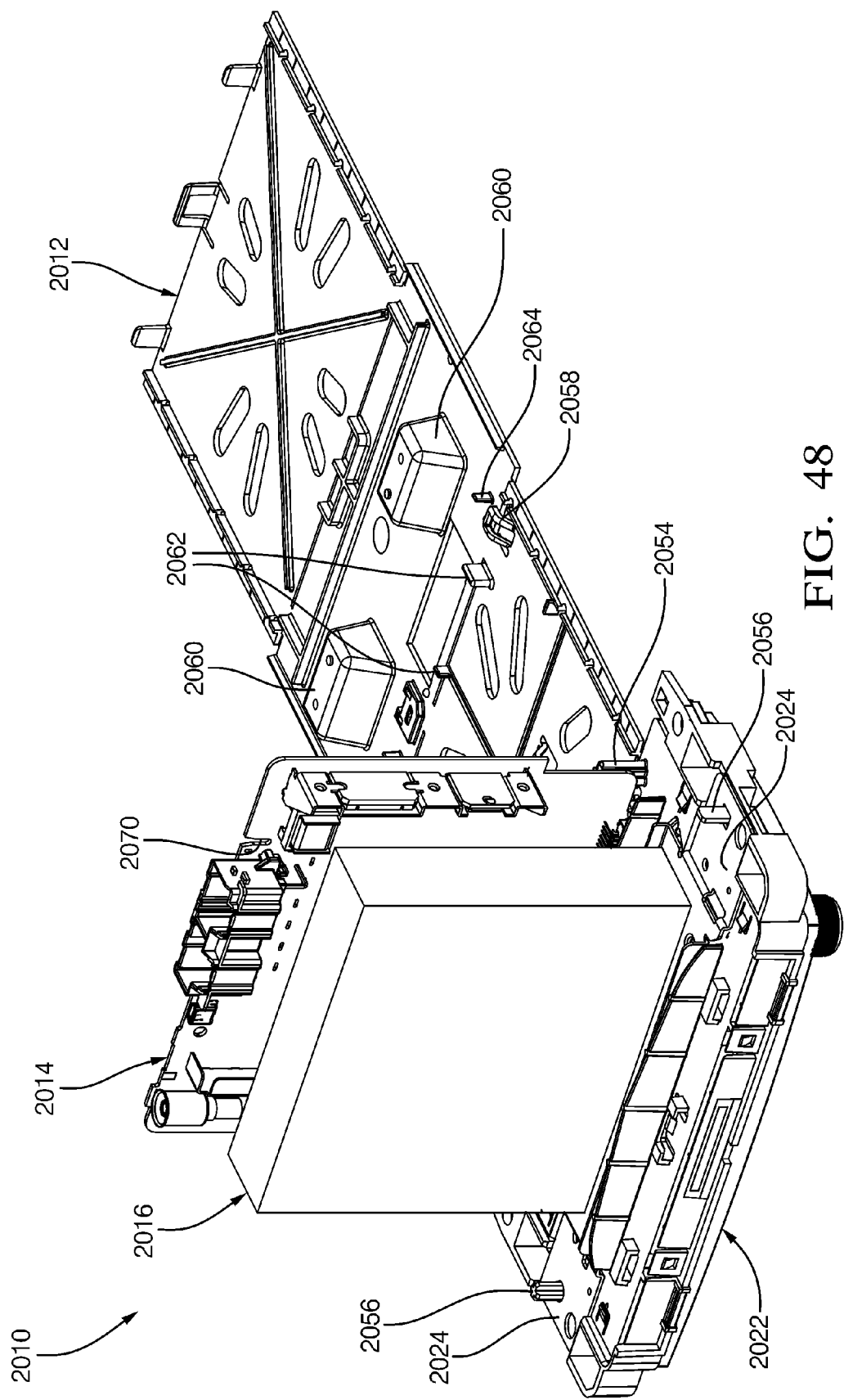
FIG. 48, is a perspective view of the radio/CD player of FIG. 44, illustrating final assembly step III in the production thereof wherein the playback mechanism is slid and snapped to the inner surface of the front wall portion defined by the perform blank of FIG. 45.

Referring to FIG. 48, the CD player subassembly 2016 is inserted downwardly to self-align, self-position and self-engage with locating pins formed by the extensions 2056. Typically, an electrical umbilical (not illustrated) interconnects the CD player subassembly 2016 and the circuit board subassembly 2014.

Figure 49:
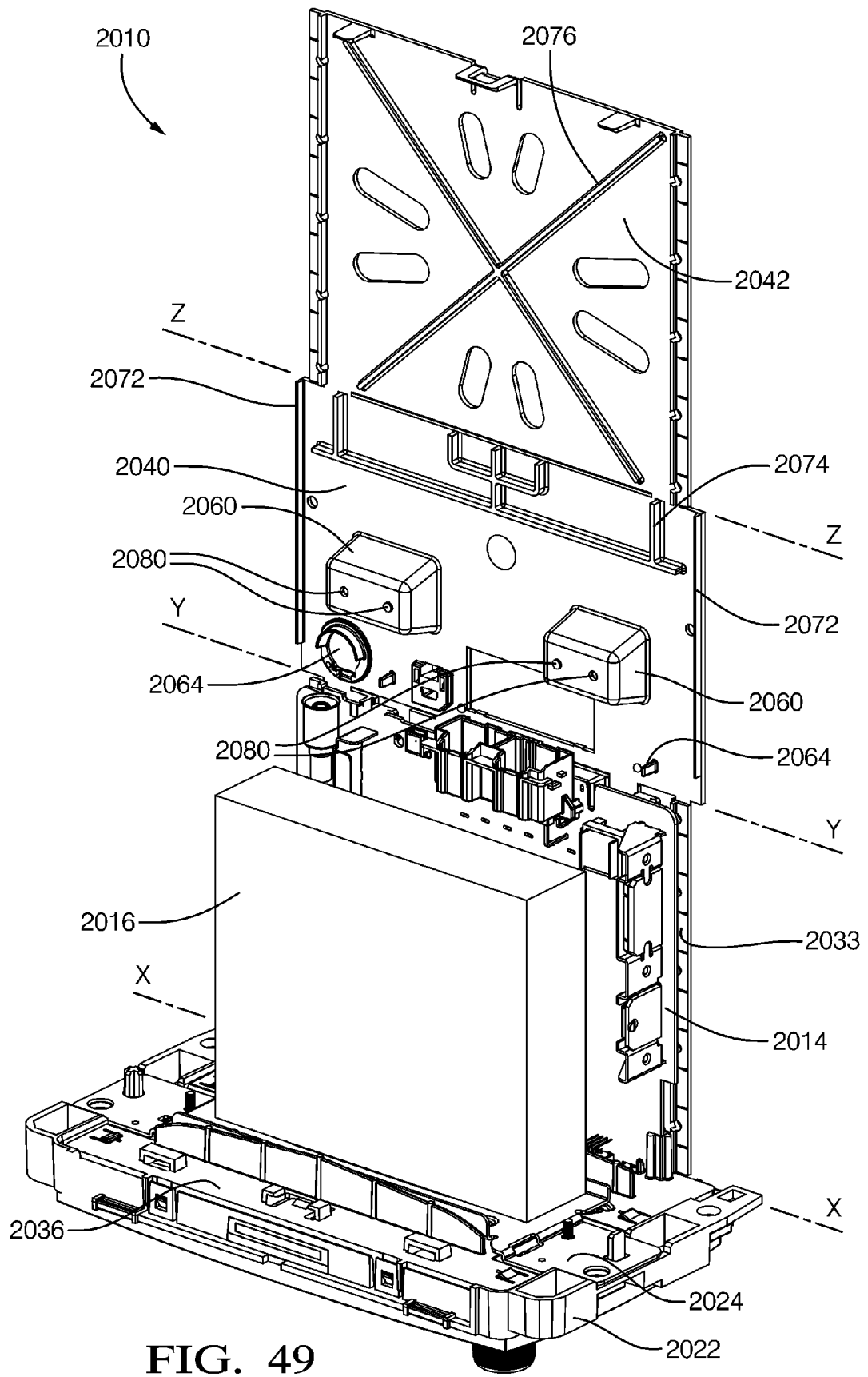
FIG. 49, is a perspective view of the radio/CD player of FIG. 44, illustrating final assembly step IV in the production thereof wherein the remaining three wall portions (top, back and bottom) defined by the perform blank of FIG. 45 are folded by rotation about a first living hinge from a horizontal orientation illustrated in FIG. 48 to a substantially vertical orientation.
Figure 50:
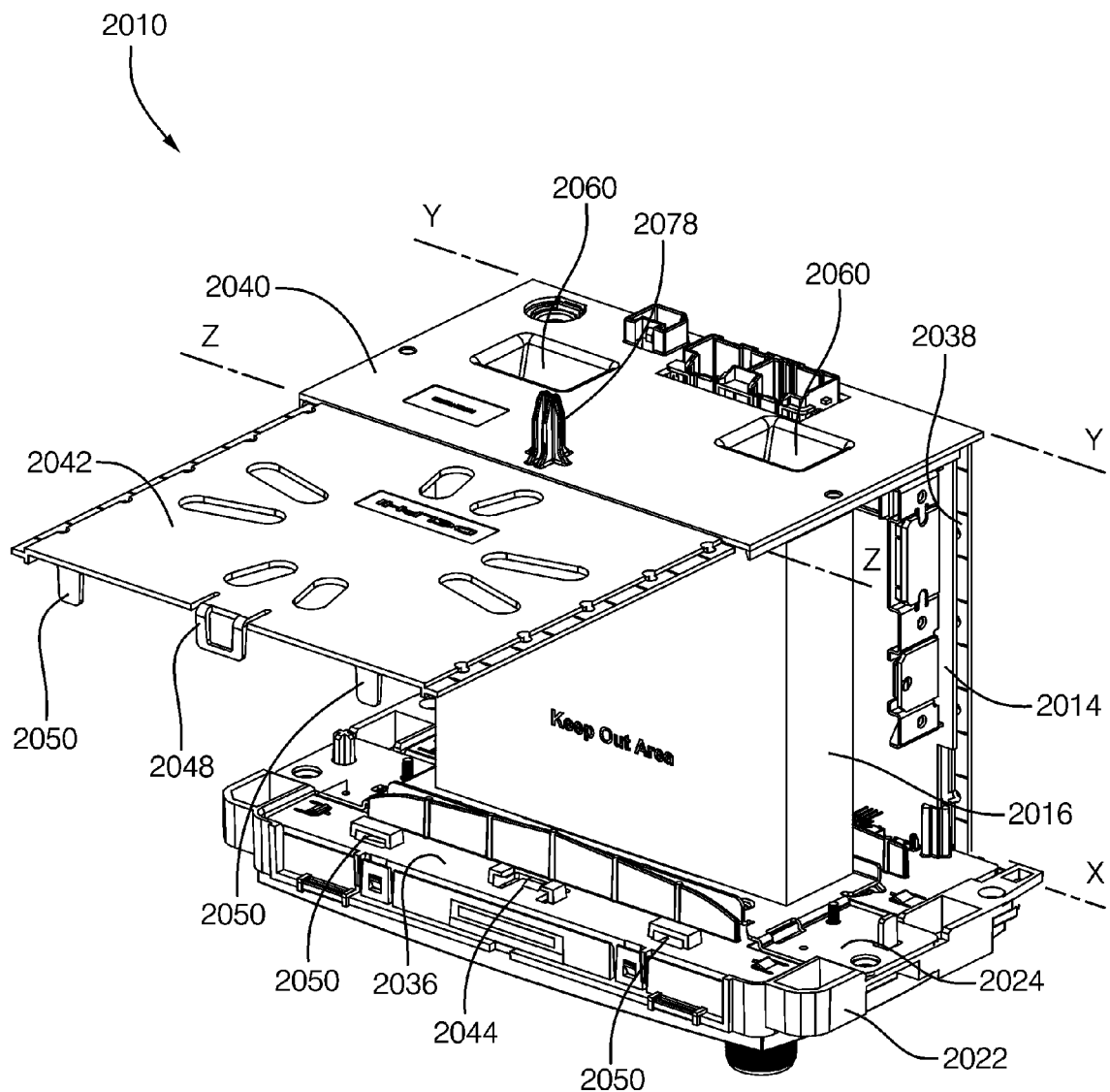
FIG. 50, is a perspective view of the radio/CD player of FIG. 44, illustrating final assembly step V in the production thereof wherein the remaining two wall portions (back and top) defined by the perform blank of FIG. 45 are folded by rotation about a second living hinge from a vertical orientation illustrated in FIG. 49 to a substantially horizontal orientation.
Figure 51:
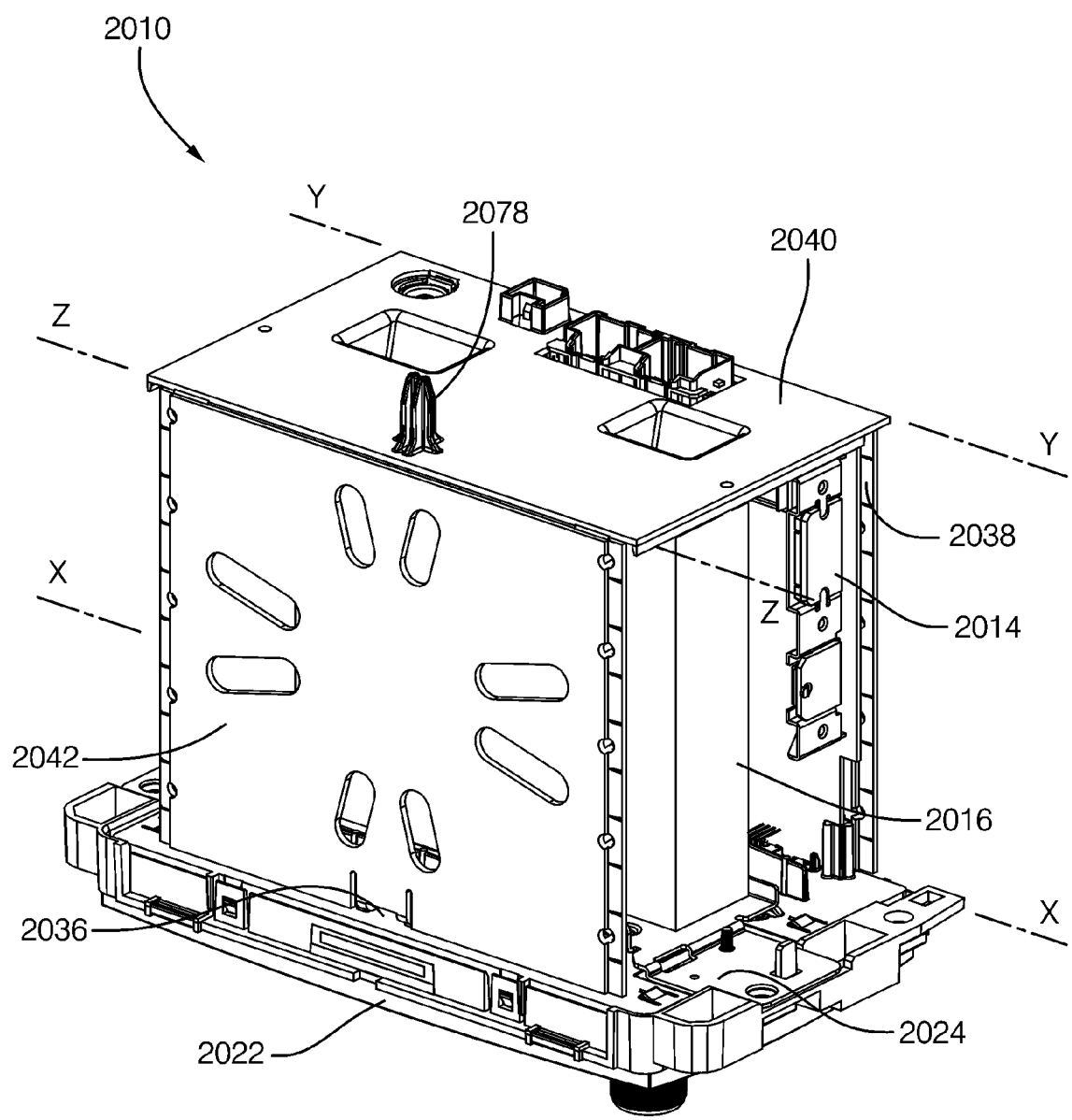
FIG. 51, is a perspective view of the radio/CD player of FIG. 44, illustrating final assembly step VI in the production thereof wherein the remaining wall portion (top) defined by the perform blank of FIG. 45 is folded by rotation about a third living hinge from a horizontal orientation illustrated in FIG. 50 to a substantially horizontal orientation, thus forming the case into a three dimensional configuration.

Referring to FIGS. 49-51, the preform blank 2012 is then folded, transitioning it from its original generally planer configuration to a three dimensional box-like configuration. Referring to FIG. 49, the first step of folding the preform blank entails manually or mechanically rotating bottom wall portion 2038 substantially 90° about axis X-X from its original horizontal orientation illustrated in FIG. 48 co-planer with the front wall portion 2036 to a vertical orientation substantially perpendicular or normal with front wall portion 2036. Note that in this step, rear wall portion 2040 and top wall portion 2042 remain co-planer with bottom wall portion 2038, assuming a vertical orientation.

As best viewed in FIG. 47, the inner surface of the bottom wall portion 2038 has integrally formed inwardly directed guide retainer features 2062 which, in combination with the grounding clips 2058, function to position, secure and electrically ground the circuit board subassembly 2014 upon final assembly of the radio/CD player apparatus 2010. The guide retainer features 2062 positionally secure the circuit board subassembly 2014 by engaging side edges and slots 2070 formed therein.

Inwardly directed, laterally opposed edge retention ribs 2072 are integrally formed on the inner surface of the rear wall portion 2040. Furthermore, integral reinforcing ribs 2074 extend from the inner surface of the rear wall portion 2040 to secure a rear integral mounting stud 2078 extending from the outer surface of the rear wall portion 2040. See FIG. 50. Similarly, the inner surface of the top wall portion 2042 has X-shaped reinforcement ribs 2076 integrally formed on the inner surface thereof to prevent "oil canning".

Referring to FIG. 50, the second step of folding the preform blank entails manually or mechanically rotating rear wall portion 2040 substantially 90° about axis Y-Y from its vertical orientation illustrated in FIG. 49 co-planer with the bottom wall portion 2038 to a horizontal orientation substantially parallel with front wall portion 2036. Note that in this step, top wall portion 2042 remains co-planer with rear wall portion 2040, assuming a horizontal orientation. Although not illustrated, after completion of the step of FIG. 50, guide retainers 2064 serve to abut the rearmost edge surface of the circuit board subassembly 2014 to effect longitudinal support thereof.

Referring to FIGS. 49, 50 and 54, screws 2028 are then applied, extending through holes 2080 formed in the pedestals 2060 of rear wall portion 2040 and engaging the rear wall of the CD player subassembly 2016, rigidly securing rear wall portion 2040 and bottom wall portion 2038 in their respective positions as illustrated in FIG. 50.

Note that during the process of forming the preform blank 2012, the screen is stretched, punched or weakened in the areas corresponding with the pedestals 2060 such as illustrated in FIGS. 37 and 38. Extra screen inserts can be provided within the portions of the mold forming the pedestals or external EMI patches or surface coatings can be provided to ensure complete shielding is provided by the final assembly.

Referring to FIG. 51, the third step of folding the preform blank entails manually or mechanically rotating top wall portion 2042 substantially 90° about axis Z-Z from its horizontal orientation illustrated in FIG. 50 co-planer with the rear wall portion 2040 to a vertical orientation substantially parallel with bottom wall portion 2038. While transitioning from the orientation of FIG. 50 to that of FIG. 51, the male engagement feature 2048 and guide features 2050 extending from the leading edge of the top wall portion 2042 are respectively guidingly received within the corresponding female engagement feature 2044 and guide features 2046 to self-position and self-engage the top wall portion 2042. As illustrated in FIG. 51, the perform blank 2012 has been fully folded into a three-dimensional box-like configuration.

The wire screen/conductive layer is continuous throughout the full extent of the four contiguous wall portions 2036, 2038, 2040 and 2042, with the exception of where the leading edge of the front wall portion 2036 adjoins the trailing edge of the top wall portion 2042. The slight gap at the point of contact of the front wall portion 2036 and 2042 is believed by the inventors to result in only deminimus RF leakage that, if required can be effectively blocked by application of a local conductive patch.

Referring to FIGS. 52, 53 and 54, the application of the left and right side closure members 218 and 220 is illustrated. As illustrated in FIG. 52, the rear edge portions of closure members are initially angularly positioned under their respective retention rib 2072 and then pivoted thereabout to assume the final, installed position illustrated in FIG. 53. As the side closure members 2020 and 2022 are fully installed, the forward edges thereof are retained in the installed position by self-engaging retention features 2082 integrally formed on the rear surface of the front wall portion 2036. Thereafter, screws 2032 are applied through holes in the right side closure member 2020 to engage their respective power devices 2034 to establish the right side closure member 2020 an a heat sink. After this step, final assembly is essentially complete.

As best viewed in FIG. 52, the side closure members 2018 and 2020 are identical, formed from a continuous extrusion process, having a typical cross-section defining inwardly directed upper channels 2086, lower channels 2088 and center channels 2090. During installation, each upper channel 2086 forms an interference fit with a respective edge portion of the top wall portion 2042. Similarly, each lower channel 2088 forms an interference fit with a respective edge portion of the bottom wall portion 2038. Redundant retention can be applied by screws 2030 which extend through mating holes formed in the front and rear wall portions 2036 and 2042, to engage the adjacent center channel 2090.

Figure 55:
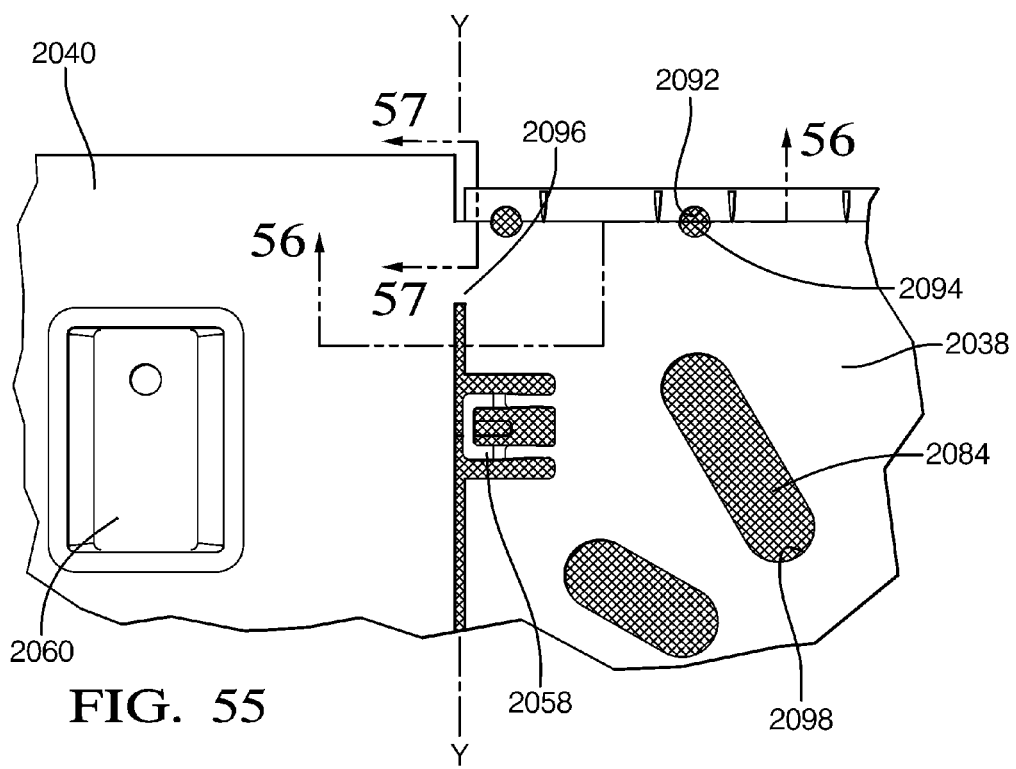
FIG. 55, is broken segment of the front wall portion interconnected to a broken segment of the bottom wall portion by the first living hinge of FIG. 45, in an enlarged scale.

Referring to FIG. 55, the exposed edges or alternatively, a molded rail, of the top wall portion 2042 and bottom wall portion 2038 have a series of openings 2092 exposing the screen 2084. The exposed segments of screen have an upward/downward extending dome or distension 2094 locally raising the screen above the outer surface of the adjacent wall portion. Once installed, the inner surfaces of the channels 2086 and 2088 compressively engage the screen domes 2094 to establish reliable, multi-point electrical contact therebetween.

Figure 56:
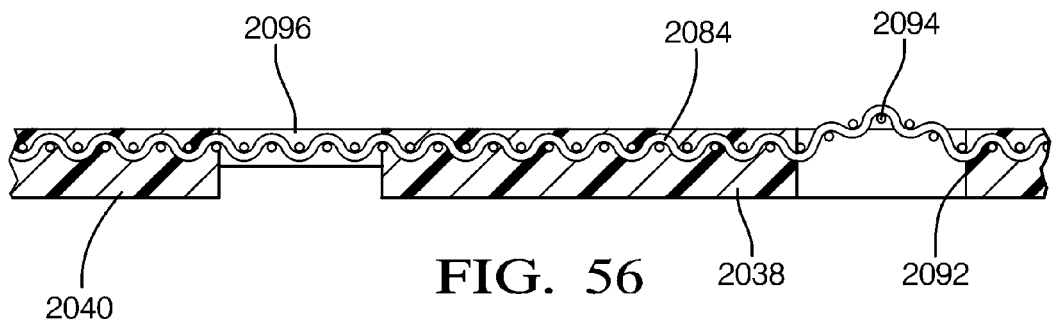
FIG. 56, is a broken cross-sectional view taken along lines 56-56 of FIG. 55.
Figure 57:
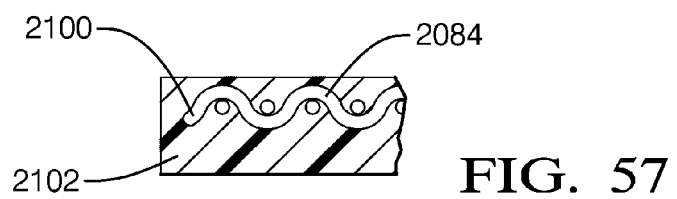
FIG. 57, is a broken cross-sectional view taken along lines 57-57 of FIG. 56.

Referring to FIGS. 55-57, detail of one of the "living hinges" is illustrated. Adjacent edges of the bottom wall portion 2038 and rear wall portion 2040 are slightly spaced apart to expose electrically conductive material such as screen 2084 extending along the hinge axis Y-Y. This arrangement assures that each of the wall panels remain substantially rigid while the hinge portions are relatively flexible, and maintains its EMI isolation characteristics.

Referring to FIGS. 55 and 56, preferably, at each end of each living hinge is a relatively this web of plastic 2096 integrally interconnecting the adjacent wall portions 2038 and 2040 to provide torsional rigidity to the hinge, as well as the overall housing assembly.

Air flow openings 2098 are formed in the top and bottom wall portions closed by screen 2084 while permitting free ventilation of the interior of the housing assembly.

Referring to FIG. 57, all cut edges 2100 of the screen 2084 are fully encased in a layer of plastic 2102 to prevent unraveling of the screen 2084 and/or inadvertent electrical shorts or injury to an assembly technician.

Figure 58:
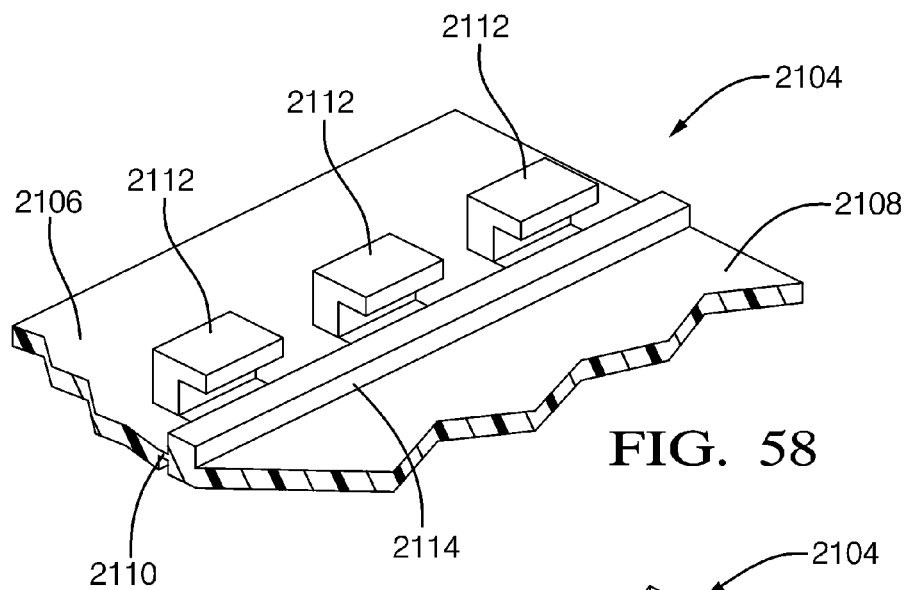
FIGS. 58 and 59, are perspective views of living hinge reinforcement features in the preform blank respectively integrally formed with two adjacent wall portions which self-engage and interlock upon displacement of the adjacent wall portions from a parallel orientation to a normal orientation.
Figure 59:
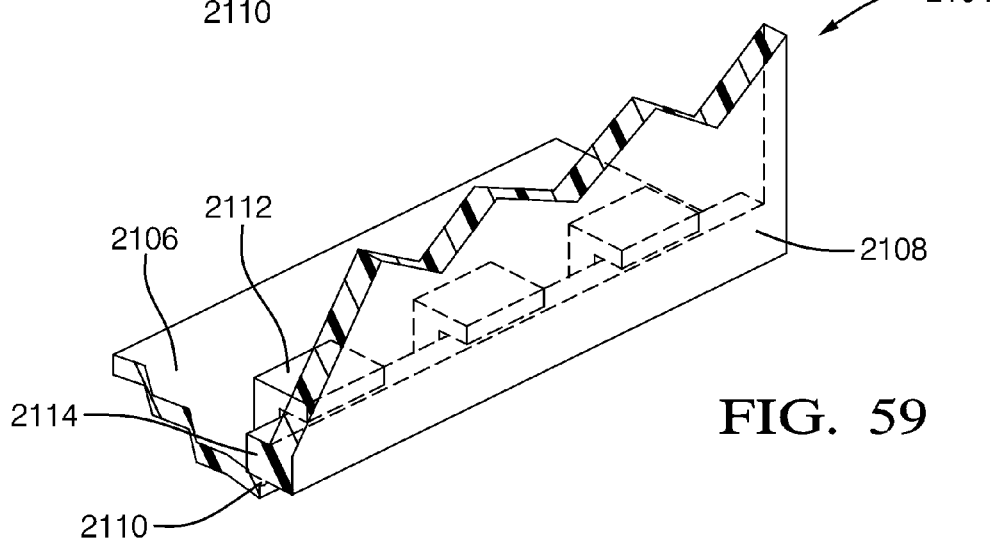

Referring to FIGS. 58 and 59, an alternative hinge design 2104 is illustrated. Adjacent edges of a first wall portion 2106 and a second wall portion 2108 are integrally interconnected by a thin web 2110 of plastic material. In this embodiment, the inner surfaces of both wall portions 2106 and 2108 are coated by an electrically conductive surface layer (not illustrated). A similar web with wire mesh is depicted in FIG. 19 above. A series of spaced retention hooks 2112 are integrally formed on the first wall portion 2160 extending adjacently along the hinge line/axis. A cooperating retention rib 2114 is integrally formed on the second wall portion 2108 extending adjacently parallel to the hinge line/axis. The hooks 2112 and cooperating rib 2114 are dimensioned to cooperatively self-engage one another as the wall portions 2016 and 2018 are transitioned from the co-planer orientation depicted in FIG. 58 to the right angle configuration depicted in FIG. 59. This embodiment ensures robust continuous electrical interconnection between the adjacent conductive layers, even in the case of micro-cracking during the folding process.

Insert molded wire mesh in plastic has been successful for replacing metal enclosures typically utilized for packaging electronics that require EMC shielding and grounding. Virtually any plastic resin can be molded with a wire mesh which makes it advantageous for almost any application requiring these unique characteristics that offer many assembly and weight reductions that are the result of replacing metal enclosures with a molded plastic version. A limiting factor with some plastic resins is the ability for dimensional stability and especially warpage characteristics that may be a hindrance to the final molded part to meet the same requirements as a similar metal version. As an example, some plastic resins like polypropylene may tend to warp during the cooling phase after mold ejection which can disrupt the dimension stability. This may, in turn, threaten the ability of the part to mate with conjoining component parts in an assembly.

By using a nozzle injected gas product like the MuCell process (offered by Trexel) for the insert molded part operation, the wire mesh insert molding can be fabricated to offer a dimensionally stabilized part that is resistant to warpage that is now better suited for the assembly of the electronics enclosure. Without the process, additional fixtures or clamping may be necessary to prevent post molding warpage or creep of the material due to non-uniform cooling that can take place after the part is molded and ejected from the tool. This is critical for use with the wire mesh in plastic molding with electronic enclosures to prevent unwanted wire mesh contact with electrical contacts due to warpage or dimensional variation. This also allows interface contact between assembly parts to be aligned within normal material tolerance eliminating the need to construct additional controls into the parts and/or molding.

Referring to FIGS. 24 and 25, an injection molding machine or extruder 1188 can be modified to accommodate nitrogen gas injection via an injector 1189 to implement the MuCell process. As a result, the resulting molded or extruded plastic parts are filled with micro-bubbles of nitrogen gas 1167 whereby the flow of the molten plastic within the mold in enhanced, reducing warpage and improving part-to-part repeatability. Furthermore, the process further reduces weight of the molded parts and reduces the required tonnage of the molding machine.

It is to be understood that the invention has been described with reference to specific embodiments and variations to provide the features and advantages previously described and that the embodiments are susceptible of modification as will be apparent to those skilled in the art.

Furthermore, it is contemplated that many alternative, common inexpensive materials can be employed to construct the basis constituent components. Accordingly, the forgoing is not to be construed in a limiting sense.

The invention has been described in an illustrative manner, and it is to be understood that the terminology, which has been used is intended to be in the nature of words of description rather than of limitation.

Obviously, many modifications and variations of the present invention are possible in light of the above teachings. For example, a number of the various radio/CD player case constructions illustrated herein are illustrated as being formed of solid molded polymer material for the sake of simplicity and clarity of understanding. It is to be understood, however, that the wire mesh depicted, for example in FIG. 93, can be employed in the other configurations and embodiments with equal success. Furthermore, several of the housing assembly structures are described herein as being formed of metal. However, a wide range of material substitutes, including plastics, ceramics, non-ferrous metals and composites can be substituted without departing from the spirit and scope of the present invention. The terms "snap-engaging" and "self-engaging" are intended to interpreted very broadly inasmuch as innumerable structural, process (e.g. weldments) and chemical (e.g. adhesives) equivalents are available. In addition "squirts", as described in connection with FIGS. 39-42 hereinabove can be employed to replace the screws 2026, 2030 and 2032, inter alia, to further reduce part count and reduce the chances of mis-assembly. It is, therefore, to be understood that within the scope of the appended claims, wherein reference numerals are merely for illustrative purposes and convenience and are not in any way limiting, the invention, which is defined by the following claims as interpreted according to the principles of patent law, including the Doctrine of Equivalents, may be practiced otherwise than is specifically described.

What is claimed is:

1. A method of fabricating an automotive audio system housing assembly including a box-like case having at least four wall portions and at least one discrete closure member cooperatively enclosing at least one audio component, said method comprising the steps of:
forming a generally planer composite preform blank consisting of at least one layer of relatively rigid polymer material and at least one layer of electrically conductive material capable of shielding said audio component from electrical anomalies,
wherein said preform blank defines said wall portions which are integrally formed on a common plane and are interconnected by living hinges extending between adjacent pairs of said wall portions;
affixing said audio component to one of said preform wall portions;
folding said preform wall portions at respective right angles to form said case;
affixing respective pairs of cooperating engagement features integrally formed on said perform blank to retain said case in a three-dimensional configuration; and
affixing said closure member to four contiguous wall portion edges to effect closure of said case.

2. The method of claim 1, further comprising the step of forming the electrically conductive material layer of said preform blank from a single sheet of wire screen.

3. The method of claim 2, further comprising the step of forming the preform blank by insert molding the wire screen substantially within said polymer material.

4. The method of claim 1, wherein the step of folding said perform panels comprises serially displacing each of said pairs of adjacent panels from a generally planer configuration to a substantially normal configuration about an axis defined by an associated living hinge to form said box-like case.

5. The method of claim 1, further comprising the step of thermally affixing at least one power device carried with said audio component to said closure member to effect ambient heat dissipation therefrom.

6. The method of claim 1, further comprising the step of forming said closure member from electrically conductive material, wherein said step of affixing said closure member to said folded perform wall portions effects electrical interconnection of the closure member with the electrically conductive material contained with the perform blank.

7. The method of claim 1, wherein said living hinges define substantially parallel axes.

8. The method of claim 1, wherein each said living hinge comprises a continuously axially extending portion of said layer of conductive material.

9. The method of claim 7, wherein at least portions of each said living hinge comprises a segment of said layer of polymer material integrally bridging said adjacent wall portion pairs.

10. The method of claim 1, further comprising the step of affixing an operator accessible trim panel to an exterior surface of one of said wall portions.

11. The method of claim 10, wherein said trim panel and said associated exterior wall portion surface include cooperating engagement features integrally formed therewith.

12. The method of claim 1, wherein said step of forming said composite preform blank includes injection molding said layer of polymeric material within a mold.

13. A method of fabricating an automotive audio system housing assembly including a box-like case having at least four wall portions and at least one discrete closure member cooperatively enclosing at least one audio component, said method comprising the steps of:
forming a generally planer composite preform blank consisting of at least one layer of relatively rigid polymer material and at least one layer of electrically conductive material capable of shielding said audio component from electrical anomalies,
wherein said preform blank defines said wall portions which are integrally formed on a common plane and are interconnected by living hinges extending between adjacent pairs of said wall portions;
affixing said audio component to one of said preform wall portions;
folding said preform wall portions at respective right angles to form said case;
affixing respective pairs of cooperating engagement features integrally formed on said perform blank to retain said case in a three-dimensional configuration;
affixing said closure member to four contiguous wall portion edges to effect closure of said case; and
forming said closure member from electrically conductive material, wherein said step of affixing said closure member to said folded perform wall portions effects electrical interconnection of the closure member with the electrically conductive material contained with the perform blank, and
wherein said step of forming said closure member comprises serially cutting a plurality of substantially identical closure members from a continuously formed extruded aluminum billet.

14. The method of claim 13, wherein said step of affixing said closure member comprises affixing said closure member to said four contiguous wall portion edges to effect closure of one opening of said case, and affixing a second closure member to a second grouping of four contiguous wall portion edges to effect closure of a second opening of said case.

15. A method of fabricating an automotive audio system housing assembly including a box-like case having at least four wall portions and at least one discrete closure member cooperatively enclosing at least one audio component, said method comprising the steps of:

forming a generally planer composite preform blank consisting of at least one layer of relatively rigid polymer material and at least one layer of electrically conductive material capable of shielding said audio component from electrical anomalies, wherein said preform blank defines said wall portions which are integrally formed on a common plane and are interconnected by living hinges extending between adjacent pairs of said wall portions;

affixing said audio component to one of said preform wall portions;

folding said preform wall portions at respective right angles to form said case;

affixing respective pairs of cooperating engagement features integrally formed on said perform blank to retain said case in a three-dimensional configuration;

affixing said closure member to four contiguous wall portion edges to effect closure of said case, wherein said step of forming said composite preform blank includes injection molding said layer of polymeric material within a mold; and mixing micro-bubbles of inert gas within fluid polymer material during said injection molding process.

\* \* \* \* \*